(12) United States Patent
Araki

(10) Patent No.: US 7,268,369 B2
(45) Date of Patent: Sep. 11, 2007

(54) FUNCTIONAL DEVICE AND METHOD FOR PRODUCING THE SAME

(75) Inventor: Yasushi Araki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/174,614

(22) Filed: Jul. 6, 2005

(65) Prior Publication Data
US 2006/0118795 A1 Jun. 8, 2006

(30) Foreign Application Priority Data
Jul. 6, 2004 (JP) ............... P.2004-199826

(51) Int. Cl.
*H01L 31/12* (2006.01)
(52) U.S. Cl. ............... 257/83; 257/103; 257/59; 257/72; 257/89; 438/22; 438/209; 438/210; 313/501
(58) Field of Classification Search ............... None
See application file for complete search history.

(56) References Cited

U.S. PATENT DOCUMENTS

2003/0194168 A1* 10/2003 Ouchi ............... 385/14

2004/0012058 A1* 1/2004 Aoki ............... 257/414

FOREIGN PATENT DOCUMENTS

| JP | 58-103165 A | 6/1983 |
| JP | 2002-502120 A | 1/2002 |
| JP | 2002-83946 A | 3/2002 |
| JP | 2003-502847 A | 1/2003 |
| JP | 3405099 B2 | 5/2003 |

* cited by examiner

*Primary Examiner*—Sue A. Purvis
*Assistant Examiner*—Fazli Erdem
(74) *Attorney, Agent, or Firm*—Sughrue Mion, PLLC

(57) ABSTRACT

A functional device including on a substrate a first electrode layer, a second electrode layer opposed to the first electrode layer, a functional layer disposed between the first electrode layer and the second electrode layer and a wiring for applying a potential to the first electrode layer or the second electrode layer, wherein there are provided a first insulating layer formed on the second electrode layer in such an arrangement that the side wall of the functional layer is covered and a contact hole formed in the first insulating layer extending to the second electrode layer in which the wiring for connecting the second electrode layer is provided.

21 Claims, 32 Drawing Sheets

FUNCTIONAL DEVICE AND METHOD FOR PRODUCING THE SAME

This application is based on Japanese Patent application JP 2004-199826, filed Jul. 6, 2004, the entire content of which is hereby incorporated by reference. This claim for priority benefit is being filed concurrently with the filing of this application.

BACKGROUND OF THE INVENTION

1. Technical Filed of the Invention

The present invention relates to a functional device comprising a photoelectric conversion layer and a luminescent layer deposited over a substrate and method for producing same.

2. Description of the Related Art

In recent years, devices comprising an organic material represented by organic luminescent device have made a remarkable progress. The production of organic EL displays which represent the organic luminescent device has been succeeded in practical utilization. Although the production of photoelectric conversion devices comprising an organic semiconductor has never been succeeded in manufacturing, these devices have made a remarkable progress in recent years and are likely to overcome the following problems with the related art imaging devices.

In the related art CCD type solid imaging devices or CMOS type solid imaging devices, a number of photoelectric conversion devices (photodiode) which are light-receiving portions and a signal readout circuit for reading a photoelectric conversion signal obtained in these photoelectric conversion devices to the exterior are formed on the surface of a semiconductor substrate. The signal readout circuit is formed by a charge transfer circuit and a transfer electrode if the solid imaging device is of CCD type or formed by an MOS transistor circuit and a signal wiring if the solid imaging device is of CMOS type.

Accordingly, the related art solid imaging device is disadvantageous in that a number of light-receiving portions and signal readout circuits must be formed on the surface of the same semiconductor substrate, making it impossible to raise the area of the light-receiving portions. When the area of the light-receiving portions cannot be raised, the percent utilization of light is drastically reduced. Accordingly, in the related art solid imaging device, the drop of percent utilization of light has been compensated by providing a microlens or inner lens in upper position to converge light rays into the light-receiving portions. However, such a measure has inevitable problems including an increase in light quantity loss due to optical reflection. It is said that the related art imaging devices have several tens of percentages of light quantity loss. Further, the demand for fine division of solid imaging devices has been growing more and more. Thus, a problem has arisen that when the light-receiving portions are divided more and more, the difference in angle of incidence of light between the periphery and the center of the imaging device makes difference in the percent convergence by microlens, causing shading.

Under these conditions, the configuration of the solid imaging device as described in JP-A-58-103165 has been reviewed. In accordance with this solid imaging device, light-sensitive layers are deposited on a semiconductor substrate having a signal readout circuit formed on the surface thereof. In this arrangement, these light-sensitive layers act as light-receiving portion. The photoelectric conversion signal obtained in these light-sensitive layers is read out to the exterior by a signal readout circuit. In other words, a photoelectric conversion layer-stacked structure is formed.

In this arrangement, the light-receiving portion can be provided with an aperture having a greater size, making it possible to solve the aforementioned problems. In recent years, photoelectric conversion layer-stacked solid imaging devices disclosed in JP-A-2002-83946, JP-T-2002-502120, JP-T-2003-502847, and Japanese Patent 3,405,099 have been proposed. The use of a device comprising an organic material as a photoelectric conversion layer having such an arrangement is very desirable from the following standpoints of view. The spectral wavelength of an organic material can be relatively easily adjusted by changing the structure thereof. A photoelectric conversion device comprising an organic semiconductor can be realized in a thickness on the order of 100 nm. Thus, the total thickness of the photoelectric conversion layers can be reduced even if they are deposited.

In order to further enhance the functional device comprising an organic material, etc., it is necessary the electrode on the organic semiconductor layer be finely worked. However, it is disadvantageous in that when this fine working is effected using the related art method, the properties of the functional device are remarkably deteriorated.

Thus, the functional device prepared according to the related art method is disadvantageous in that the device properties are remarkably deteriorated.

SUMMARY OF THE INVENTION

The invention has been worked out under these circumstances. An aim of the invention is to provide a functional device having good properties and a method for producing same.

The aforementioned aim is accomplished by the following constitutions.

(1) A functional device comprising on a substrate a first electrode layer, a second electrode layer opposed to the first electrode layer, a functional layer disposed between the first electrode layer and the second electrode layer and a wiring for applying a potential to the first electrode layer or the second electrode layer, wherein there are provided a first insulating layer formed on the second electrode layer in such an arrangement that the side wall of the functional layer is covered and a contact hole formed in the first insulating layer extending to the second electrode layer in which the wiring for connecting the second electrode layer is provided.

In accordance with this functional device, the first insulating layer protects the side wall of the functional layer at the photolithographic step of patterning the functional layer, making it possible to protect the functional layer against a treatment solution such as purified water during the patterning of the resist. Further, the functional layer cannot be affected by the treatment solution during the formation of the resist by patterning for the selective removal of a part of the first insulating layer at the photolithographic step of forming the contact hole. In this manner, the deterioration of the device properties of the functional layer in the production process can be prevented.

(2) The functional device according to (1), wherein a second insulating layer is provided interposed between the second electrode layer and the first insulating layer.

In accordance with this functional device, the second insulating layer acts as a protective layer for the functional layer during the patterning of the resist for the selective removal of a part of the first insulating layer at the photolithographic step of forming the contact hole for the connection of wiring to the second electrode layer. In this manner, the deterioration of the device properties of the functional layer during the production of the device can be prevented.

(3) The functional device according to (2), wherein the contact hole is formed extending through the first insulating layer and the second insulating layer.

In accordance with this functional device, in the case where the first insulating layer and the second insulating layer are removed by selective etching to form a contact hole, the second insulating layer protects the functional device during the removal of the first insulating layer, making it possible to prevent the functional device from being affected by etching. Therefore, the removal of the first insulating layer can be carried out also by wet etching, making it possible to simplify the production process.

(4) The functional device according to any one of (1) to (3), wherein a plurality of stages of layer structure having the first electrode layer, the functional layer and the second electrode layer are provided on the substrate.

In accordance with this functional device, even in the constitution comprising a plurality of stages of layer structure, the functional layer can be always protected during the formation of the various layers, making it possible to prevent the deterioration of the device properties of the functional layer disposed in any position regardless of the installation place.

(5) The functional device according to any one of (1) to (4), wherein the water permeability of the insulating layer covering the functional layer is 10 $g/m^2 \cdot day$ or less.

Purified water is used for rinsing or the like at the photolithographic step. In accordance with this functional device, the aforementioned conditions are given to prevent purified water from reaching the photoelectric conversion layer, assuring that the device can be prevented from being deteriorated.

(6) The functional device according to any one of (1) to (5), wherein the functional layer contains an organic material.

In accordance with this functional device, even if the functional layer is an organic material which is damaged particularly by treatment such as resist formation, it is assured that the deterioration of the device properties can be prevented.

(7) The functional device according to (6), wherein the functional layer contains at least a hole-transporting organic material and an electron-transporting organic material and comprises the first electrode, the hole-transporting organic material, the electron-transporting organic material and the second electrode deposited in this order as viewed from the substrate side.

In accordance with this functional device, the photoelectric conversion layer comprises the first electrode, the hole-transporting organic material, the electron-transporting organic material and the second electrode deposited in this order as viewed from the substrate side.

(8) The functional device according to any one of (1) to (7), wherein the length of the smallest side of the wiring extending from the contact hole is 1 mm or less.

In accordance with this functional device, even if fine working is conducted such that the length of the smallest side of wiring is 1 mm or less, the deterioration of the properties of the functional layer can be prevented.

(9) The functional device according to any one of (1) to (8), wherein the second electrode contains at least one material selected from ITO, IZO, $SnO_2$, ATO, ZnO, $TiO_2$ and FTO.

In accordance with this functional device, as the second electrode there is used at least one material selected from ITO, IZO, $SnO_2$, ATO, ZnO, $TiO_2$ and FTO, making it possible to enhance the device properties more effectively.

(10) The functional device according to any one of (1) to (9), wherein the wiring contains at least one material selected from Al, Pt, W, Au, Ag, Ta, Cu, Cr, Mo, Ti, Ni, Pd and Zn.

In accordance with this functional device, as the wiring material there is used at least one material selected from Al, Pt, W, Au, Ag, Ta, Cu, Cr, Mo, Ti, Ni, Pd and Zn, making it possible to obtain a good electrical conductivity without giving adverse effects on the device properties.

(11) The functional device according to any one of (1) to (10), which is a photoelectric conversion layer-stacked solid imaging device.

In accordance with this functional device, the properties of the photoelectric conversion layer-stacked solid imaging device can be enhanced.

(12) The functional device according to any one of (1) to (10), which is an organic luminescent device.

In accordance with this functional device, the properties of the organic luminescent device can be enhanced.

(13) The functional device according to any one of (11) or (12), wherein there is provided an alignment of pixels each of which is one piece of the functional layer and the contact hole from which the wiring extends is formed in each of the pixels.

In accordance with this functional device, the smaller the wiring is, the more is the area of the functional layer. Thus, the device properties can be enhanced.

(14) The functional device according to any of (11) to (13), wherein the contact hole is present in each of the pixels and has a size of 5 μm or less.

In accordance with this functional device, the contact hole can be formed in a size of 5 μm or less in the pixel portion.

(15) A method for producing a functional device comprising on a substrate a first electrode layer, a second electrode layer opposed to the first electrode layer, a functional layer disposed interposed between the first electrode layer and the second electrode layer and a wiring for applying a potential to the first electrode layer or the second electrode layer, wherein a step of patterning the second electrode layer comprises a step of forming a resist pattern by photolithography with the second electrode layer covered by the first insulating layer and a step of patterning the first insulating layer with the resist pattern as a mask and then patterning the second electrode layer with the first insulating layer as a mask.

In accordance with this method for the production of a functional device, the second electrode layer is formed on the second electrode layer, making it possible to prevent water from penetrating the functional layer through the second electrode layer and deteriorating the functional layer at the rinsing step during the formation of the resist pattern for the patterning of the second electrode layer. Further, the functional layer can be prevented from being damaged also during etching.

(16) The method for preparing a functional device according to (15), comprising a step of forming a second insulating layer with the surface of the second electrode layer and the side wall of the functional layer covered after the second electrode layer patterning step, a step of forming a resist pattern by photolithography, a step of forming a contact hole extending through the second insulating layer and the first insulating layer with the resist pattern as a mask and a step of forming the wiring in contact with the second electrode layer exposed in the contact hole.

In accordance with this method for producing a functional device, the functional layer is entirely covered by the first insulating layer during the formation of resist pattern on the first insulating layer and the removal of resist by etching, allowing the removal of resist with a releasing agent even if the functional device can be easily damaged. Further, since the second insulating layer is provided under the first insulating layer, the functional layer can be prevented from being deteriorated through the second electrode layer during the removal of the first insulating layer with resist.

(17) The method for preparing a functional device according to (15) or (16), wherein the electrode layer patterning step comprises a step of dry etching the electrode layer with the substrate kept at 150° C. or less.

In accordance with this method for producing a functional device, the substrate is kept at 150° C. or less. In this manner, the reaction with the underlying functional layer can be prevented during the patterning of the electrode layer, making it possible to maintain the electrode layer without causing the production of materials that deteriorate the device properties or the reaction with the functional layer and realize high reliability dry etching.

(18) The method for preparing a functional device according to (17), wherein the second electrode layer has a transmission of 60% or more at a wavelength of from 400 nm to 700 nm.

In the case where the second electrode layer corresponds to the upper electrode of the photoelectric conversion element, the rise of the substrate temperature due to the light transmission properties of the upper electrode. In accordance with this method for producing a functional device, however, consideration can be made such that the substrate temperature can be controlled, making it possible to prevent the deterioration of the device properties.

(19) The method for preparing a functional device according to (17), wherein the dry etching step is preceded by a step of treatment using a reducing plasma.

In accordance with this method for producing a functional device, when treated using a reducing plasma such as hydrogen plasma, the second electrode layer, if made of a metal, becomes a metal-rich layer that can be easily etched with an inactive gas plasma, allowing easy etching at low temperatures.

(20) The method for preparing a functional device according to (19), wherein the dry etching step comprises a step of treatment using argon plasma.

In accordance with this method for producing a functional device, the aforementioned metal-rich layer can be easily removed with argon plasma without raising the substrate temperature. Accordingly, the deterioration of the functional layer cannot occur.

In accordance with the invention, even if fine working is conducted, the deterioration of the device properties can be inhibited, making it possible to obtain a functional device having good properties.

BRIEF DESCRIPTION OF THE DRAWINGS

FIG. 45 is a diagram illustrating a procedure of production of the photoelectric conversion layer-stacked solid imaging device shown in FIGS. 42 to 44 wherein

FIG. 46 is a diagram illustrating a procedure of production of the photoelectric conversion layer-stacked solid imaging device shown in FIGS. 42 to 44 wherein

FIG. 47 is a diagram illustrating a procedure of production of the photoelectric conversion layer-stacked solid imaging device shown in FIGS. 42 to 44 wherein

FIG. 48 is a diagram illustrating a procedure of production of the photoelectric conversion layer-stacked solid imaging device shown in FIGS. 42 to 44 wherein

FIG. 49 is a diagram illustrating a procedure of production of the photoelectric conversion layer-stacked solid imaging device shown in FIGS. 42 to 44 wherein

FIG. 50 is a diagram illustrating a procedure of production of the photoelectric conversion layer-stacked solid imaging device shown in FIGS. 42 to 44 wherein

FIG. 51 is a diagram illustrating a procedure of production of the photoelectric conversion layer-stacked solid imaging device shown in FIGS. 42 to 44 wherein

FIG. 52 is a diagram illustrating a procedure of production of the photoelectric conversion layer-stacked solid imaging device shown in FIGS. 42 to 44 wherein

FIG. 53 is a diagram illustrating a procedure of production of the photoelectric conversion layer-stacked solid imaging device shown in FIGS. 42 to 44 wherein

FIG. 54 is a diagram illustrating a procedure of production of the photoelectric conversion layer-stacked solid imaging device shown in FIGS. 42 to 44 wherein

FIG. 55 is a diagram illustrating a procedure of production of the photoelectric conversion layer-stacked solid imaging device shown in FIGS. 42 to 44 wherein

FIG. 56 is a diagram illustrating a procedure of production of the photoelectric conversion layer-stacked solid imaging device shown in FIGS. 42 to 44 wherein

FIG. 57 is a diagram illustrating a procedure of production of the photoelectric conversion layer-stacked solid imaging device shown in FIGS. 42 to 44 wherein

FIG. 58 is a diagram illustrating a procedure of production of the photoelectric conversion layer-stacked solid imaging device shown in FIGS. 42 to 44 wherein

FIG. 59 is a diagram illustrating a procedure of production of the photoelectric conversion layer-stacked solid imaging device shown in FIGS. 42 to 44 wherein

Figure 1:
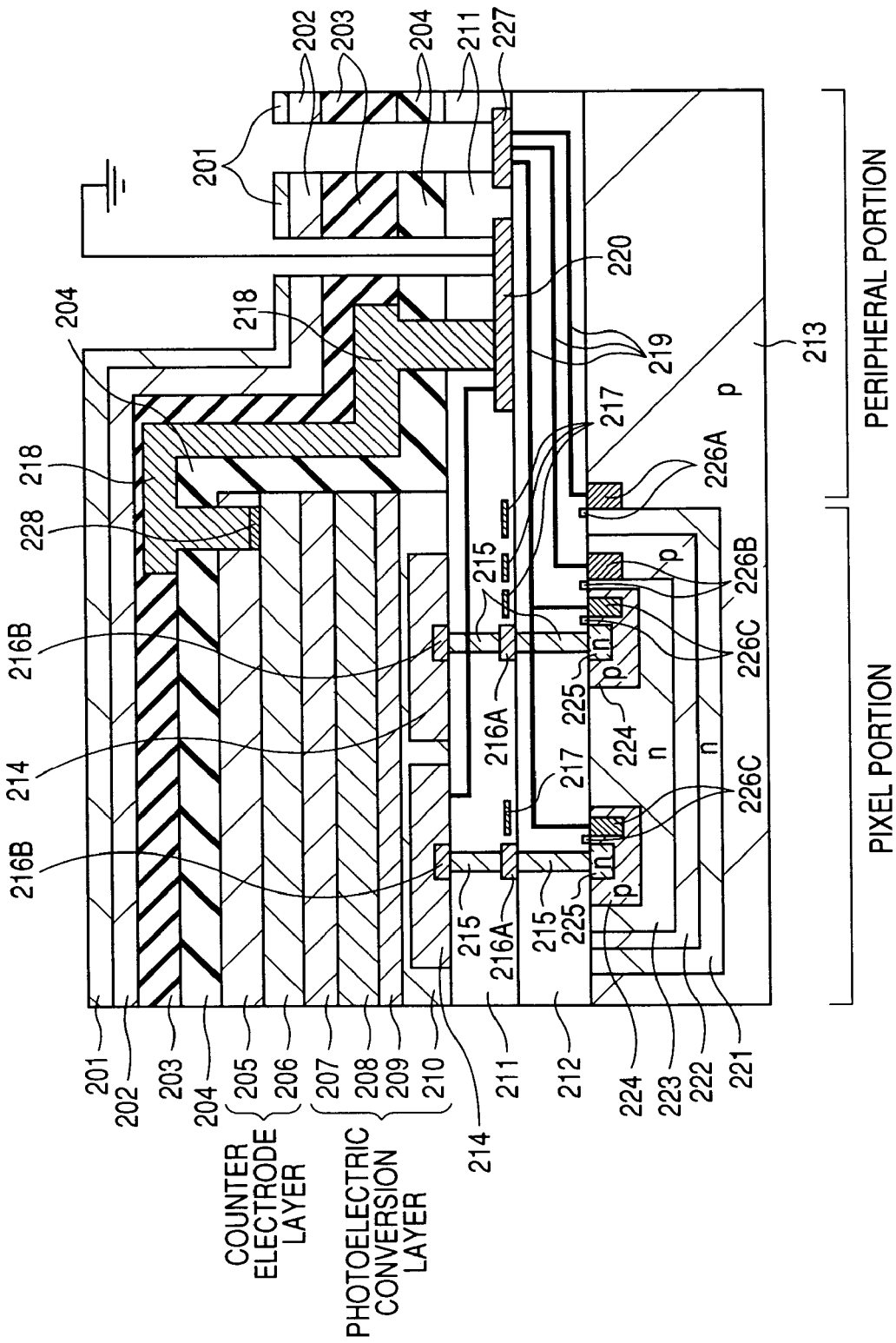
FIG. 1 is a diagrammatic sectional view of a photoelectric conversion layer-stacked solid imaging device for illustrating a first embodiment of the invention.

Reference numerals are used to identify various elements in the drawings including the following:

204: Protective layer (first insulating layer)
205, 206: Second electrode layer
207: Electron-blocking layer
208: p-Type impurity layer
209: n-Type impurity layer
210: Hole-blocking layer
213: Silicon substrate
214: First electrode layer
218: Wiring
1,100: Photoelectric conversion layer-stacked solid imaging device
1,120: First electrode layer
1,120g: First green electrode layer
1,120r: First red electrode layer
1,120b: First blue electrode layer
1,121r, 1,121, 1,121b: Photoelectric conversion layer
1,122r, 1,122g, 1,122b: Second electrode layer
1,124r, 1,124g, 1,124b: Crosswise wiring
1,125: Insulating layer

1,126*r*, 1,126*g*, 1,126*b*: Longitudinal wiring
1,127: Insulating layer
1,128: Insulating layer
1,129: Transparent protective layer
1,130: n-Type semiconductor substrate
1,131: Well layer
1,132: Gate insulating layer
1,133: Light-shielding layer
1,134: Insulating layer
1,137*r*, 1,137*g*, 1,137*b*: Longitudinal wiring connecting portion
1,138*r*, 1,138*g*, 1,138*b*: Charge storage portion
1,139: Transfer electrode
1,141: High concentration p-type layer
1,142: Field region (insulating layer)
1,143: Longitudinal wiring
1,144: Transparent electrically-conductive layer
1,150*r*, 1,150*g*, 1,150*b*, 1,150*k*: Opening
1,151: Electrically-conductive layer
1,152: Resist layer
1,153*b*, 1,153*g*: Opening
1,154*g*, 1,154*b*: Opening
1,154: Opening
1,154*k*: Opening
1,201: Insulating layer (second insulating layer)
2,100: Photoelectric conversion layer-stacked solid imaging device
2,109: First electrode layer
2,110: Second electrode
2,121: Wiring
2,206: Photoelectric conversion layer
2,207: Second electrode layer
2,301: Insulating layer (second insulating layer)
2,302: Insulating layer (first insulating layer)
2,303: Wiring
2,401: Second electrode layer
2,403: Wiring
2,407: Silicon substrate
2,414: Protective layer (second insulating layer)
2,415: Protective layer (first insulating layer)
3,003: First electrode layer
3,005: Photoelectric conversion layer
3,007: Second electrode layer
3,009: Photoelectric conversion portion

DETAILED DESCRIPTION OF THE INVENTION

The invention concerns a functional device comprising on a substrate a first electrode layer, a second electrode layer opposed to the first electrode layer, a functional layer disposed interposed between the first electrode layer and the second electrode layer and a wiring for applying a potential to the first electrode layer or the second electrode layer, wherein there are provided a first insulating layer formed on the second electrode layer in such an arrangement that the side wall of the functional layer is covered and a contact hole formed in the first insulating layer extending to the second electrode layer in which the wiring for connecting the second electrode layer is provided.

Preferred examples of the functional layer include photoelectric conversion layer and luminescent layer. These functional devices are normally arranged such that the two electrode layers having a functional layer interposed therebetween each have a wiring leading to a bonding PAD connected thereto to give a potential to the two electrode layers. In this arrangement, the invention allows fine working on the order of micrometer or submicrometer without causing the deterioration of the properties of the functional device. The resulting fine wiring structure allows the provision of good photoelectric conversion properties.

Examples of the functional device having such characteristics include photoelectric conversion layer-stacked solid imaging device and luminescent device. The configuration and production method of these functional devices will be sequentially described hereinafter. Firstly, photoelectric conversion layer-stacked solid imaging device will be described.

First Embodiment

Figure 5:
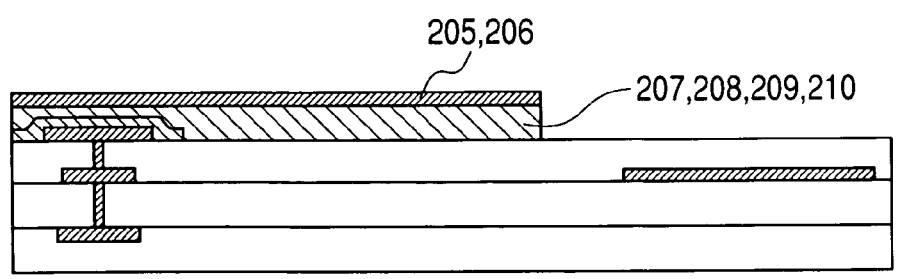
FIG. 5 is a diagrammatic sectional view illustrating a further process for the production of a photoelectric conversion layer-stacked solid imaging device shown in FIG. 1.

Examples of the configuration of photoelectric conversion layer-stacked solid imaging device include various configurations such as first configuration which comprises a laminate of three units each having a photoelectric conversion layer interposed between two electrode layers provided on a silicon substrate such that three color light rays are detected on the silicon substrate to allow color imaging and second configuration a second configuration which comprises one photoelectric conversion layer interposed between two electrode layers stacked on a silicon substrate and two pn junctions formed at different depths in the silicon substrate such that two color light rays are detected in the silicon substrate and one color light ray is detected on the silicon substrate to allow color imaging as shown in FIG. 5 of JP-A-2003-332551. The present embodiment will be described with reference to the second configuration by way of example.

FIG. 1 is a diagrammatic sectional view of a photoelectric conversion layer-stacked solid imaging device for illustrating a first embodiment of the invention. In FIG. 1, a section of two pixels in the pixel portion which detects light rays and stores charge, a wiring connected to the electrode in the pixel portion and a section of the peripheral circuit portion in which a bonding PAD to be connected to the wiring, etc. are formed are also shown.

This embodiment will be described with reference to the case where photoelectric conversion layers are deposited because the signal reading substrate has photoelectric conversion properties itself. The reference numeral 213 indicates a monocrystalline silicon substrate which acts both as a blue light and red light electromagnetic wave absorbing/photoelectric converting portion and a portion of storing/transferring/reading charge produced by photoelectric conversion. In general, a p-type silicon substrate is used.

On the p-type silicon substrate 213 in the pixel portion are formed an n-type impurity region 223, a p-type impurity region 222 and an n-type impurity region 221. Further, on a part of the surface of the n-type impurity region 223 is formed a p-type impurity region 224.

The n-type impurity region 221 is a storage portion which stores a signal charge of red (R) component produced as a result of photoelectric conversion by pn junction to the p-type silicon substrate 213. The change of the potential of the n-type impurity region 221 by the storage of signal charge of R component is read from an MOS transistor 226A formed on the surface of the p-type silicon substrate 213 by a signal reading PAD 227 through a metal wiring 219 connected to the MOS transistor 226A.

The n-type impurity region 223 is a storage portion which stores a signal charge of blue (B) component produced as a result of photoelectric conversion by pn junction to the p-type silicon substrate 222. The change of the potential of the n-type impurity region 223 by the storage of signal charge of B component is read from an MOS transistor 226B formed on the surface of the p-type silicon substrate 213 by the signal reading PAD 227 through the metal wiring 219 connected to the MOS transistor 226B.

In the interior of the p-type impurity region 224 is formed a charge storing region 225 formed by an n-type impurity region which stores a signal charge of green (G) component produced in a photoelectric conversion layer depsited above the p-type silicon substrate 213. The change of the potential of the p-type charge storing region 225 by the storage of signal charge of B component is read from an MOS transistor 226C formed on the surface of the p-type silicon substrate 213 by the signal reading PAD 227 through the metal wiring 219 connected to the MOS transistor 226C. The signal reading PAD 227 is preferably provided for each of the transistors from which the respective component is read.

While the p-type impurity regions, n-type impurity regions, transistors, metal wirings, etc. have been described diagrammatically, the parts of the invention are not limited thereto in configuration. Optimum configuration is properly selected. Since B and R light rays are distinguished by the depth in the silicon substrate, the selection of the depth of pn junction, etc. from the surface of the silicon substrate, the dope concentration of various impurities, etc. is important. The CMOS circuit which is a signal readout circuit for photoelectric conversion layer-stacked solid imaging device can employ all preferred techniques for use in ordinary CMOS image sensors. Circuit configurations having a reduced number of transistors in the pixel portion, including low noise reading column amplifier and CDS circuit, can be, of course, employed.

Further, while the charge storage portion 225 and the photodiodes for detecting R and B light rays are shown imposed on each other as viewed in plan in FIG. 1, the invention is not limited thereto. For example, the charge storage portion 225 and the photodiodes for detecting R and B light rays are not imposed on each other as viewed in plan.

On the p-type silicon substrate 213 is formed a transparent insulating layer 212 mainly composed of silicon oxide, silicon nitride or the like. On the insulating layer 212 is formed a transparent insulating layer 211 mainly composed of silicon oxide, silicon nitride or the like. The thickness of the insulating layer 212 is preferably as small as possible and is preferably 5 µm or less, more preferably 3 µm or less, even more preferably 2 µm or less, still more preferably 1 µm or less.

In the interior of the insulating layers 211 and 212 is formed a plug 215 which connects the photoelectric conversion layer to the charge storing region 225. The plug 215 extends between the insulating layers 211 and 212 with a pad 216A as a relay. As the plug 215 there is preferably used one mainly composed of tungsten. As the pad 216A there is preferably used one mainly composed of aluminum. In the interior of the insulating layer 212 are formed the aforementioned metal wiring 219, gate electrode of transistors 226A, 226B and 226C, etc. It is preferred that barrier layers, including metal wiring, be provided. The plug 215 is provided for each of the pixels.

In the interior of the insulating layer 211 is formed a light-shielding layer 217 for preventing the occurrence of noise during photoelectric conversion by pn junction between the p-type impurity region 224 and the n-type impurity region 225. As the light-shielding layer 217 there is normally used one mainly composed of tungsten, aluminum or the like. In the interior of the insulating layer 211 are formed a bonding PAD 220 (PAD for supplying electric power from the exterior) and a signal reading PAD 227. Further, a metal wiring (not shown) for electrically connecting the bonding PAD 220 to the pixel electrode layer 214 is formed.

On the plug 215 for each pixel in the insulating layer 211 is formed a pad 216B. On the pad 216B is formed a pixel electrode layer 214 which is a transparent first electrode layer. The pad 216B is adapted to improve the electrical connection of the plug 215 to the pixel electrode layer 214. The pad 216b is made of aluminum, molybdenum or the like. The pixel electrode layer 214 is divided for each of the pixels. The light receiving area is determined by this size. The pixel electrode layer 214 is biased through the wiring from the bonding PAD 220. The configuration is preferably such that electron can be stored in the charge storage portion 225 by forward-biasing the pixel electrode layer 214 with respect to the counter electrode layer described later.

In order to realize this configuration, a positive hole-blocking layer 210, an n-type semiconductor layer 209, a p-type semiconductor layer 208 and an electron-blocking layer 207 are deposited on the pixel electrode layer 214 in this order to form a photoelectric conversion layer which detects G light ray and then generates a corresponding signal charge. The thickness of the photoelectric conversion layers (207, 208, 209, 210) each are preferably 0.5 µm or less, more preferably 0.3 µm or less, particularly 0.2 µm or less.

On the photoelectric conversion layer is formed a counter electrode layer which is a second transparent electrode layer. The counter electrode layer has a two-layer structure having transparent electrode layers 206, 205 deposited in this order but may have a single-layer structure. The counter electrode layer can be used commonly to all the pixels and thus may not be divided for each of the pixels. The thickness of the counter electrode layer and the pixel electrode layer 214 each are preferably 0.2 µm or less.

On the counter electrode layer is formed a protective layer (first insulating layer) 204 mainly composed of silicon nitride or the like which acts to protect the photoelectric conversion. This protective layer 204 is formed covering the side wall of the photoelectric conversion layer. The transparent electrode layer 205 and the protective layer 204 each have an opening formed therein in a position such that it doesn't overlap on the pixel electrode layer 214 in the pixel portion. The insulating layer 211 and the protective layer 204 each have an opening formed therein on a part of the upper portion of the bonding PAD 220. Further, a wiring 218 made of aluminum or the like for electrically connecting the transparent electrode layer 206 and the bonding PAD 220 exposed to the two openings to give a potential to the counter electrode layer is formed in the opening and on the protective layer 204.

Between the transparent electrode layer 206 and the wiring 218 is formed a barrier metal 228 mainly composed of tungsten or the like. This barrier metal 228 makes it possible to enhance the driving durability.

Further, on the wiring 218 is formed a protective layer 203 mainly composed of silicon nitride or the like for protecting the wiring 218. Moreover, on the protective layer 203 is formed an infrared-cutting dielectric multilayer 202. On the infrared-cutting dielectric multilayer 202 is formed an anti-reflection layer 201.

The aforementioned protective layer 204 facilitates the process for the production of the layer containing an organic material. The protective layer 204, the details of which are described later, can eliminate damage on the photoelectric conversion layer during the formation of resist pattern and etching at the step of preparing the connecting electrode 218, etc. In order to avoid the formation of resist pattern, etching, etc., production using a mask can be effected. However, the inhibition of damage on the layer containing an organic material (photoelectric conversion layer) by the configuration comprising the aforementioned protective layer 204 provides a simple production process and is advantageous. Further, working on the order of micrometer or submicrometer which can by no means be attained can be effected.

In the aforementioned arrangement, three B, G and R color light rays can be detected by one pixel to allow color imaging. In the configuration of FIG. 1, R and B are used as a common value in two pixels and only G value is used separately. In other words, the configuration is made such that G has a resolution as twice as that of R and B. In this arrangement, the resolution of G signal, which is important particularly during the image formation, can be enhanced, making it possible to produce a good color image.

The pixel electrode layer 214 doesn't need to have a single structure. A laminate of two or more layers made of different materials may be used. Such configurations having two or more layers are generically called first electrode layer.

The depositionf of the photoelectric conversion layer on the first electrode layer is followed by the formation of second electrode layers 205, 206 on the photoelectric conversion layer. The material of the first and second electrode layers may be essentially any material. For example, metals, alloys, metal oxides, organic electrically-conductive compounds, mixtures thereof, etc. are preferably used. Specific examples of these materials include combinations of any elements selected from the group consisting of Li, Na, Mg, K, Ca, Rb, Sr, Cs, Ba, Fr, Ra, Sc, Ti, Y, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Al, Ga, In, Tl, Si, Ge, Sn, Pb, P, As, Sb, Bi, Se, Te, Po, Br, I, At, B, C, N, F, 0, S and N. Particularly preferred among these combinations are combinations of any elements selected from the group consisting of Al, Pt, W, Au, Ag, Ta, Cu, Cr, Mo, Ti, Ni, Pd and Zn. The wiring 218 and the bonding PAD 220, too, may be made of the same material as that of the first and second electrode layers.

Further, it is very desirable that the first and second electrode layers be made of a transparent material. Specific examples of the material of the first and second electrode layers include electrically-conductive metal oxides such as tin oxide, zinc oxide, indium oxide, indium tin oxide (IZO) and indium tin oxide (ITO), thin semitransparent electrodes made of a metal such as gold, platinum, silver, chromium and nickel, mixtures or depositions of these metals with electrically-conductive metal oxides, inorganic electrically-conductive materials such as copper iodide and copper sulfide, organic electrically-conductive materials such as polyaniline, polythiphene and polypyrrole, and depositions of these materials with ITO. Further, those described in detail in Yutaka Sawada, "Tomei Denkyokumaku no Shintenkai" (New Development of Transparent Electrode layers), CMC, 1999, "Tomei Doudenmaku no Gijutsu" (Technology of Transparent Electrically-conductive layers), Japan Society for the Promotion of Science, OM, 1999, etc. may be used. In the invention, it is particularly preferred that the first and second electrode layers each comprise at least one of ITO, IZO, $SnO_2$, ATO, ZnO, $TiO_2$ and FTO incorporated therein.

The first electrode layer may be prepared from the aforementioned material by way of example. The patterning of the first electrode layer may be carried out by any method such as printing method and masking method. However, photolithography is desirable.

In the invention, a photoelectric conversion layer is then formed on the first electrode thus formed. The photoelectric conversion layer of the invention comprises a photoelectric conversion layer which absorbs light rays and converts it to electron and an interelectrode material or electrode for separating electron. Preferred examples of the configuration of the photoelectric conversion layer in the case where one photoelectric conversion layer is deposited on the substrate include [1] configuration comprising a lower electrode layer, an electron-transporting material layer, a hole-transporting material layer and a transparent electrode deposited in this order as viewed from under, and [2] configuration comprising a lower electrode layer, a hole-transporting material layer, an electron-transporting material layer and a transparent electrode deposited in this order as viewed from under. However, the invention is not limited to these configurations. For example, the electron-transporting layer may consist of two or more layers. Alternatively, the hole-transporting material layer may consist of two or more layers. Examples of these configurations include [3] configuration comprising a lower electrode layer, an electron-transporting material layer, an electron-transporting material layer, a hole-transporting material layer and a transparent electrode deposited in this order as viewed from under, [4] configuration comprising a lower electrode layer, an electron-transporting material layer, a hole-transporting material layer, a hole-transporting material layer, and a transparent electrode deposited in this order as viewed from under, and [5] configuration comprising a lower electrode layer, an electron-transporting material layer, an electron-transporting material layer, a hole-transporting material layer, a hole-transporting material layer, and a transparent electrode deposited in this order as viewed from under. Further, in the case where two photoelectric conversion layers are deposited on the substrate, configurations having one photoelectric conversion layer may be essentially combined. In other words, a configuration having two configurations [1] in combination, i.e., a lower electrode layer, an electron-transporting material layer, a hole-transporting material layer, a transparent electrode, an interlayer insulating layer, a lower electrode layer (transparent electrode), an electron-transporting material layer, a hole-transporting material layer, and a transparent electrode deposited in this order as viewed from under or a configuration having combinations [1] and [2] in combination, i.e., a lower electrode layer, an electron-transporting material layer, a hole-transporting material layer, a transparent electrode, an interlayer insulating layer, a lower electrode layer (transparent electrode), a hole-transporting material layer, an electron-transporting material layer, and a transparent electrode deposited in this order as viewed from under may be used. In order to prepare such a multi-layer configuration, the configurations [1], [2], [3], [4] and [5] may be arbitrarily selected and combined. Alternatively, the configurations [1], [2], [3], [4] and [5] may be arbitrarily combined with configurations other than the configurations [1], [2], [3], [4] and [5]. When at least two photoelectric conversion layers are deposited on the substrate, the percent utilization of light per unit area can be raised from the configuration having only one photoelectric conversion layer. Thus, this configuration can be more preferably used.

Further, the deposition of at least three photoelectric conversion layers on the substrate, the details of which are described later, makes it possible to further raise the percent utilization of light and is particularly preferred in the invention. In the case where at least three photoelectric conversion layers are deposited, a blue photoelectric conversion layer, a green photoelectric conversion layer and a red photoelectric conversion layer can be prepared, making it possible to prepare a full-color imaging device. Therefore, this configuration is very desirable in the invention. It goes without saying that the configuration having at least three photoelectric conversion layers deposited on a substrate may be a combination of any configurations selected from the group consisting of configurations [1] and [2] or a combination of the configurations [1] and [2] with other configurations of course, other combinations may be used.

Further, the material constituting the photoelectric conversion layer may be an inorganic material or an organic material. In the invention, however, a photoelectric conversion layer comprising an organic material is particularly preferred. Therefore, as the aforementioned electron-transporting material or hole-transporting material, an electron-transporting organic material or hole-transporting organic material is extremely desirable.

As the electron-transporting organic material there is preferably used an acceptor-like organic semiconductor (compound). The term "acceptor-like organic semiconductor" as used herein is meant to indicate an organic material that easily accepts electron, which is represented mainly by electron-transporting organic material. More specifically, the acceptor-like organic semiconductor means an organic compound which exhibits a greater electron affinity when two organic compounds are used in contact with each other. Accordingly, as the acceptor-like organic compound there may be used any organic compound having electron-accepting properties. Examples of these organic compounds include condensed aromatic carbon ring compounds (naphthalene derivative, anthracene derivative, phenanthrene derivative, tetracene derivative, pyrene derivative, perylene derivative, fluoranthene derivative), 5- to 7-membered heterocyclic compounds containing nitrogen atom, oxygen atom and sulfur atom (e.g., pyridine, pyrazine, pyrimidine, pyridazine, triazine, quinoline, quinoxaline, quinazoline, phthalazine, cinnoline, isoquinoline, pteridine, acrydine, phenazine, phenanthroline, tetrazole, pyrazole, imidazole, thiazole, oxazole, indazole, benzimidazole, benzotriazole, benzooxazole, benzothiazole, carbazole, purine, triazolopyridazine, triazolopyrimidine, tetrazaindene, oxadiazole, imidazopyridine, pyrrolidine, pyrropyridine, thiadiazopyridine, dibenzazepine, tribenzazepine), polyarylene compounds, fluorene compounds, cyclopentadiene compounds, silyl compounds, and metal complexes having nitrogen-containing heterocyclic compounds as ligands. The invention is not limited to these organic compounds. Any organic compounds having a greater electron affinity than organic compounds used as donor-like organic compound may be used as acceptor-like organic semiconductor.

Examples of the hole-transporting organic material employable herein include poly-N-vinyl carbazole derivatives, polyphenylene vinylene derivatives, polyphenylenes, polythiophenes, polymethylphenylsilanes, polyanilines, triazole derivatives, oxadiazole derivatives, imidazole derivatives, polyaryl alkane derivatives, pyrazoline derivatives, pyrazolone derivatives, phenylene diamine derivatives, arylamine derivatives, amino-substituted chalcone derivatives, oxazole derivatives, carbazole derivatives, styryl anthracene derivatives, fluorenone derivatives, hydrazone derivatives, stilbene derivatives, porphyrine derivatives (e.g., phthalocyanine), aromatic tertiary amine compounds, styrylamine compounds, butadiene compounds, benzidine derivatives, polystyrene derivatives, triphenylmethane derivatives, tetraphenylbenzidine derivatives, and star-burst polyamine derivatives.

The use of organic dyes is very desirable. The aforementioned materials are preferably provided with a structure capable of absorbing light rays. Alternatively, metal complex dyes, cyanine-based dyes, melocyanine-based dyes, phenylxanthene-based dyes, triphenylmethane-based dyes, rhodacyanine-based dyes, xanthene-based dyes, macrocyclic azaanullene-based dyes, azlene-based dyes, naphthoquinone, anthraquinone-based dyes, chain-like compounds obtained by the condensation of condensed polycyclic aromatic, aromatic and heterocyclic compound such as anthracene and pyrene, two nitrogen-containing heterocycle compounds such as quinoline, benzothiazole and benzooxazole, and cyanine-like dyes comprising moieties connected each other with squarilium group and chroconium methine group.

Preferred examples of the metal complex dye, if used, include dithiol metal complex-based dyes, metal phthalocyanine dyes, metal porphyrine dyes, and ruthenium complex dyes. Particularly preferred among these metal complex dyes are ruthenium complex dyes. Examples of the ruthenium complex dyes employable herein include complex dyes disclosed in U.S. Pat. Nos. 4,927,721, 4,684,537, 5,084,365, 5,350,644, 5,463,057 and 5,525,440, JP-A-7-249790, JP-T-10-504512, WO98/50393, and JP-A-2000-26487. Specific examples of the polymethine dyes such as cyanine dye, melocyanine dye and squarilium dye include dyes disclosed in JP-A-11-35836, JP-A-11-67285, JP-A-11-86916, JP-A-11-97725, JP-A-11-158395, JP-A-11-163378, JP-A-11-214730, JP-A-11-214731, JP-A-11-239905, JP-A-2000-26487, European Patents 892411, 911841 and 991092.

These materials may be incorporated in a polymer binder as necessary. Examples of the polymer binder employable herein include polyvinyl chlorides, polycarbonates, polystyrenes, polymethyl methacrylates, polybutyl methacrylates, polyesters, polysulfones, polyphenylene oxides, polybutadienes, hydrocarbon resins, ketone resins, phenoxy resins, polyamides, ethyl celluloses, vinyl acetate, ABS resins, polyurethanes, melamine resins, unsaturated polyesters, alkyd resins, epoxy resins, silicon resins, polyvinyl butyrals, and polyvinyl acetals.

The photoelectric conversion layer needs to be patterned in a desired form. In the invention, patterning may be carried out by any method. In particular, masking method is preferably used to prepare such a photoelectric conversion layer. Alternatively, the photoelectric conversion layer is preferably patterned with the second electrode layer as a mask.

A process for the production of a photoelectric conversion layer-stacked solid imaging device having the aforementioned configuration will be described hereinafter in connection with the attached drawings.

Figure 2:
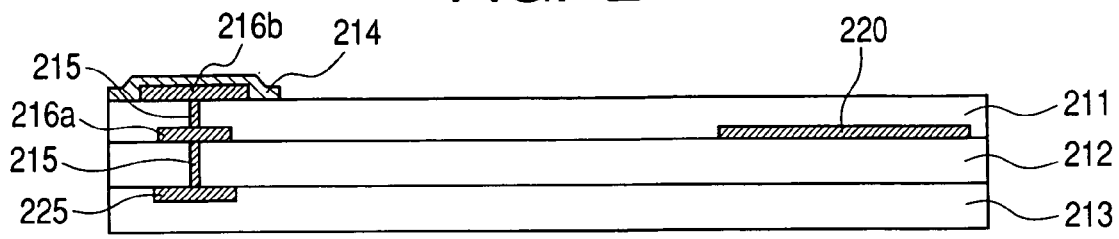
FIG. 2 is a diagrammatic sectional view illustrating a process for the production of a photoelectric conversion layer-stacked solid imaging device shown in FIG. 1.

FIGS. 2 to 11 each is a diagrammatic sectional view illustrating a process for the production of the photoelectric conversion layer-stacked solid imaging device shown in FIG. 1. FIG. 2 illustrates the structure having up to the second electrode layer 214 completed. Since the structures shown in FIGS. 1 and 2 can be prepared by an ordinary semiconductor process, the subsequent steps will be described in detail hereinafter.

Figure 3:
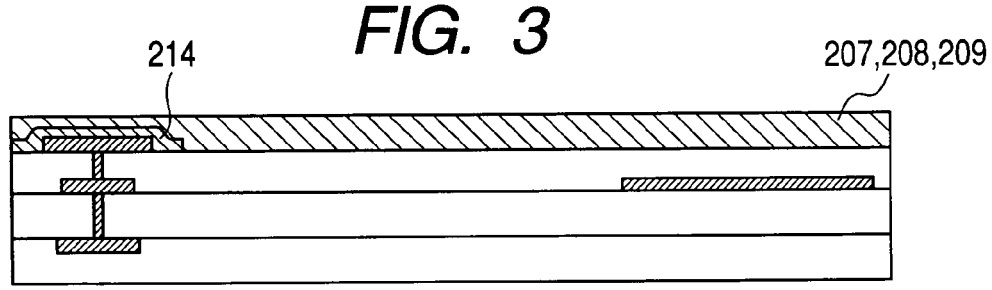
FIG. 3 is diagrammatic sectional view illustrating another process for the production of a photoelectric conversion layer-stacked solid imaging device shown in FIG. 1.
Figure 4:
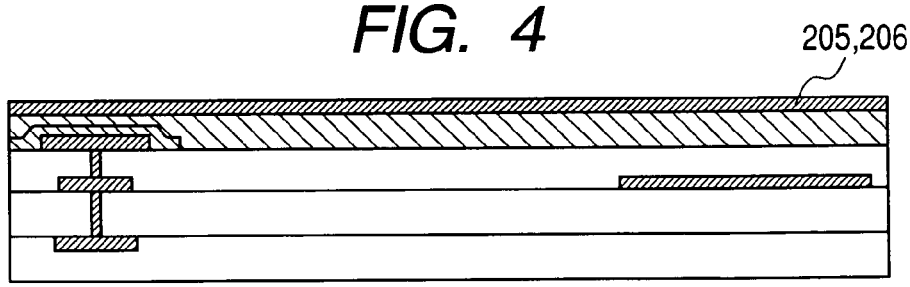
FIG. 4 is a diagrammatic sectional view illustrating other process for the production of a photoelectric conversion layer-stacked solid imaging device shown in FIG. 1.

The formation of the first electrode layer 214 is followed by the formation of a positive hole-blocking layer 210, n-type semiconductor layer 209, a p-type semiconductor layer 208 and an electron-blocking layer 207 on the first electrode layer 214 in this order as shown in FIG. 3. Thus, a photoelectric conversion layer is formed. Subsequently, transparent electrode layers 206, 205 are formed in this order on the photoelectric conversion layer as shown in FIG. 4 to form a counter electrode layer. Subsequently, the photoelectric conversion layer and the counter electrode layer on the peripheral circuit are selectively etched as shown in FIG. 5.

Figure 6:
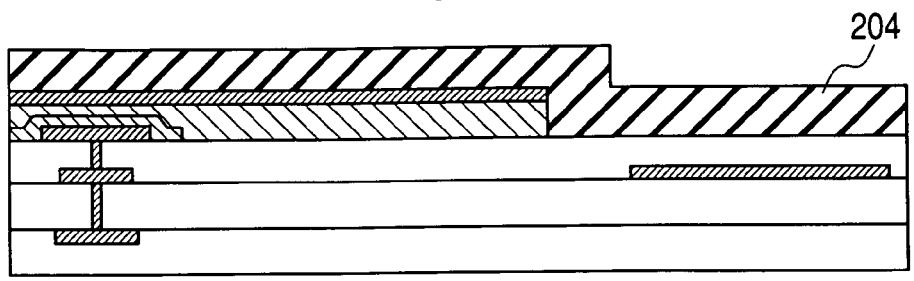
FIG. 6 is a diagrammatic sectional view illustrating a further process for the production of a photoelectric conversion layer-stacked solid imaging device shown in FIG. 1.
Figure 7:
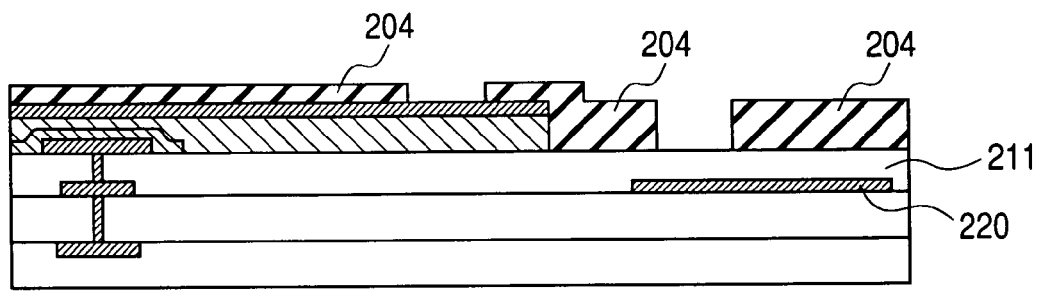
FIG. 7 is a diagrammatic sectional view illustrating a further process for the production of a photoelectric conversion layer-stacked solid imaging device shown in FIG. 1.
Figure 8:
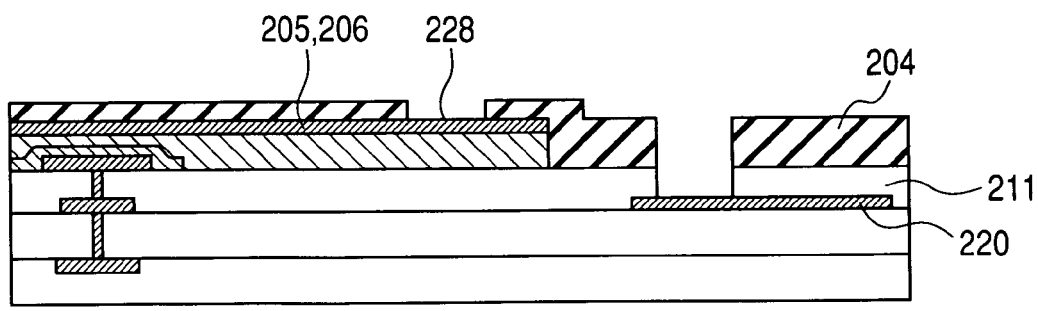
FIG. 8 is a diagrammatic sectional view illustrating a further process for the production of a photoelectric conversion layer-stacked solid imaging device shown in FIG. 1.

Subsequently, a protective layer (first insulating layer) 204 is formed as shown in FIG. 6. In order to expose the transparent electrode layer 206 which is a part of the counter electrode layer, a part of the protective layer 204 and a part of the counter electrode layer are selectively etched as shown in FIG. 7. During this procedure, a resist patter forming step of forming a resist over the entire surface and selectively removing the resist is effected. The photoelectric conversion layers (207, 208, 209, 210) are protected by the protective layer 204. During this procedure, a part of the protective layer 204 on the bonding PAD 220 is etched away. Subsequently, a barrier metal 228 such a tungsten is allowed to grow on the exposed surface of the transparent electrode layer 206. The hole portion in the protective layer 204 including the transparent electrode layer 206 acts as a contact hole for conducting to the transparent electrode 206. The size of the contact hole is preferably 5 µm or less, more preferably 1 µm or less, even more preferably 0.5 µm or less. Subsequently, as shown in FIG. 8, the insulating layer 211 on the bonding PAD 220 is selectively etched away to cause the bonding PAD 220 to be partly exposed.

Figure 9:
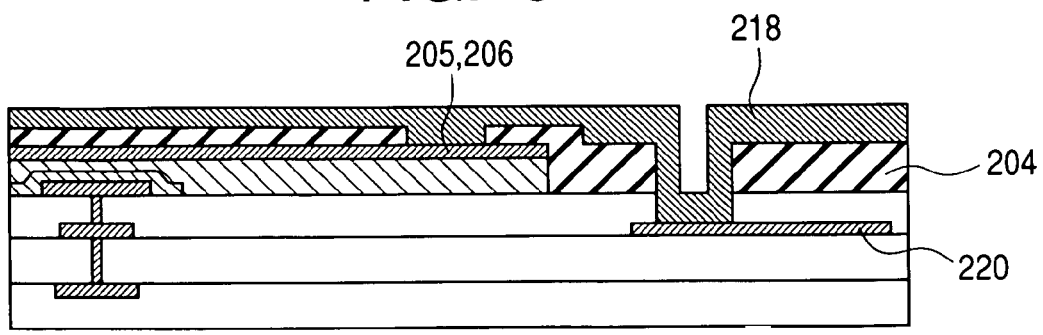
FIG. 9 is a diagrammatic sectional view illustrating a further process for the production of a photoelectric conversion layer-stacked solid imaging device shown in FIG. 1.
Figure 10:
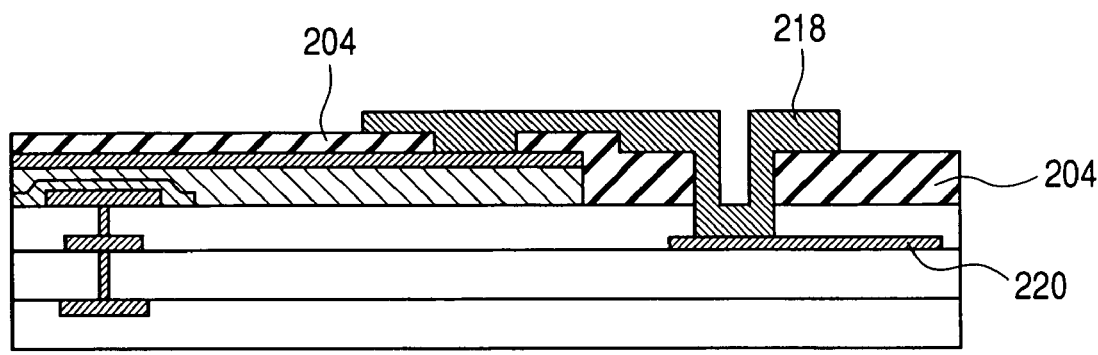
FIG. 10 is a diagrammatic sectional view illustrating a further process for the production of a photoelectric conversion layer-stacked solid imaging device shown in FIG. 1.
Figure 11:
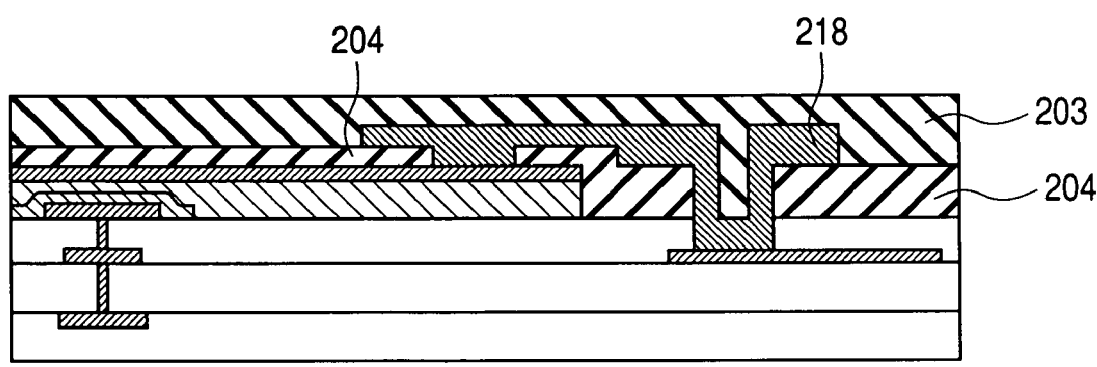
FIG. 11 is a diagrammatic sectional view illustrating a further process for the production of a photoelectric conversion layer-stacked solid imaging device shown in FIG. 1.

Subsequently, a wiring material 218 such as aluminum is formed as shown in FIG. 9. During this procedure, the opening on the transparent electrode layer 206 and the opening on the bonding PAD 220 are each filled with the wiring material 218. Subsequently, unnecessary wiring material 218 is selectively etched away while keeping the transparent electrode layer 206 and the bonding PAD 220 connected to each other with the wiring material 218 as shown in FIG. 10 to form a wiring 218. Subsequently, a protective layer 203 is formed on the protective layer 204 and the wiring 218 as shown in FIG. 11. Subsequently, an infrared-cutting dielectric multilayer 202 and an anti-reflection layer 201 are formed in this order on the protective layer 203 to obtain a photoelectric conversion layer as shown in FIG. 1. The length of the smallest side of the wiring extending from the contact hole is predetermined to be 1 mm or less, making it possible to prevent the deterioration of the properties of the functional device even if this fine working is effected.

In accordance with the aforementioned production process, a mask pattern can be formed while keeping the photoelectric conversion layers (207, 208, 209, 210) protected by the insulating protective layer 204 during the photolithographic formation of a mask pattern for forming the opening shown in FIG. 7 at the steps shown in FIGS. 6 and 7. In this manner, it is advantageous in that the photoelectric conversion layers can be certainly protected by the protective layer 204 at various processes such as patterning, making it possible to prevent the deterioration of the properties of the photoelectric conversion layers. In the case where the photoelectric conversion layers comprise an organic material incorporated therein, it is particularly apprehended that the device properties might be deteriorated by the effect of the process. Accordingly, the method of the invention is more effective. Such an advantage can be similarly obtained during the formation of mask pattern at the step of forming wiring 218 in FIG. 10.

Referring to the requirements for the protective layer 204 necessary for the prevention of the deterioration of the properties of the photoelectric conversion layers, the water permeability of the protective layer 204 is preferably as low as possible. In some detail, the water permeability of the protective layer 204 is preferably 10 g/m$^2$·day or less, more preferably 1 g/m$^2$·day or less, even more preferably from $1\times10^{-9}$ to $1\times10^{-2}$ g/m$^2$·day, still more preferably not smaller than $1\times10^{-9}$ to not greater than $1\times10^{-2}$ g/m$^2$·day, still more preferably not smaller than $1\times10^{-9}$ to not greater than $1\times10^{-4}$ g/m$^2$·day. The water permeability of the protective layer 204 can be measured by means of a water permeability measuring instrument produced by MOCON, Inc. of USA).

In the case where a resist pattern is formed by photolithography, purified water is normally used for rinsing or the like. By predetermining the aforementioned conditions, the purified water can be certainly prevented from reaching the photoelectric conversion layers. Further, the protective layer 204 doesn't need to have a single-layer structure but may have a multi-layer structure composed of a plurality of insulating layers. In the case of the multi-layer structure, the protectability of the photoelectric conversion layers can be further enhanced.

The aforementioned production process will be further described hereinafter.

In the present embodiment, the patterning of the transparent electrode layers 205, 206 as second electrode layer is carried out by surface treatment with a reducing plasma followed by dry etching of the substrate at 150° C. or less.

In this arrangement, reducing plasma treatment is conducted to give a metal-rich layer. When hit by Ar, this metal-rich layer is rendered etchable even if the substrate is not heated to high temperatures. Accordingly, the substrate can be kept at 150° C. or less, making it possible to maintain the organic semiconductor layer without causing the production of materials that deteriorate the device properties or the reaction with the layer materials and hence realize dry etching with a high reliability.

In the invention, a first electrode layer, an organic semiconductor layer and a second electrode layer opposed to the first electrode layer are deposited in this order on a substrate having a signal readout circuit formed thereon. The lamination needs to be followed by fine working of the second electrode layer. It is an important point that the temperature of the substrate is predetermined to be 150° C. or less during the shaping of the first or second electrode layer by dry etching after the formation thereof. The temperature of the substrate is preferably 80° C. or less, more preferably 40° C. or less. As the first or second electrode layer there is often used a transparent electrode. The transmission of the transparent electrode at a wavelength of from 40 nm to 700 nm is preferably 60% or more, more preferably 80% or more, even more preferably 90% or more, still more preferably 95% or more. The substrate is normally heated during the dry etching of the second electrode layer. However, it was made obvious that the properties of the device of the invention are extremely deteriorated unless the aforementioned temperature is 150° C. or less. This is presumably because the production of certain kinds of materials that deteriorate the device properties or the reaction with the layer materials can occur in the presence of an etching gas under high temperature conditions. This phenomenon doesn't occur with ordinary liquid crystal displays, semiconductor devices, related art elements, etc., and thus is characteristic to the device of the invention. This invention cannot be easily anticipated.

The effect of the invention can be effectively exerted particularly when the first or second electrode layer contains at least one material selected from the group consisting of metal oxides such as ITO, IZO, $SnO_2$, ATO, ZnO, $TiO_2$ and FTO to advantage.

The effect of the invention can be effectively exerted also when dry etching is effected using at least one gas selected from the group consisting of HCl, HBr, HI, $CH_4$, $CH_3OH$, Ar, $N_2$ and $O_2$. It is thus more desirable that these gases be used in the invention. In the invention, dry etching is preferably conducted in the following manner.

Dry etching is preferably conducted with at least one gas selected from the group consisting of HCl, HBr, HI, $CH_4$, $CH_3OH$, Ar, $N_2$, Xe, Kr and $O_2$ after treatment with a reducing plasma, i.e., plasma containing reducing molecules or atoms. More preferably, the plasma containing reducing molecules or atoms has atoms or molecules containing at least one element selected from the group consisting of carbon, hydrogen, nitrogen, sulfur, iodine, chlorine and bromine present therein. Still more preferably, the plasma containing reducing molecules or atoms contains at least one molecule selected from the group consisting of carbon monoxide, hydrogen, nitrogen monoxide, sulfur monoxide, iodine, chlorine and bromine, particularly carbon monoxide or hydrogen. It should be particularly noteworthy that these gases don't necessarily need to be supplied in gaseous form. It was made obvious that when some oxides are subjected to plasma treatment with, e.g., etching gas $CHF_3$, nitrogen monoxide is present under ordinary conditions. This is because the oxygen in the oxides and the carbon in $CHF_3$ are bonded to produce carbon monoxide. In the invention, the use of molecules which have been produced during plasma treatment and present in plasma, too, can be contained in the constitutions of the invention to advantage.

It was further made obvious that the treatment with a plasma containing reducing molecules or atoms before dry etching with at least one gas selected from the group consisting of HCl, HBr, $CH_4$, $CH_3OH$, Ar, $N_2$ and $O_2$, which is one of the constitutions of the invention, allows the maintenance of the etching rate which has never been attained at a substrate temperature of 150° C. or less and other various things and makes it possible to contribute the enhancement of durability of the device comprising an organic semiconductor in the invention. It is thought that the dry etching process of the invention exerts the same effect in any type such as inductively-coupled type and capacitor-coupled type.

Further, the method of forming the organic semiconductor layer as first electrode layer, second electrode layer or functional layer of the invention may be essentially any method. Examples of these methods employable herein include methods using resistively heated vacuum metallizer, RF sputtering apparatus, DC sputtering apparatus, counter target type sputtering apparatus, CVD, MBE, PLD, coating methods, etc. However, the invention is not limited to these methods.

For comparison, configurations different from that of the invention described above will be described hereinafter.

Figure 12:
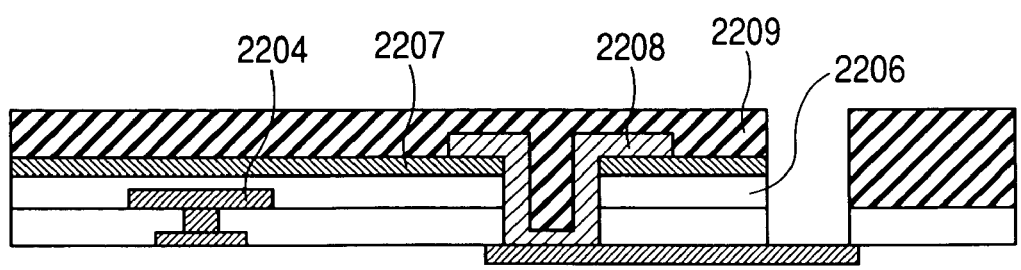
FIG. 12 is a diagrammatic sectional view illustrating a wiring structure having a configuration different from that of the invention.

FIG. 12 illustrates a wiring structure having a configuration different from that of the invention. A wiring 2208 having such a configuration comes in contact with an insulating layer 2209 on a part of the upper portion thereof but doesn't come in contact with the insulating layer on the lower portion thereof. At a glance, this configuration looks simple and having only one type of insulating layer 2209 present on a second electrode 2207 and thus is seemingly advantageous in process, too. However, this process cannot provide good photoelectric conversion properties.

This difference is not great with well known semiconductor devices. In order to attain process simplification, this wiring configuration is often used. In the case where an organic material (particularly organic semiconductor) is used to prepare a photoelectric conversion layer, this configuration is normally used. The reason why this configuration is used in the case where an organic material is used to prepare a photoelectric conversion layer is that a masking method is used to prepare a device. Since the masking method cannot provide a fine contact hole, this wiring is conducted without providing any insulating layer.

The process for the preparation of the wiring configuration according to the invention and the wiring configuration different from that of the invention will be compared below with reference to a process for the formation of a wiring configuration different from that of the invention on a signal reading substrate prepared as in FIG. 1 by way of example.

Figure 13:
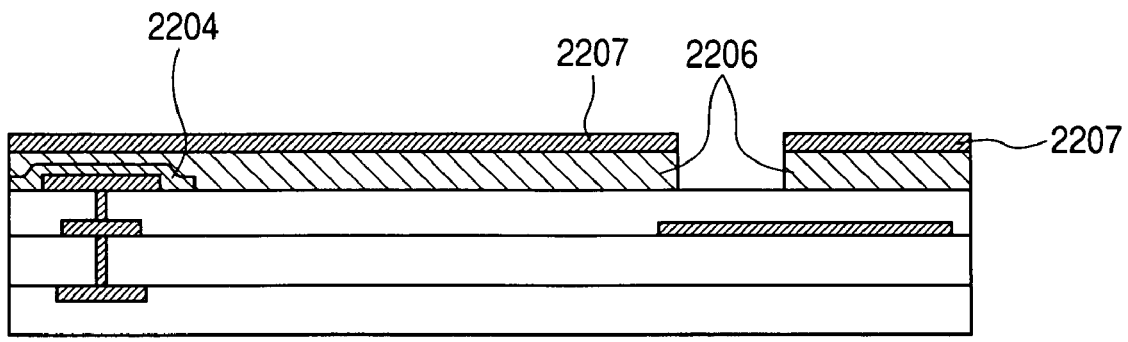
FIG. 13 is a diagrammatic sectional view illustrating a further process for the production of a photoelectric conversion layer-stacked solid imaging device shown in FIG. 12.

FIG. 13 is a diagram illustrating a stage after a step of preparing a first electrode layer 2204, forming a photoelectric conversion layer 2206 and a second electrode layer 2207 all over the surface of the first electrode layer 2204, spreading a resist all over the surface thereof, forming a desired pattern using a photolithographic technique, etching the second electrode layer 2207, peeling the resist, and then etching the photoelectric conversion layer 2206 with the second electrode layer 2207 as a mask.

Figure 14:
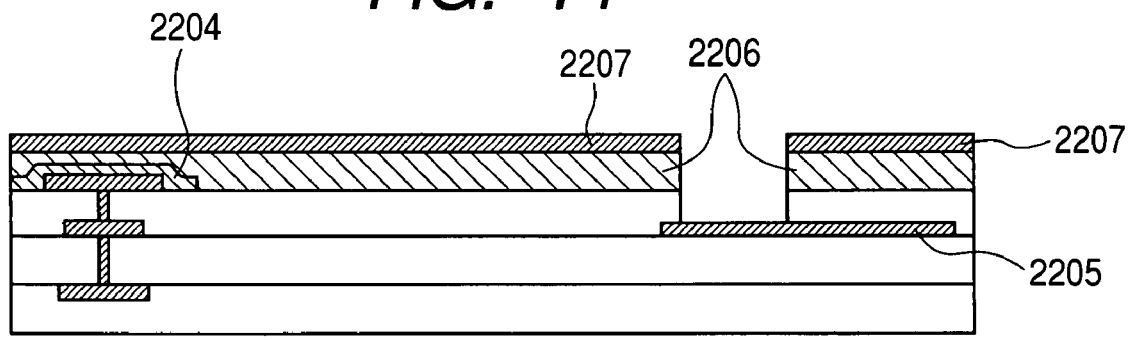
FIG. 14 is a diagrammatic sectional view illustrating a further process for the production of a photoelectric conversion layer-stacked solid imaging device shown in FIG. 12.
Figure 15:
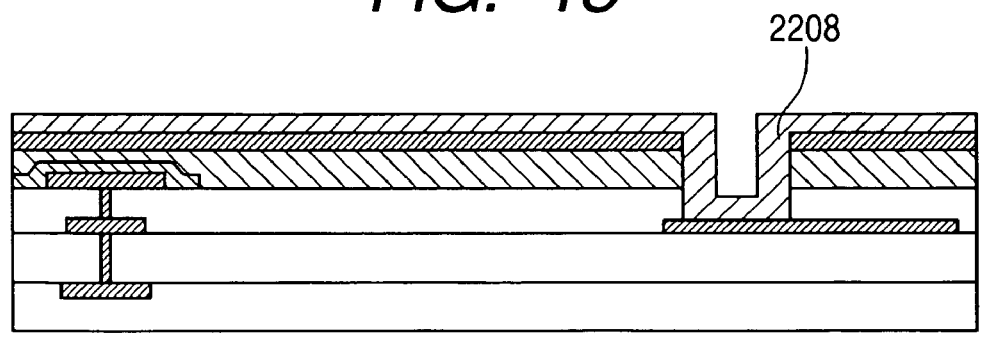
FIG. 15 is a diagrammatic sectional view illustrating a further process for the production of a photoelectric conversion layer-stacked solid imaging device shown in FIG. 12.
Figure 16:
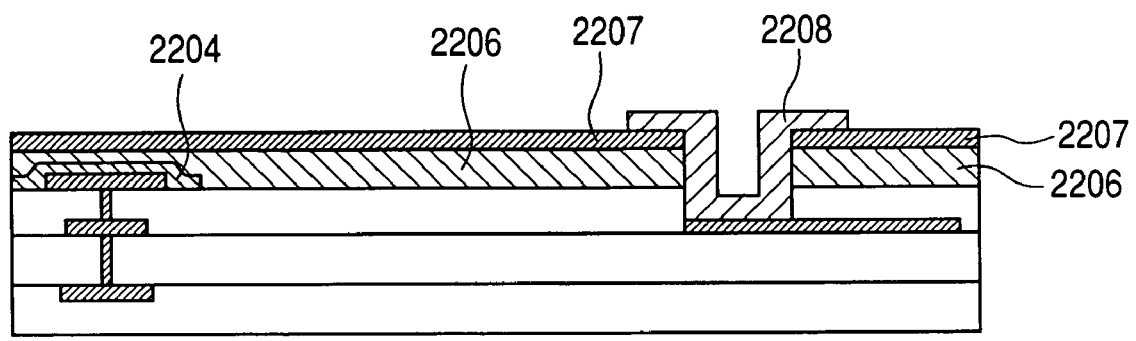
FIG. 16 is a diagrammatic sectional view illustrating a further process for the production of a photoelectric conversion layer-stacked solid imaging device shown in FIG. 12.

Beginning with the stage of FIG. 13, etching is conducted up to a second electrode PAD 2205 with the second electrode 2207 as a mask as shown in FIG. 14. A wiring 2208 is then formed all over the surface of the layers. The same photolithographic technique then follows such that a wiring 2208 is left as shown in FIG. 16 and an insulating layer 2209 is formed all over the surface of the layers as shown in FIG. 17.

Figure 17:
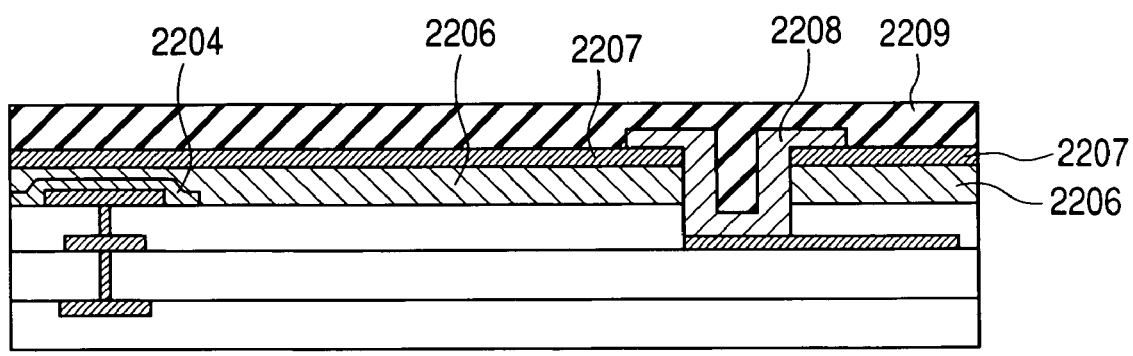
FIG. 17 is a diagrammatic sectional view illustrating a further process for the production of a photoelectric conversion layer-stacked solid imaging device shown in FIG. 12.

The configuration different from that of the invention shown in FIG. 17 provides deteriorated photoelectric conversion properties as compared with the case where the configuration of the invention is prepared. The reason for this phenomenon is unknown. However, it is presumed that this configuration and the process for the preparation thereof cause the photoelectric conversion layer under process to be damaged. In the case of the configuration of the invention, the degree of damage is reduced when the second electrode contains at least one material selected from the group consisting of ITO, IZO, $SnO_2$, ATO, ZnO, $TiO_2$ and FTO or the wiring contains at least one material selected from the group consisting of Al, Pt, W, Au, Ag, Ta, Cu, Cr, Mo, Ti, Ni, Pd and Zn. Thus, the effect of the invention can be enhanced.

Supplementarily explaining the formation of barrier metal, in order to form a barrier metal also between the wiring 218 and the bonding PAD 220, an opening may be formed also in the insulating layer 211 on the bonding PAD 220 so that the bonding PAD 220 is partly exposed in FIG. 7. At the subsequent step, a barrier metal may be formed also on the exposed surface of the bonding PAD 220.

Alternatively, an opening may be similarly formed also in the insulating layer 211 on the bonding PAD 220 so that the bonding PAD 220 is partly exposed in FIG. 7. At the subsequent step, a barrier metal is formed all over the surface of the layers. A wiring material 218 is then formed on the barrier metal. Thereafter, the barrier metal and the wiring material 218 are together patterned to form a barrier metal interposed between the wiring 218 and the transparent electrode layer 206 and between the wiring 218 and the bonding PAD 220.

It is particularly desired that the photoelectric conversion layer-stacked solid imaging device described above be arranged such that the photoelectric conversion layer contains at least a hole-transporting organic material and an electron-transporting organic material disposed in this order as viewed from under. This is because it has been experimentally demonstrated that in the case where a hole-transporting organic material and an electron-transporting organic material are used to prepare a photoelectric conversion layer, the aforementioned configuration is preferably used to enhance the device properties.

The most preferred embodiment of the invention will be described hereinafter.

A functional device comprising on a substrate a first electrode layer, a second electrode layer opposed to the first electrode layer, a functional layer disposed interposed between the first electrode layer and the second electrode layer and a wiring for applying a potential to the first electrode layer or the second electrode layer, wherein there are provided:

(1) A first insulating layer formed on the second electrode layer in such an arrangement that the side wall of the functional layer is covered;

(2) A contact hole formed in the first insulating layer extending to the second electrode layer in which the wiring for connecting the second electrode layer is provided; and (3) A second insulating layer is provided interposed between the second electrode layer and the first insulating layer; and (4) The functional layer contains at least a hole-transporting organic material and an electron-transporting organic material and comprises the first electrode, the hole-transporting organic material, the electron-transporting organic material and the second electrode deposited in this order as viewed from the substrate; and (5) The contact hole is present in each pixel portion and has a size of 5 μm or less.

The reasons why this embodiment is desirable will be described below.

The properties of the functional device can be best optimized by the incorporation of a hole-transporting organic material and an electron-transporting organic material and the deposition of the first electrode, the hole-transporting organic material, the electron-transporting organic material and the second electrode in this order as viewed from the substrate.

However, in the case where this configuration is formed on the substrate by a related art method, the properties of the substrate part are deteriorated, making it impossible to maximize the properties of the device as a whole, because PMOS must be used as a driving transistor for the substrate in the case of luminescent device or the signal charge must be a positive hole and PMOS must be used in the case of photoelectric conversion layer. Nevertheless, the following embodiment of the invention makes it possible to maximize the advantage of the invention. In some detail, a contact hole is formed in the first insulating layer extending to the second electrode layer in which a wiring for connecting the second electrode layer is provided. The contact hole is present in each pixel portion and has a size of 5 μm or less. In addition, it is very difficult to form this embodiment without causing any deterioration of properties. However, the use of the best embodiment of the invention makes it possible to realize a substantially ideal form. In this embodiment, a first insulating layer is formed above the second electrode layer covering the side wall of the functional layer and a second insulating layer is provided interposed between the second electrode and the first insulating layer. The provision of the two-layer configuration of insulating layer makes it possible to maximize the properties of the device without causing any deterioration of the properties of the functional layer. The second insulating layer protects the functional layer from the photolithographic step and the first insulating layer prevents the functional layer from being exposed to the atmosphere.

A modification of the aforementioned photoelectric conversion layer-stacked solid imaging device will be described below.

In accordance with this modification, there are provided a first insulating layer formed on the second electrode layer covering the side wall of the functional layer, a contact hole formed in the first insulating layer extending to the second electrode layer and a second insulating layer provided interposed between the second electrode and the first insulating layer. In this arrangement, the advantage of the invention can be further enhanced.

Figure 18:
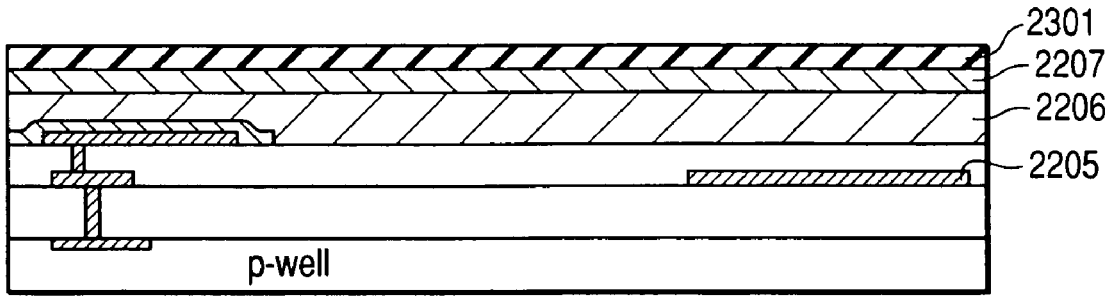
FIG. 18 is a diagrammatic sectional view illustrating a process for the production of a modification of the photoelectric conversion layer-stacked solid imaging device shown in FIG. 1.
Figure 19:
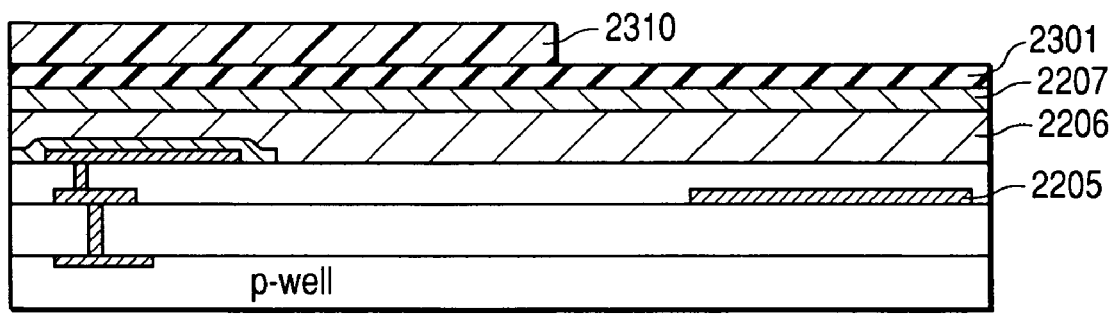
FIG. 19 is a diagrammatic sectional view illustrating another process for the production of a modification of the photoelectric conversion layer-stacked solid imaging device shown in FIG. 1.
Figure 20:
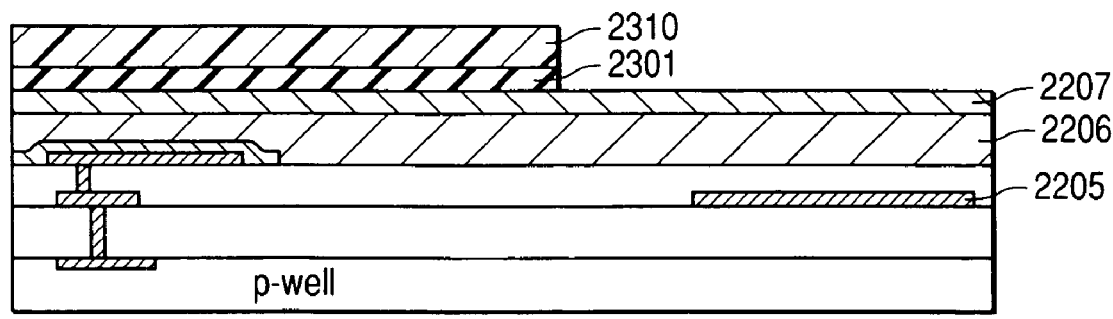
FIG. 20 is a diagrammatic sectional view illustrating other process for the production of a modification of the photoelectric conversion layer-stacked solid imaging device shown in FIG. 1.
Figure 21:
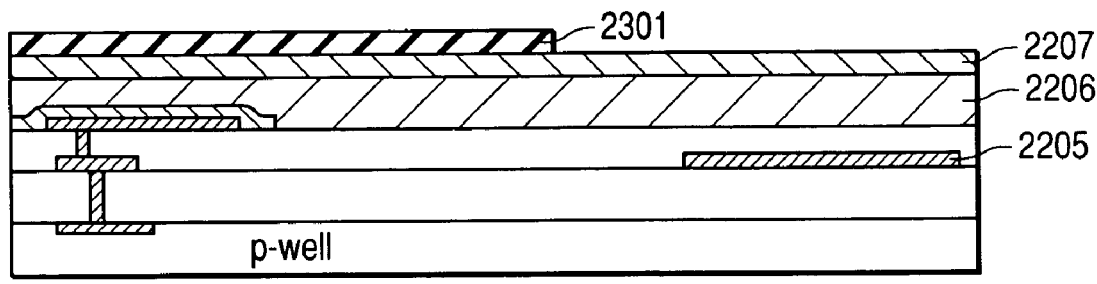
FIG. 21 is a diagrammatic sectional view illustrating a further process for the production of a modification of the photoelectric conversion layer-stacked solid imaging device shown in FIG. 1.
Figure 22:
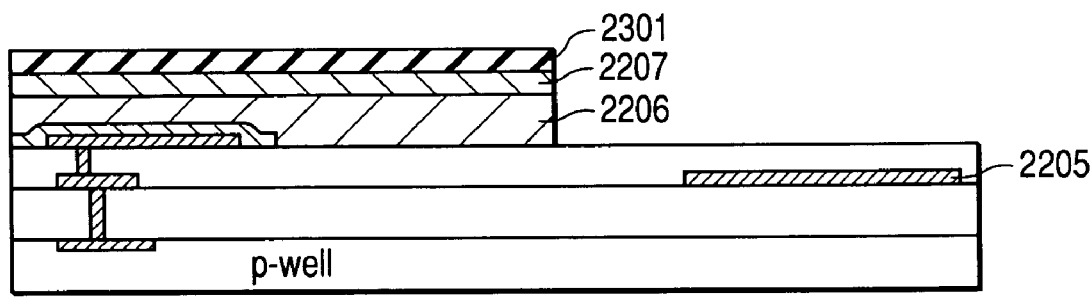
FIG. 22 is a diagrammatic sectional view illustrating a further process for the production of a modification of the photoelectric conversion layer-stacked solid imaging device shown in FIG. 1.
Figure 23:
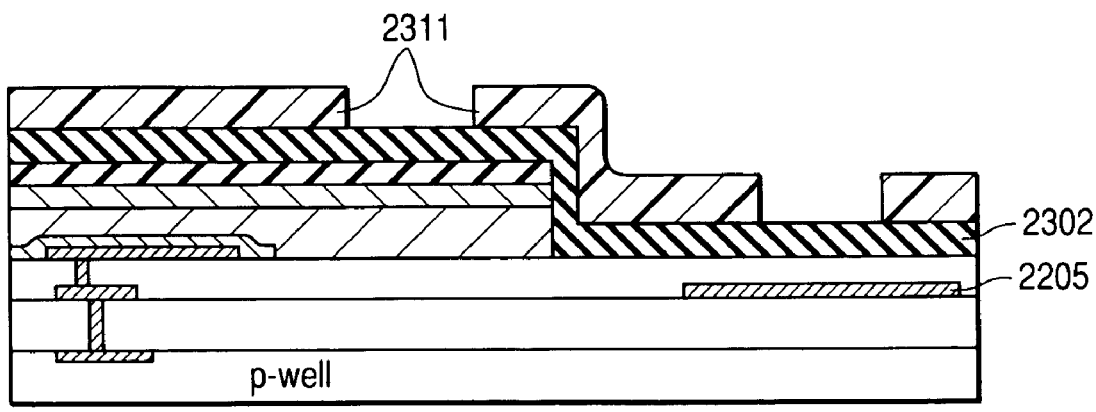
FIG. 23 is a diagrammatic sectional view illustrating a further process for the production of a modification of the photoelectric conversion layer-stacked solid imaging device shown in FIG. 1.
Figure 24:
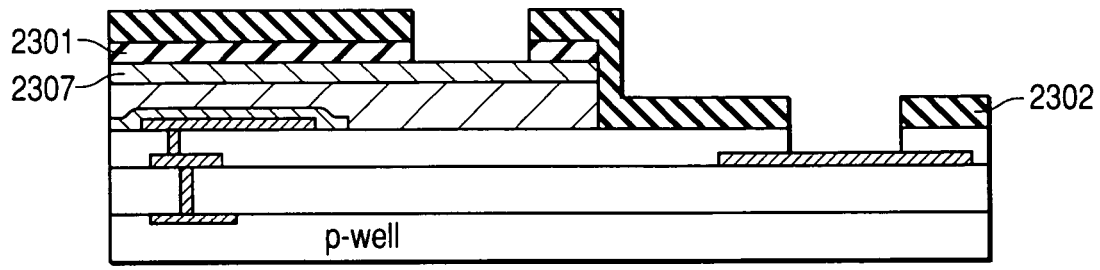
FIG. 24 is a diagrammatic sectional view illustrating a further process for the production of a modification of the photoelectric conversion layer-stacked solid imaging device shown in FIG. 1.
Figure 25:
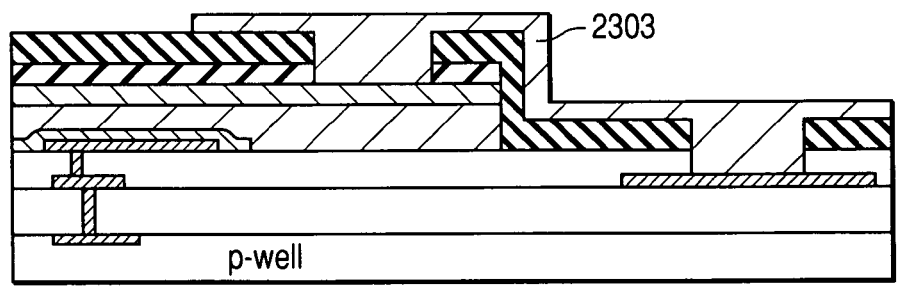
FIG. 25 is a diagrammatic sectional view illustrating a further process for the production of a modification of the photoelectric conversion layer-stacked solid imaging device shown in FIG. 1.
Figure 26:
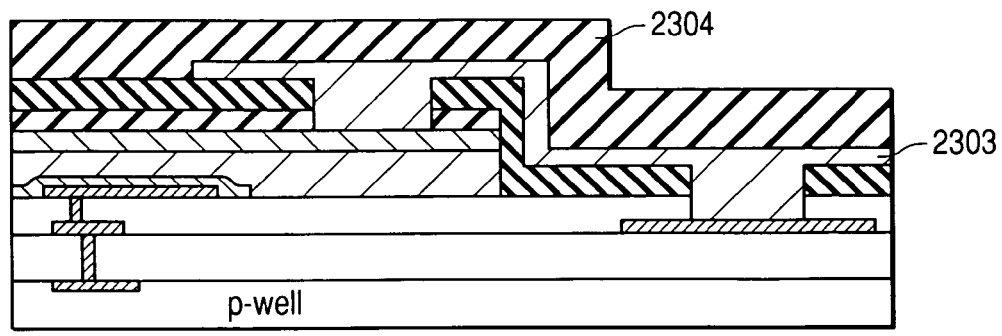
FIG. 26 is a diagrammatic sectional view illustrating a further process for the production of a modification of the photoelectric conversion layer-stacked solid imaging device shown in FIG. 1.

FIGS. 2 to 4 can be explained as a common process to make comparison with the aforementioned process. At the subsequent process, an insulating layer (second insulating layer) 2301 is formed as shown in FIG. 18 without etching the second electrodes (205, 206) as in the foregoing description. A resist 2310 is then photolithographically formed on the insulating layer 2301 as shown in FIG. 19. Firstly, the insulating layer 2301 is etched according to the resist pattern as shown in FIG. 20. Thereafter, the resist 2310 is removed as shown in FIG. 21 before the etching of the second electrode 2207. The removal of the resist 2310 is preferably carried out by a dry process such as oxygen ashing. However, in the case where the second electrode 2207 plays a great role of protecting the photoelectric conversion layer 2206, ashing with an ordinary release agent can be effected. This is a very important point and is greatly advantageous in simplification of production process, cost reduction, etc. Subsequently, etching is effected with the insulating layer 2301 as a mask as shown in FIG. 22. Thereafter, an insulating layer (first insulating layer) 2302 is formed. A resist pattern 2311 is then formed on the insulating layer 2302 as shown in FIG. 23. PAD is then removed as shown in FIG. 24. The resist 2311 is then removed. A wiring material is then formed. Subsequently, a wiring 2303 is formed as shown in FIG. 25. Finally, an insulating layer 2304 is formed as shown in FIG. 26.

The configuration of the present embodiment is advantageous from the following standpoints of view. Since the second electrode 2207 covers the entire surface of the photoelectric conversion layer 2206 during the removal of resist in FIG. 21, resist removal can be effected with a release agent even if the photoelectric conversion layer 2206 can be easily damaged. This point is more advantageous as compared with the aforementioned examples. In particular, in the case where the photoelectric conversion layer 2206 is formed by an organic material, this effect can be drastically exerted. Further, in the case where the photoelectric conversion layer 2206 contains at least a hole-transporting organic material and an electron-transporting organic material, this effect is extremely great.

Further, since the insulating layer 2207 is provided under the insulating layer 2302, the photoelectric conversion layer can be prevented from being deteriorated through the second electrode layer 2207 during the removal of the insulating layer 2302 with the resist 2311 in FIG. 23. Accordingly, the removal of the insulating layer 2302 can be carried out also by wet etching. Moreover, since the insulating layer 2302 covers the side wall of the photoelectric conversion layer 2206, the deterioration of the photoelectric conversion layer by the removal of resist can be prevented during the removal of resist in FIG. 23.

The insulating layer 2302 present under the wiring 2303 covering the photoelectric conversion layer 2206 is important particularly from the standpoint of water permeability. The advantage of the insulating layer 2302 is great when the photoelectric conversion layer 2302 is made of an organic material. When the photoelectric conversion layer 2206 contains at least a hole-transporting organic material and an electron-transporting organic material, the advantage of the insulating layer 2302 is extremely great.

Second Embodiment

An embodiment in which the functional device according to the invention is a luminescent device will be described hereinafter. In the case where a photoelectric conversion layer-stacked solid imaging device is formed in a similar embodiment, as the substrate there may be used one described in the first embodiment or one used in the following third and fourth embodiments. The luminescent device to be used herein is adapted for display, etc. The following description will be made with reference to the case where a portion that emits light for realizing one pixel of image forms one pixel.

Figure 27A:
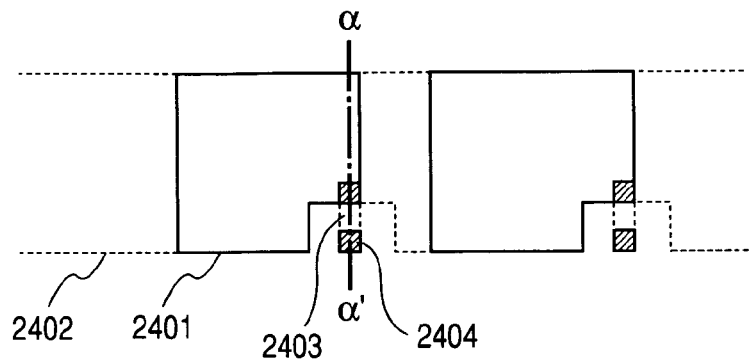
FIG. 27(a) is a diagrammatic plan view illustrating a schematic configuration of two pixels of a luminescent device.
Figure 27B:
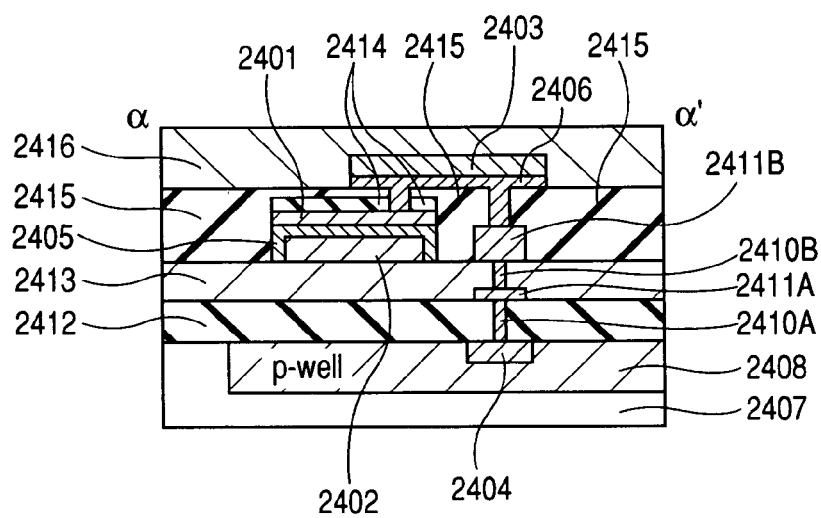
FIG. 27(b) is a diagrammatic sectional view taken on line α-α' of FIG. 27(a)
Figure 27C:
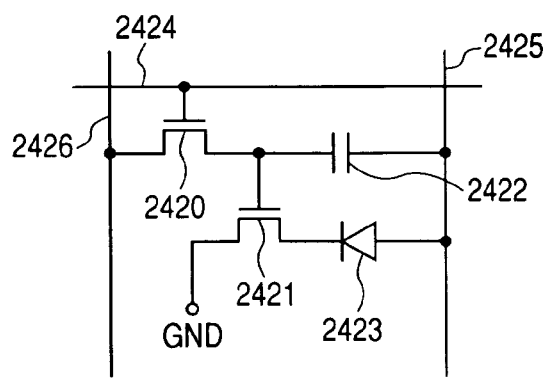
FIG. 27(c) is a diagram of an example of circuit on board employable in the present embodiment.
Figure 27D:
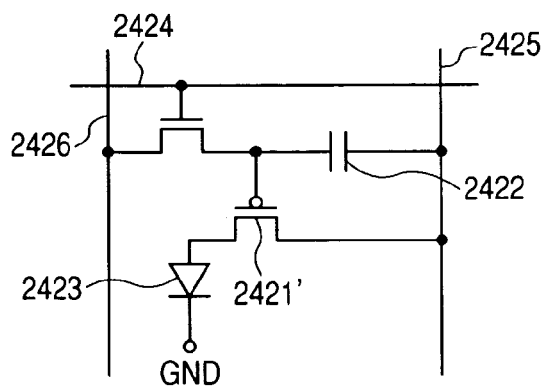
FIG. 27(d) is a diagram of an example of circuit on board commonly used in the related art.

FIG. 27(a) is a diagrammatic plan view illustrating a schematic configuration of two pixels of luminescent device. FIG. 27(b) is a diagrammatic sectional view taken on line α-α' shown in FIG. 27(a). FIG. 27(c) illustrates an example of the board circuit which can be used in the present embodiment. FIG. 27(c) is characterized in that NMOS can be used as a driving transistor for luminescent device. This can be realized by the configuration of the present embodiment.

This luminescent device comprises a first insulating layer formed on the second electrode layer covering the side wall of the functional layer, a contact hole formed in the first insulating layer extending to the second electrode layer in which a wiring for connecting the second electrode layer is provided and a second insulating layer provided interposed between the second electrode and the first insulating layer.

As shown in FIG. 27(b), a silicon substrate 2407 has a p-well layer 2408 formed on the surface thereof. In the p-well layer 2408 is formed a drain 2404 for driving transistor. On the p-well layer 2408 is formed an insulating layer 2412 on which an insulating layer 2413 is formed. On an electric current supplying portion 2404 in the insulating layer 2412 is formed a plug 2410A which is connected to an electrode pad 2411A formed in the insulating layer 2413. On the electrode 2411A is formed a plug 2410B which is connected to an electrode pad 2411B formed in the insulating layer 2415. Thus, the electrode pad 2411B and the drain 2404 of driving transistor are electrically connected to each other.

In the insulating layer 2413 is formed a metallic wiring (not shown) for electrically connecting the electrode pad 2411A and the first electrode layer 2402 to each other. In the insulating layer 2415 are formed a first electrode layer 2402, a luminescent layer 2405, a second electrode layer 2401 and an insulating protective layer (second electrode layer) 2414 in this order as viewed from under. In the luminescent layer are disposed a hole-transporting material and an electron-transporting material in this order as viewed from under. In a part of the second electrode layer 2401 and a part of the electrode pad 2411B in the insulating layer (first electrode layer) 2415 are formed an opening. A barrier metal 2406 is formed in the opening and on the insulating layer 2401. On the barrier metal 2406 is formed a wiring 2403 for electrically connecting the second electrode layer 2401 and the electrode pad 2411B to each other. On the wiring 2403 is formed a protective layer 2416 for protecting the wiring 2403. In the present embodiment, the portion which looks overlapping on the first electrode layer 2402 as viewed in plan is defined as pixel portion.

As shown in FIG. 13(c), the driving circuit of the luminescent device of the present embodiment comprises an NMOS transistor 2420, an NMOS transistor 2421 as a driving transistor, a capacitor 2422, a diode 2423, a scanning signal line 2424, an electric power supplying line 2425 and a data signal line 2426. A related art driving circuit comprises a PMOS transistor 2421' as a driving transistor as shown in FIG. 13(d). Thus, in accordance with the configuration of the luminescent device of the present embodiment, an NMOS type transistor can be used as driving transistor for driving circuit.

Since an NMOS transistor uses electron as a carrier and exhibits a high mobility, the area of the transistor can be almost halved. In particular, since the luminescent device containing an organic material requires a great driving current and hence a relatively great area, the use of NMOS transistor is more advantageous than expected. Further, in the case where as the substrate there is used a monocrystalline silicon substrate, at least one of NMOS transistor and PMOS transistor must be formed on a well having characteristics opposite the carrier to allow the coexistence of the two transistors. The formation of such a well imposes great restraints on design rule (For example, when a PMOS transistor is formed on Nwell, Nwell and NMOS must be disposed sufficiently apart from each other). The two advantages have a decisive effect on the difference in performance of functional device having a small pixel portion.

Further, the luminescent device shown in FIG. 27 comprises a barrier metal 2406 provided interposed between the wiring 2403 and the second electrode layer 2401 and thus can enhance its driving durability as in the first embodiment. As the first electrode layer, second electrode layer, barrier metal, plug, wiring, electrode pad, etc. described in the present embodiment there may be materials described in the first embodiment. When the luminescent device is made of an organic material, the effect of preventing the deterioration of properties can be further exerted.

The water permeability of the insulating layer 2415 and the protective layer 2414 is preferably 10 g/m$^2$·day or less, more preferably 1 g/m$^2$·day or less, even more preferably from $1\times10^{-9}$ to $1\times10^{-2}$ g/m$^2$·day, still more preferably from not smaller than $1\times10^{-9}$ to not greater than $1\times10^{-2}$ g/m$^2$·day, still more preferably from not smaller than $1\times10^{-9}$ to not greater than $1\times10^{-4}$ g/m$^2$ day. Moreover, the barrier metal may be disposed interposed between the first electrode layer 2402 and the metal wiring connected thereto.

A process for the production of the luminescent device having the aforementioned configuration will be described in connection with the attached drawings.

Figure 28:
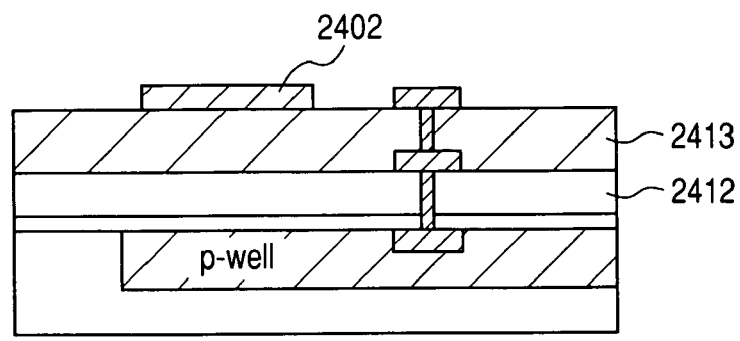
FIG. 28 is a diagrammatic sectional view illustrating a process for the production of a luminescent device shown in FIG. 27.

FIGS. 28 to 39 each is a diagrammatic sectional view illustrating a process for the production of the luminescent device shown in FIG. 27. FIG. 28 illustrates a stage which has been completed up to the first electrode layer 2402. Since the layers up to the first electrode layer 2402 can be prepared by an ordinary semiconductor process, the subsequent steps will be described in detail.

Figure 29:
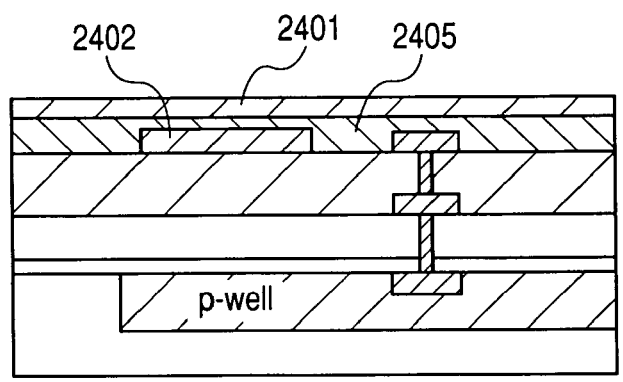
FIG. 29 is a diagrammatic sectional view illustrating another process for the production of a luminescent device shown in FIG. 27.
Figure 30:
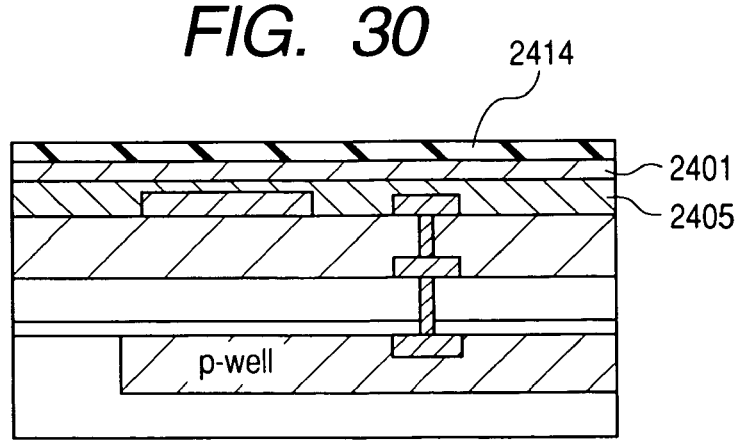
FIG. 30 is a diagrammatic sectional view illustrating other process for the production of a luminescent device shown in FIG. 27.
Figure 31:
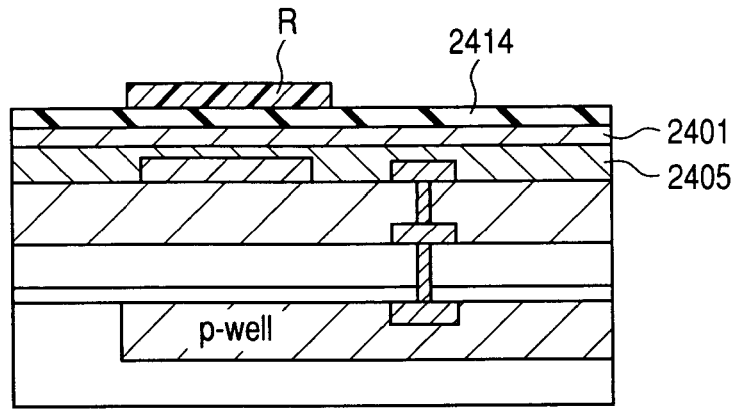
FIG. 31 is a diagrammatic sectional view illustrating a further process for the production of a luminescent device shown in FIG. 27.

After the formation of the first electrode layer 2402, a luminescent layer 2405 and a second electrode layer 2401 are deposited on the first electrode layer 2402 in this order as shown in FIG. 29. Subsequently, a protective layer 2414 for protecting the luminescent layer 2405 is formed on the second electrode layer 2401 as shown in FIG. 30. Subsequently, a predetermined resist pattern R is formed on the protective layer 2414 as shown in FIG. 31 to divide the luminescent layer every pixel.

Figure 32:
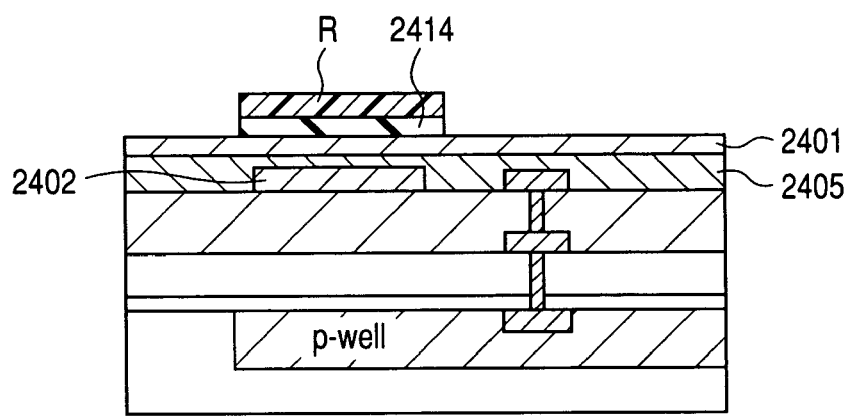
FIG. 32 is a diagrammatic sectional view illustrating a further process for the production of a luminescent device shown in FIG. 27.
Figure 33:
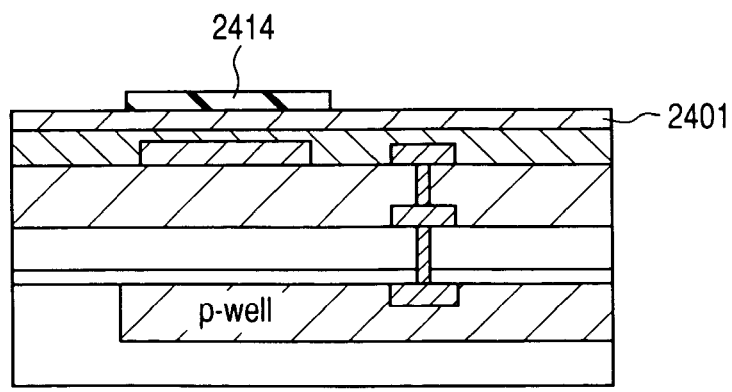
FIG. 33 is a diagrammatic sectional view illustrating a further process for the production of a luminescent device shown in FIG. 27.
Figure 34:
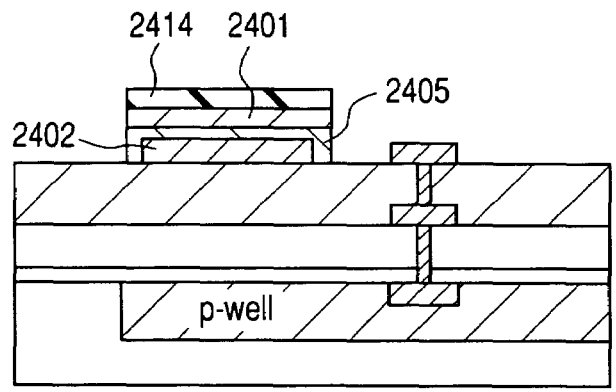
FIG. 34 is a diagrammatic sectional view illustrating a further process for the production of a luminescent device shown in FIG. 27.
Figure 35:
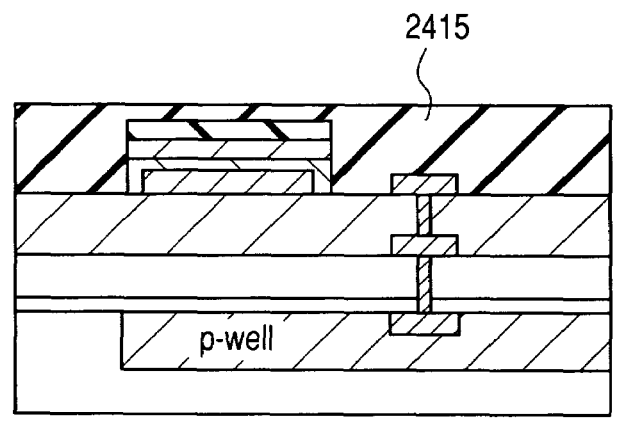
FIG. 35 is a diagrammatic sectional view illustrating a further process for the production of a luminescent device shown in FIG. 27.
Figure 36:
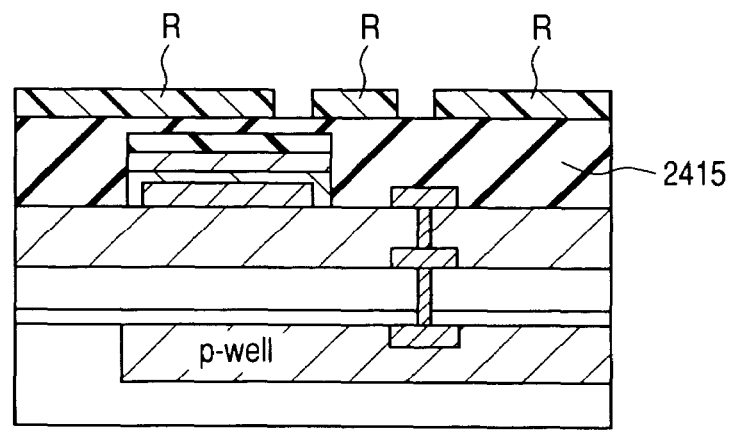
FIG. 36 is a diagrammatic sectional view illustrating a further process for the production of a luminescent device shown in FIG. 27.
Figure 37:
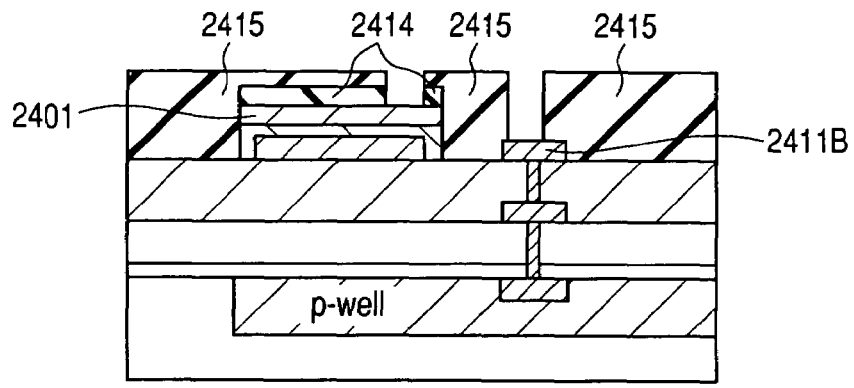
FIG. 37 is a diagrammatic sectional view illustrating a further process for the production of a luminescent device shown in FIG. 27.

Subsequently, the protective layer 2414 is etched with the resist pattern R as a mask as shown in FIG. 32. Subsequently, the resist pattern R is removed as shown in FIG. 33. Subsequently, the first electrode layer 2402, the luminescent layer 2405 and the second electrode layer 2401 are etched with the protective layer 2414 as a mask as shown in FIG. 34. Subsequently, an insulating layer 2415 is formed all over the surface of the layers as shown in FIG. 35. Subsequently, a resist pattern R is formed on the insulating layer 2415 as shown in FIG. 36. Subsequently, the insulating layer 2415 and the protective layer 2415 are etched with the resist pattern R as a mask to form an opening in a part of the portion above the second electrode layer 2401 and a part of the portion above the electrode pad 2411B as shown in FIG. 37.

Figure 38:
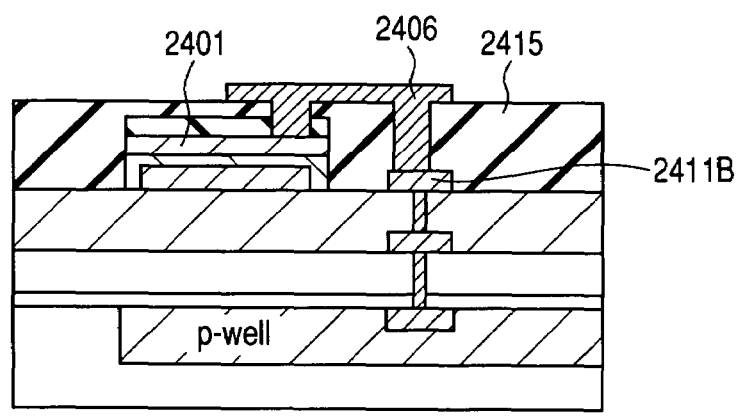
FIG. 38 is a diagrammatic sectional view illustrating a further process for the production of a luminescent device shown in FIG. 27.
Figure 39:
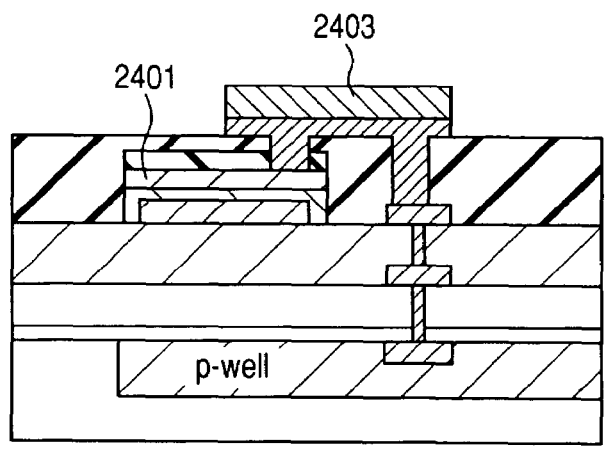
FIG. 39 is a diagrammatic sectional view illustrating a further process for the production of a luminescent device shown in FIG. 27.

Subsequently, after the formation of a barrier metal all over the surface of the layers, the barrier metal 2406 is then patterned leaving only the portion at which the second electrode layer 2401 and the electrode pad 2411B are connected to each other as shown in FIG. 38. Under these conditions, the opening on the second electrode layer 2401 and the electrode pad 2411B are filled with the barrier metal 2406. Subsequently, a wiring material layer is formed. Patterning is then conducted leaving the wiring material layer only on the barrier metal 2406 to form a wiring 2403 as shown in FIG. 39. Finally, a protective layer 2416 is formed on the wiring 2403 to obtain a luminescent device shown in FIG. 27(b). The patterning of the wiring 2403 and the barrier metal 2406 may be conducted at the same time.

This embodiment is advantageous in that an insulating layer can be disposed all over the surface of the functional layer during the formation of resist and the removal of resist can be conducted while protecting the second electrode layer. In some detail, this production method makes it possible to pattern the barrier metal 2406 and the wiring 2403 while two insulating layers, i.e., protective layers 2414 and 2415 are being present on the luminescent layer 2405 which is a functional layer. In this manner, the damage on the luminescent layer 2405 at the photolithographic step during the formation of the barrier metal 2406 and the wiring 2403 can be minimized, making it possible to prevent the deterioration of the properties of the luminescent layer 2405. Further, in the configuration of the luminescent device shown in FIG. 27, the wiring 2403 is formed in the pixel portion. Thus, the smaller the wiring 2403 is, the greater can be the luminescent area. The present embodiment can be applied to the three-layer stacked structure as exemplified below.

Third Embodiment

The aforementioned first constitution wherein the functional device according to the invention is a photoelectric conversion layer-stacked solid imaging device which comprises a stacked three units each having a photoelectric conversion layer interposed between two electrode layers provided on a silicon substrate such that three color light rays are detected on the silicon substrate to allow color imaging will be described hereinafter.

Figure 40:
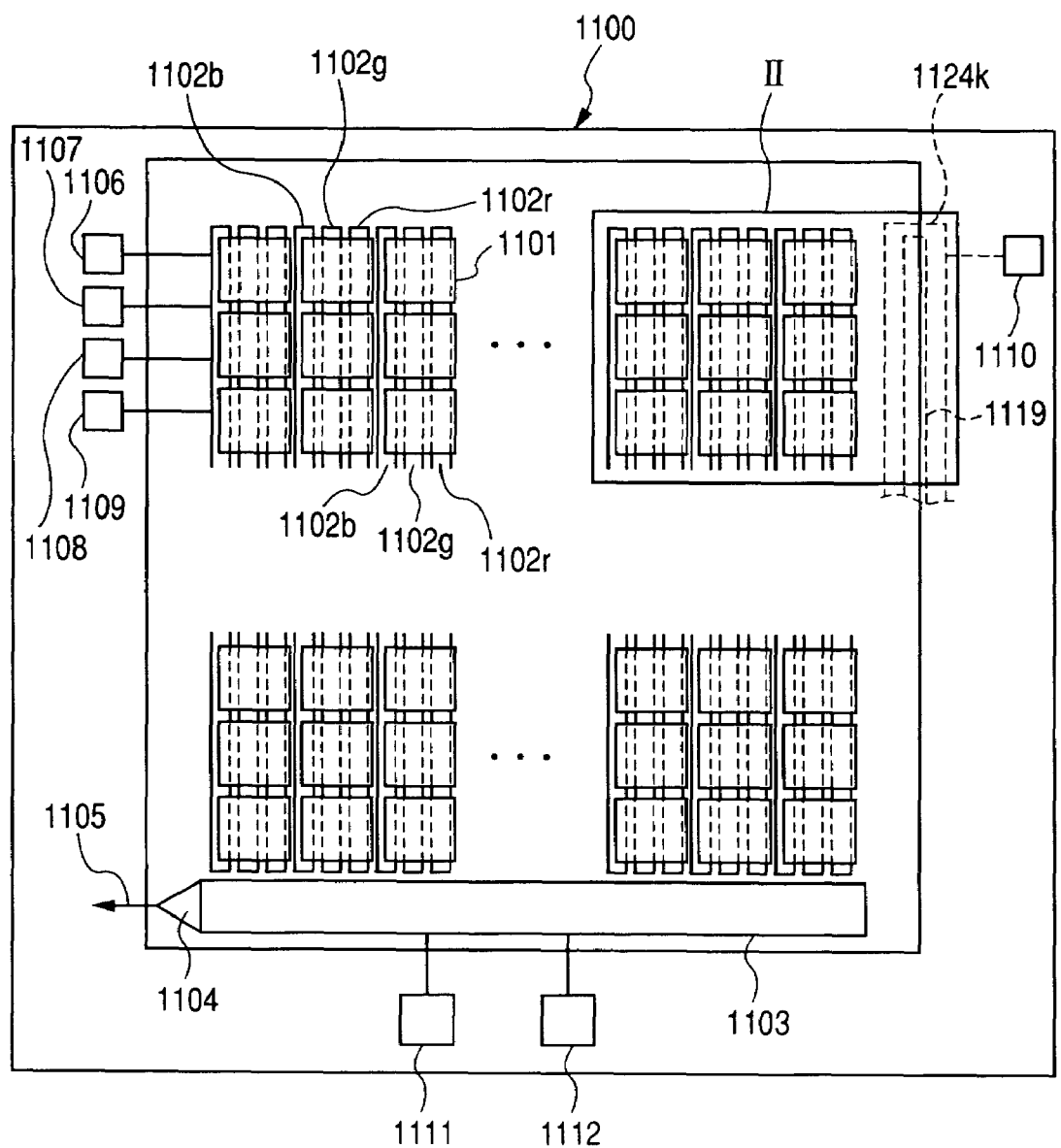
FIG. 40 is a diagrammatic plan view of a photoelectric conversion layer-stacked solid imaging device for illustrating a third embodiment of the invention.

FIG. 40 is a diagrammatic sectional view of a photoelectric conversion layer-stacked solid imaging device for illustrating a third embodiment of the invention. A photoelectric conversion layer-stacked solid imaging device 1100 shown in FIG. 40 comprises a number of light-receiving portions (pixels) aligned longitudinally and crosswise in lattice form in this example. The basic configuration of the photoelectric conversion layer-stacked solid imaging device will be first described. The structure having parts characteristic to the invention will be described separately later.

On the surface of a semiconductor substrate provided under the light-receiving portion 1101 of the photoelectric conversion layer-stacked solid imaging device 1100 which is a basic structure are formed three vertical transfer channels (row CCD register) 1102b, 1102g, 1102r (hereinafter the suffixes b, g and r correspond to blue (B), green (G) and red (R), respectively) corresponding to the various rows of light-receiving portions aligned in the row direction. At the lower side of the semiconductor substrate is formed a horizontal transfer channel (line CCD register) 1103.

At the outlet of the horizontal transfer channel 1103 is provided an amplifier 1104. The signal charge detected at the various light-receiving portions 1101 are each transferred to the horizontal transfer channel 1103 via the vertical transfer channels 1102b, 1102g and 1102r, respectively, and then transferred to the amplifier 1104 via the horizontal transfer channel 1103 from which it is then outputted as an output signal 1105.

On the surface of the semiconductor substrate are provided electrode terminals 1106, 1107, 1108 and 1109 connected to a four-phase transfer electrode (not shown) provided imposed on the vertical transfer channels 1102b, 1102g and 1102r to which a four-phase transfer pulse is applied, an electrode terminal 1110 connected to a second electrode layer described later and two-phase transfer electrode terminals 1111 and 1112 of the horizontal transfer channel 1103.

Figure 41A:
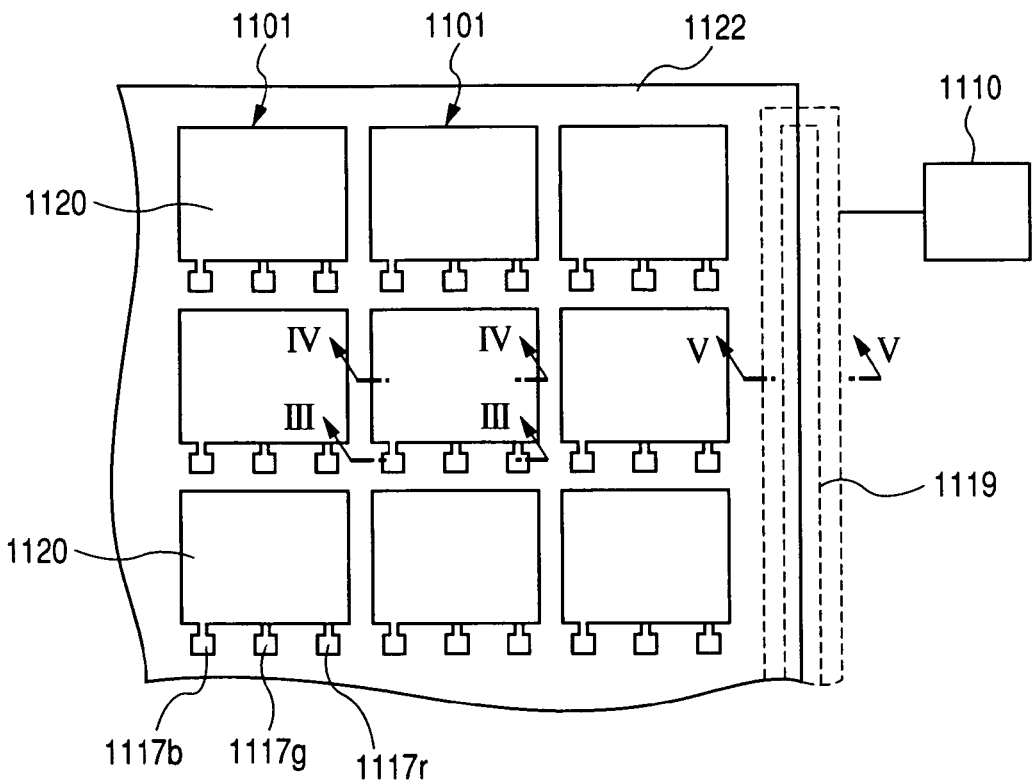
FIG. 41(a) is a diagrammatic enlarged view of the interior of a dotted rectangular frame shown in FIG. 40.

FIG. 41(a) is an enlarged diagrammatic view of the interior of a dotted rectangular frame II shown in FIG. 40 wherein a light-receiving portion 1101 corresponding to 9 pixels and a longitudinal wiring 1119 for second electrode layer to which the electrode terminal 1110 is connected are shown. In FIG. 41(a), the vertical transfer channels 1102r, 1102g and 1102b shown in FIG. 40 are not shown.

Figure 41B:
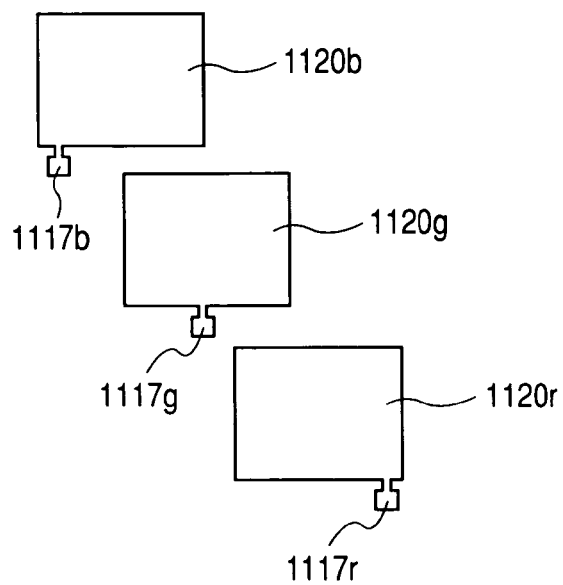
FIG. 41(b) is a diagram illustrating a first electrode layer shown in FIG. 41(a)

The various light-receiving portions 1101 are defined by a first rectangular electrode layer (also referred to as "pixel electrode layer" because it is divided every pixel) 1120. The first electrode layer 1120 shown in FIG. 41(a) comprises three sheets of first electrode layers 1120r, 1120g and 1120b aligned in the direction of incidence of light with the photoelectric conversion layer described later interposed therebetween as shown in FIG. 41(b).

The first electrode layer 1120r for red color comprises a longitudinal wiring connecting pad 1117r provided extending from the surface flush with the first electrode layer 1120r. The first electrode layer 1120g for green color comprises a longitudinal wiring connecting pad 1117g provided similarly. The first electrode layer 1120b for blue color comprises a longitudinal wiring connecting pad 1117b provided similarly. The various pads 1117r, 1117g and 1117b on the same pixel (light-receiving portion) 1101 are provided in such an arrangement that they deviate from each other in position as shown in FIG. 41(a).

The reference numeral 1122 in FIG. 41(a) indicates a second electrode layer. In accordance with the basic structure of the present embodiment, the second electrode layer 1122, too, comprises a second electrode layer 1122r for red color, a second electrode layer 1122g for green color and a second electrode layer 1122b for blue color provided imposed on each other with a photoelectric conversion layer interposed therebetween as described later.

Figure 42:
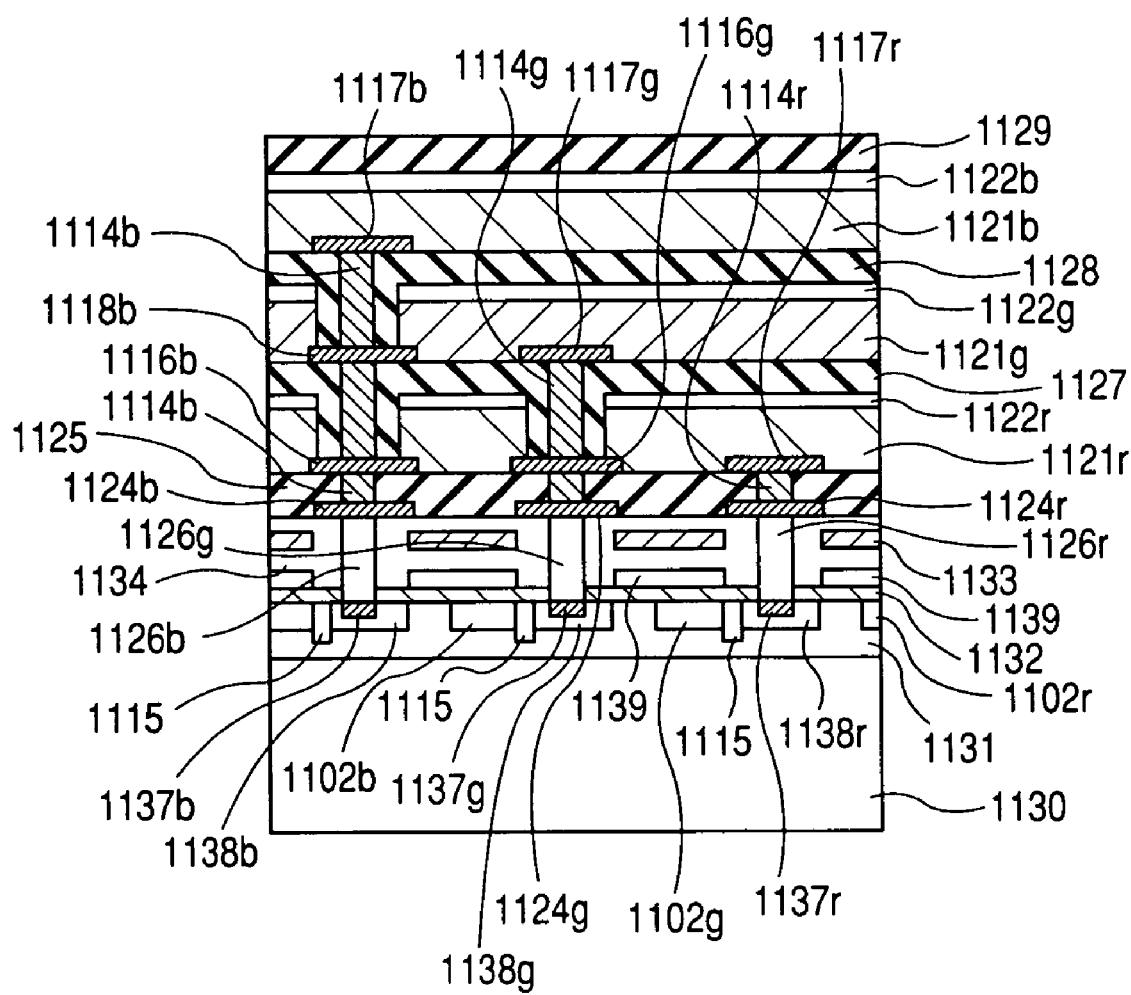
FIG. 42 is a diagrammatic sectional view taken on line III-III of FIG. 41(a)
Figure 43:
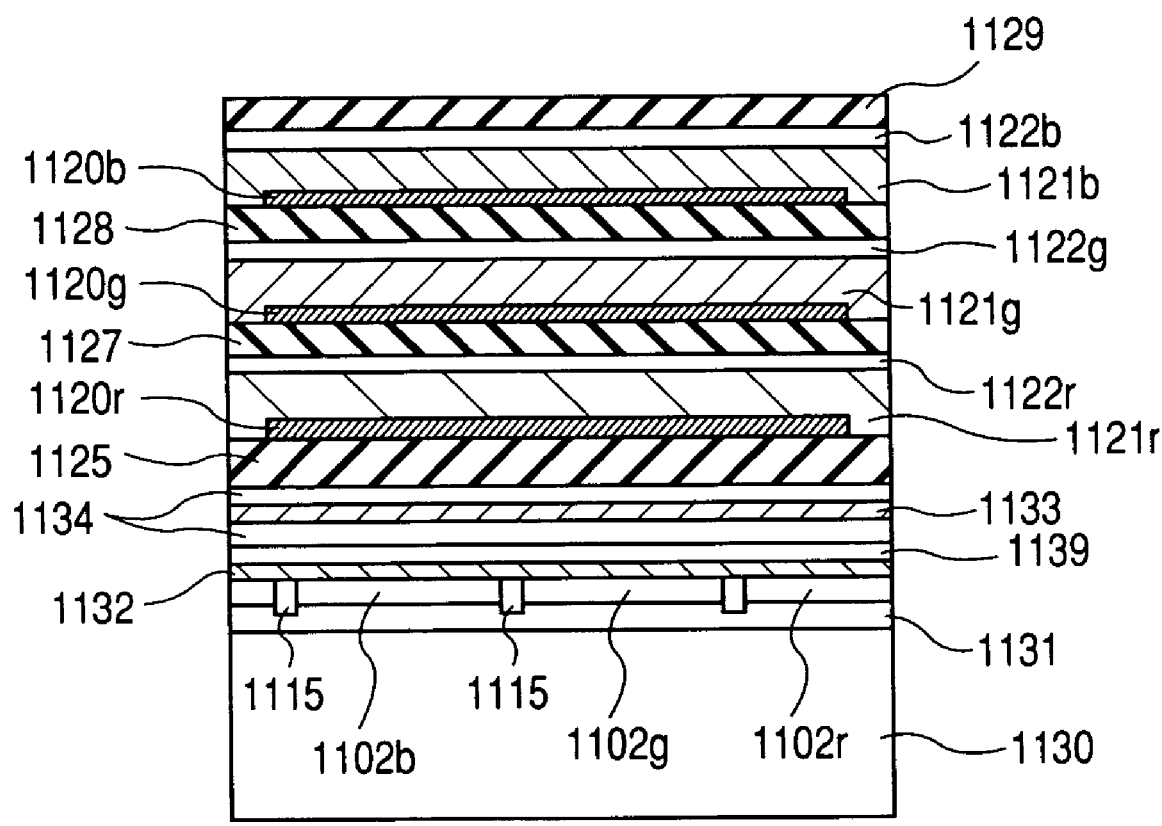
FIG. 43 is a diagrammatic sectional view taken on line IV-IV of FIG. 41(a)

FIG. 42 is a diagrammatic sectional view taken on line III-III of FIG. 41(a) wherein the section at pad 1117r, 1117g and 1117b are shown. FIG. 43 is a diagrammatic sectional view taken on line IV-IV of FIG. 41(a) wherein the section at the center of pixel is shown.

On the surface of the n-type semiconductor substrate 1130 is formed P-well layer 1131. On the surface of the P-well layer 1131 are formed charge storage portions 1138r, 1138g and 1138b composed of n-type region and vertical transfer channels (n-type semiconductor layer) 1102r, 1102g and 1102b defined by a channel stop 1115. At the center of the various charge storage portions 1138r, 1138g and 1138b are formed longitudinal wiring connecting portions 1137r, 1137g and 1137b composed of n+ region.

On the surface of the semiconductor substrate 1130 is formed a gate insulating layer 1132. On the gate insulating layer 1132 is formed a transfer electrode 1139 made of polysilicon. On the transfer electrode 1139 is formed an insulating layer 1134. In the insulating layer 1134 is formed a light-shielding layer 1133 so that incident light cannot enter the vertical transfer channels.

On the insulating layer 1134 is formed an electrically-conductive layer. When the electrically-conductive layer is patterned, crosswise wirings 1124r, 1124g and 1124b shown in FIG. 42 are formed. The longitudinal wiring connecting portions 1137r, 1137g and 1137b and crosswise wiring connecting portions 1124r, 1124g and 1124b of the charge storage portions 1138r, 1138g and 1138b are connected to each other via first longitudinal wirings 1126r, 1126g and 1126b, respectively.

On the layers having the crosswise wirings 1124r, 1124g and 1124b provided therein is formed an insulating layer 1125 on which a transparent electrically-conductive layer is deposited. The electrically-conductive layer is patterned to form a first electrode layer 1120r which is divided every light-receiving portion 1101. This patterning causes a pad 1117r shown in FIG. 41(b) to be formed. At the same time, electrically-conductive layers 1116b and 1116g which have been aligned in the direction of incidence of light and separated from other portions are left on the pads 1117b and 1117g.

On the upper part of the first electrode layers 1120r, the pad 1117r and the electrically-conductive layers 1116b and 1116g is deposited a photoelectric conversion layer 1121r for detecting red color (R). The photoelectric conversion layer doesn't need to be divided every light-receiving portion. A sheet of the photoelectric conversion layer 1121r is deposited on the entire light-receiving surface comprising an assembly of various light-receiving portions 1101.

On the photoelectric conversion layer 1121r is deposited a sheet of second electrode layer (also referred to as "counter electrode layer" because it is opposed to the first electrode layer) 1122r common to the various light-receiving portions 1101 for detecting red signal. On the second electrode layer 1122r is deposited a transparent insulating layer (first insulating layer) 1127.

On the insulating layer 1127 is deposited a transparent electrically-conductive layer. The electrically-conductive layer is patterned to form a first electrode layer 1120g and a pad 1117g which are each divided every light-receiving portion 1101 and an electrically-conductive layer 1118b which is separated from other portions and aligned on a pad 1117b shown in FIG. 41(b). On the first electrode layer 1120g, etc. is similarly deposited a sheet of photoelectric conversion layer 1121g for detecting green color (G). On the photoelectric conversion layer 1121g is deposited a second electrode layer 1122g. On the second electrode layer 1122g is deposited a transparent insulating layer (first insulating layer) 1128.

On the insulating layer 1128 is deposited a transparent electrically-conductive layer. The transparent electrically-conductive layer is patterned to form a first electrode layer 1120b and a pad 1117b which are each divided every light-receiving portion 1101. On these layers is similarly deposited a sheet of photoelectric conversion layer 1121b for detecting blue color (B). On the photoelectric conversion layer 1121b is deposited a second electrode layer 1122b. A transparent protective layer 1129 is provided as an uppermost layer.

The crosswise wiring 1124b and the pad 1117b of the first blue electrode layer 1120b are connected to each other via a second longitudinal wiring 1114b. The crosswise wiring 1124g and the pad 1117g of the first green electrode layer 1120g are connected to each other via a second longitudinal wiring 1114g. The crosswise wiring 1124r and the pad 1117r of the first red electrode layer 1120r are connected to each other via a second longitudinal wiring 1114r. The various longitudinal wirings 1114r, 1114g, 1114b, 1126r, 1126g and 1126b are produced electrically insulated from the portions other than the corresponding first electrode layer pads, electrically-conductive layers 1116g, 1116b and 1118b and crosswise wirings as described in detail later.

Figure 44:
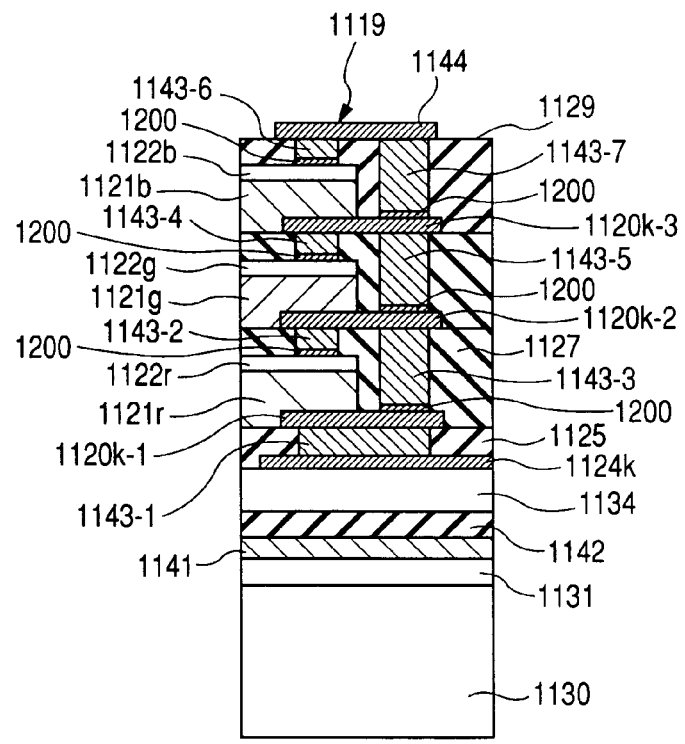
FIG. 44 is a diagrammatic sectional view taken on line V-V of FIG. 41(a)
Figure 45A:
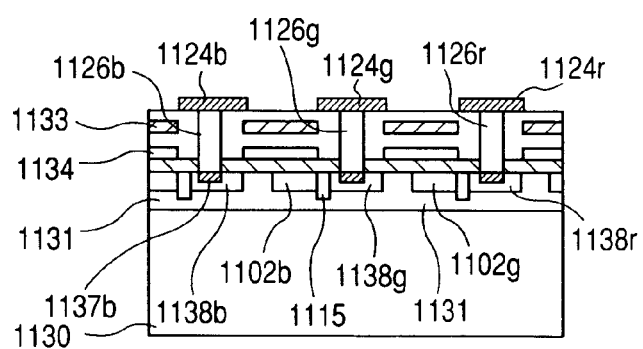
FIG. 45(a) is a diagrammatic sectional view of the photoelectric conversion layer-stacked solid imaging device in the same position as in FIG. 42
Figure 45B:
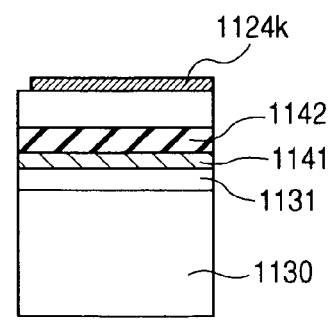
FIG. 45(b) is a diagrammatic sectional view of the photoelectric conversion layer-stacked solid imaging device in the same position as in FIG. 44.

FIG. 44 is a diagrammatic sectional view taken on line V-V of FIG. 41(a) wherein the connection of the electrode terminal 1110 to the various second electrode layers 1122b, 1122g and 1122r in FIG. 40 is shown. In the surface of the P-well layer 1131 formed on the surface of the n-type semiconductor substrate 1130 is formed a high concentration P-layer 1141 on which a field region (insulating layer) 1142 is formed.

The high concentration P-layer 1141 may be formed at a step which is the same as or different from that of the channel stop 1115 shown in FIGS. 42 and 43. The insulating layer 1142 is formed at the same time with the formation of the gate insulating layer 1132 shown in FIGS. 42 and 43. After the formation of the gate insulating layer 1132, the step of forming an insulating layer continues until the thickness of the insulating layer becomes greater than that of the gate insulating layer 1132.

On the insulating layer 1142 is formed the same insulating layer 1134 as in FIGS. 42 and 43. On the insulating layer 1134 is deposited an electrically-conductive layer 1124k. The electrically-conductive layer 1124k is formed by patterning the electrically-conductive layer constituting the crosswise wirings 1124r, 1124g and 1124b as in FIGS. 42 and 43. The electrode terminal 1110 shown in FIG. 40 is connected to the electrically-conductive layer 1124k.

By patterning the electrically-conductive layer constituting the first electrode layer 1120r, an electrically-conductive layer 1120k-1 is formed to form a longitudinal wiring 1143-1 between the electrically-conductive layer 1124k and the electrically-conductive layer k-1.

Similarly, by patterning the electrically-conductive layer constituting the first electrode layer 1120g, an electrically-conductive layer 1120k-2 is formed to form a longitudinal wiring 1143-2 between the second electrode layer 1122r and the electrically-conductive layer 1120k-2 and a longitudinal wiring 1143-3 between the second electrode layer 1120k-2 and the electrically-conductive layer 1120k-1. In this arrangement, the second electrode layer 1122r and the electrically-conductive layer 1124k are electrically connected to each other so that the second electrode layer 1122r is connected to the electrode terminal 1110.

Similarly, by patterning the electrically-conductive layer constituting the first electrode layer 1120b, an electrically-conductive layer 1120k-3 is formed to form a longitudinal wiring 1143-4 between the second electrode layer 1122g and the electrically-conductive layer 1120k-3 and a longitudinal wiring 1143-5 between the second electrode layer 1120k-3 and the electrically-conductive layer 1120k-2. In this arrangement, the second electrode layer 1122g and the electrically-conductive layer 1124k are electrically connected to each other so that the second electrode layer 1122g is connected to the electrode terminal 1110.

On the corner of the upper surface of the protective layer 1129 is deposited a transparent electrically-conductive layer 1144. A longitudinal wiring 1143-6 is formed between the second electrode layer 1122b and the electrically-conductive layer 1144. At the same time, a longitudinal wiring 1143-7 is formed between the electrically-conductive layer 1144 and the electrically-conductive layer 1120k-3. In this arrangement, the second electrode layer 1122b and the electrically-conductive layer 1124k are electrically connected to each other so that the second electrode layer 1122b is connected to the electrode terminal 1110.

The photoelectric conversion layer-stacked solid imaging device as a basic structure of the present embodiment comprises a barrier metal 1200 provided interposed between two different electrodes, e.g., between the second electrode layer 1122r and the longitudinal wiring 1143-2, between the second electrode layer 1122g and the longitudinal wiring 1143-4, between the second electrode layer 1122b and the longitudinal wiring 1143-6, between the second electrode layer 1120k-1 and the longitudinal wiring 1143-3, between the second electrode layer 1120k-2 and the longitudinal wiring 1143-5, between the second electrode layer 1120k-3 and the longitudinal wiring 1143-7. In this arrangement, the driving durability can be enhanced as in FIG. 44. As the material of the second electrode layer and barrier metal there may be used one used in the first embodiment. The barrier metal may be present in at least one of the aforementioned gaps.

As each of the homogeneous transparent electrode layers 1122r, 1122g, 1122b, 1120r, 1120g, 1120b, etc. there is used a thin layer of tin oxide ($SnO_2$), titanium oxide ($TiO_2$), indium oxide ($InO_2$) or indium oxide-tin (ITO). However, the invention is not limited to these materials.

The photoelectric conversion layers 1121r, 1121g and 1121b each may have a single-layer structure or multi-layer structure. As the layer material there may be used any material selected from the group consisting of inorganic materials such as silicon and compound semiconductor, organic materials such as organic semiconductor and organic dye and quantum dot deposit layer composed of nanoparticles. A preferred configuration of these photoelectric conversion layers is the same as described in the first embodiment.

In accordance with the basic configuration of the present embodiment, a plurality of photoelectric conversion layers are deposited on a silicon substrate. For example, in order to deposite two photoelectric conversion layers on a silicon substrate, the combination of photoelectric conversion layers may be such that any of the configurations [1], [2], [3], [4] and [5] described in the first embodiment are be arbitrarily combined or the configurations [1], [2], [3], [4] and [5] are be combined with other configurations. The deposition of a plurality of photoelectric conversion layers on a silicon substrate provides a higher percent utilization of light than the deposition of a single photoelectric conversion layer and thus is a more desirable constitution of the invention. Further, the deposition of three or more photoelectric conversion layers on a silicon substrate as in the basic structure of the present embodiment provides an even higher percent utilization of light and thus is particularly desirable in the invention. In particular, in the case where three or more photoelectric conversion layers are deposited on a silicon substrate, a blue photoelectric conversion layer, a green photoelectric conversion layer and a red photoelectric conversion layer can be prepared, making it possible to prepare a full-color imaging device. Thus, this configuration is very desirable in the invention. It goes without saying that the deposition of three or more photoelectric conversion layers a silicon substrate may be such that any of the configurations [1], [2], [3], [4] and [5] or the configurations [1], [2], [3], [4] and [5] are be combined with other configurations as in the deposition of two photoelectric conversion layers. Of course, other combinations may be used.

When light rays from the subject are incident on the photoelectric conversion layer-stacked solid imaging device 1100 having such an arrangement, a photocharge is generated in the photoelectric conversion layer 1121b according to the amount of blue light among the incident light rays. The photocharge thus generated moves through the longitudinal wiring 1114b, the crosswise wiring 1124b and the longitudinal wiring 1126b, and then is stored in the charge storage portion 1138b. At the same time, a photocharge corresponding to the amount of green light is stored in the charge storage portion 1138g and a photocharge corresponding to the amount of red light is stored in the charge storage portion 1138r. The charge (signal charge) stored in the charge storage portions 1138r, 1138g and 1138b each are read, and then transferred through the vertical transfer channels 1102r, 1102g and 1102b to the horizontal transfer channel 1103 through which it is then transferred to the photoelectric conversion layer-stacked solid imaging device 1100 from which it is then outputted.

FIG. 45 to 59 each is a diagram illustrating a procedure of producing the photoelectric conversion layer-stacked solid imaging device shown in FIGS. 42 to 44. FIGS. 45(a) to 59(a) each are a diagrammatic sectional view taken in the same position as in FIG. 42. FIGS. 45(b) to 59(b) each is a diagrammatic sectional view taken in the same position as in FIG. 44. FIG. 59(a), which illustrates the completion of production, is the same as FIG. 42. FIG. 59(b) is the same as FIG. 44.

Up to the state shown in FIG. 45, production is conducted in the same manner as used in the related art CCD type and CMOS type solid imaging devices. In some detail, charge storage portions 1138r, 1138g and 1138b and vertical transfer channels 1102r, 1102g and 1102b are formed on a P-well layer 1131 of a semiconductor substrate 1130. An insulating layer 1134 is formed in the surface portion. The insulating layer 1134 is etched to have an opening for first longitudinal wirings 1126r, 1126g and 1126b. These openings are each filled with a metal such as tungsten and copper or an electrically-conductive polycrystalline silicon to form first longitudinal wirings 1126r, 1126g and 1126b. Subsequently, a transparent electrically-conductive layer is formed in the surface portion. The transparent electrically-conductive layer is then patterned to form crosswise wirings 1124r, 1124g and 1124b and an electrically-conductive layer 1124k. The patterning involves, e.g., spreading of resist, exposure, development and etching in this order.

Figure 46A:
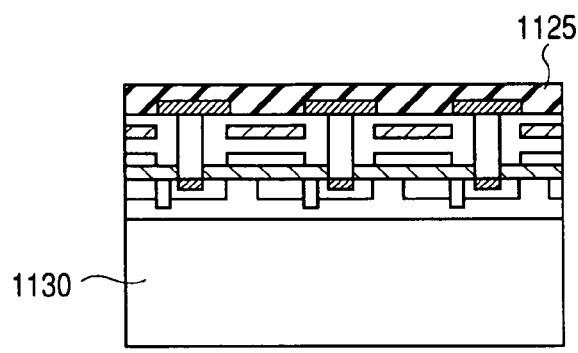
FIG. 46(a) is a diagrammatic sectional view of the photoelectric conversion layer-stacked solid imaging device in the same position as in FIG. 42
Figure 46B:
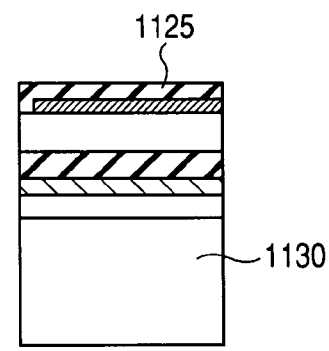
FIG. 46(b) is a diagrammatic sectional view of the photoelectric conversion layer-stacked solid imaging device in the same position as in FIG. 44.
Figure 47A:
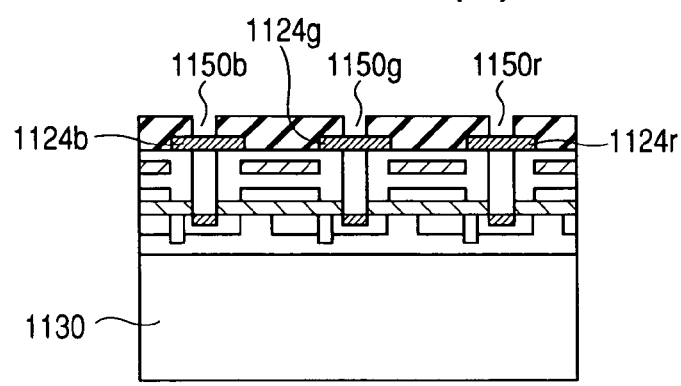
FIG. 47(a) is a diagrammatic sectional view of the photoelectric conversion layer-stacked solid imaging device in the same position as in FIG. 42
Figure 47B:
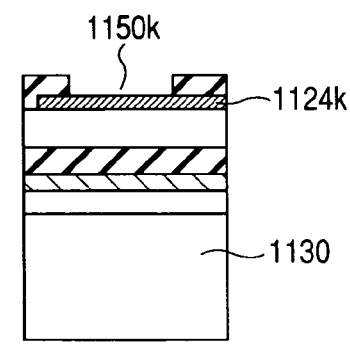
FIG. 47(b) is a diagrammatic sectional view of the photoelectric conversion layer-stacked solid imaging device in the same position as in FIG. 44.
Figure 48A:
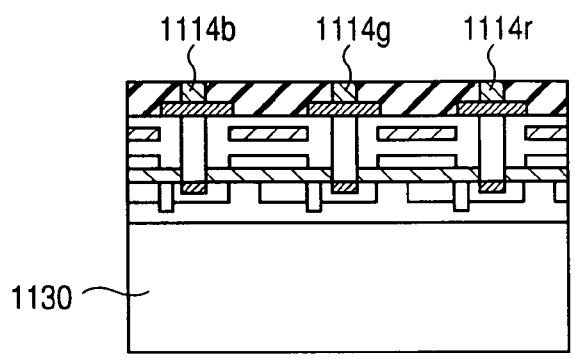
FIG. 48(a) is a diagrammatic sectional view of the photoelectric conversion layer-stacked solid imaging device in the same position as in FIG. 42
Figure 48B:
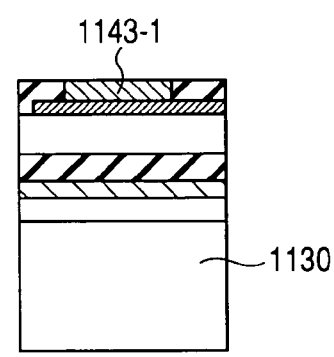
FIG. 48(b) is a diagrammatic sectional view of the photoelectric conversion layer-stacked solid imaging device in the same position as in FIG. 44.
Figure 49A:
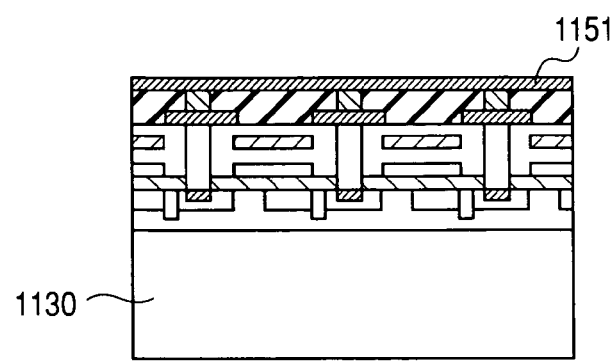
FIG. 49(a) is a diagrammatic sectional view of the photoelectric conversion layer-stacked solid imaging device in the same position as in FIG. 42
Figure 49B:
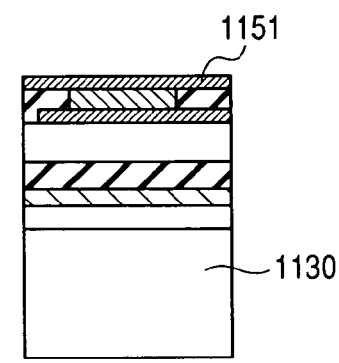
FIG. 49(b) is a diagrammatic sectional view of the photoelectric conversion layer-stacked solid imaging device in the same position as in FIG. 44.

Subsequently, an insulating layer 1125 is deposited on the surface portion as shown in FIG. 46. As shown in FIG. 47, the insulating layer 1125 is etched to form openings 1150r, 1150g, 1150b and 1150k which extend to the crosswise wirings 1124r, 1124g and 1124b and the electrically-conductive layer 1124k, respectively. Subsequently, as shown in FIG. 48, the openings 1150r, 1150g, 1150b and 1150k (see FIG. 47) are each filled with a transparent electrically-conductive material to form a part of the longitudinal wirings 1114r, 1114g and 1114b and the longitudinal wiring 1143-1 described in FIG. 44. Subsequently, as shown in FIG. 49, a transparent electrically-conductive layer 1151 is formed in the surface portion.

Figure 50A:
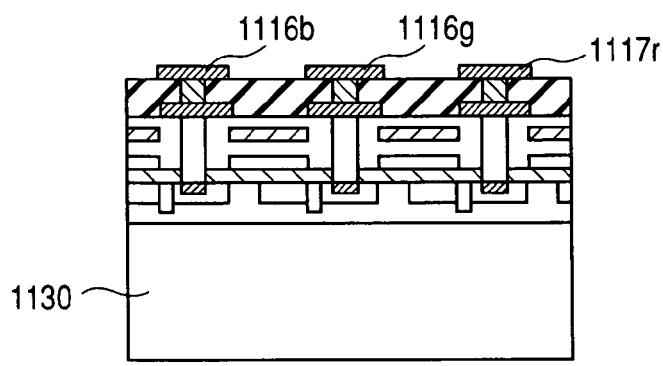
FIG. 50(a) is a diagrammatic sectional view of the photoelectric conversion layer-stacked solid imaging device in the same position as in FIG. 42
Figure 50B:
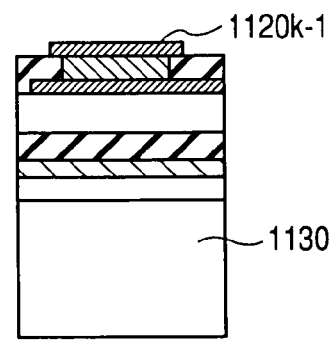
FIG. 50(b) is a diagrammatic sectional view of the photoelectric conversion layer-stacked solid imaging device in the same position as in FIG. 44.
Figure 51A:
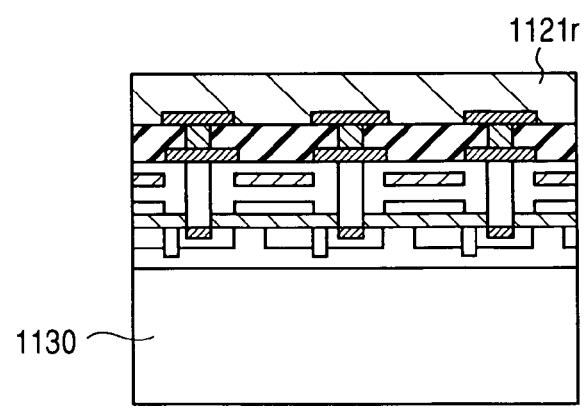
FIG. 51(a) is a diagrammatic sectional view of the photoelectric conversion layer-stacked solid imaging device in the same position as in FIG. 42
Figure 51B:
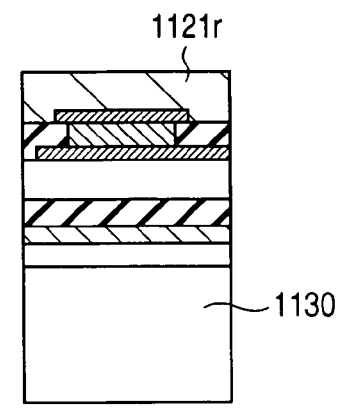
FIG. 51(b) is a diagrammatic sectional view of the photoelectric conversion layer-stacked solid imaging device in the same position as in FIG. 44.
Figure 52A:
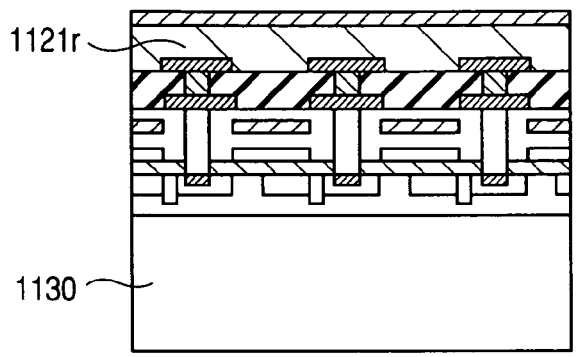
FIG. 52(a) is a diagrammatic sectional view of the photoelectric conversion layer-stacked solid imaging device in the same position as in FIG. 42
Figure 52B:
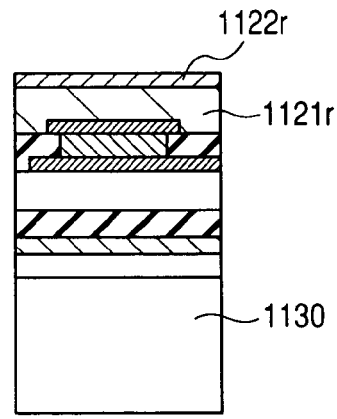
FIG. 52(b) is a diagrammatic sectional view of the photoelectric conversion layer-stacked solid imaging device in the same position as in FIG. 44.

Subsequently, the electrically-conductive layer 1151 is patterned to form a first electrode layer 1120r (see FIG. 43). At the same time, 1117r and the electrically-conductive layers 1116b, 1116g and 1120k-1 as described in FIG. 42 are formed as shown in FIG. 50. Thereafter, as shown in FIG. 51, a photoelectric conversion layer 1121r for detecting red color is deposited on the surface portion. Further, as shown in FIG. 52, a second electrode layer 112r is deposited on the photoelectric conversion layer 1121r.

Figure 53A:
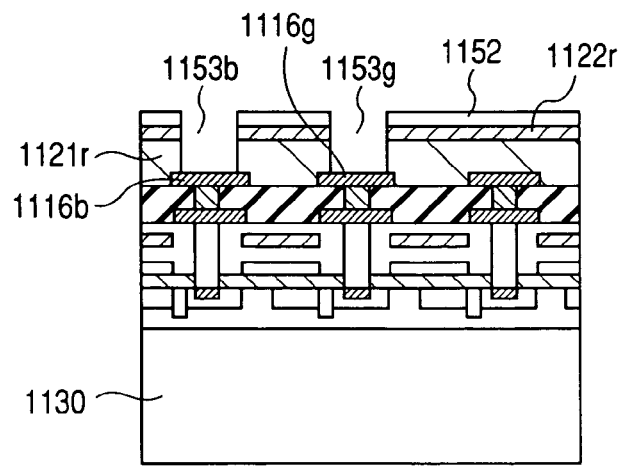
FIG. 53(a) is a diagrammatic sectional view of the photoelectric conversion layer-stacked solid imaging device in the same position as in FIG. 42
Figure 53B:
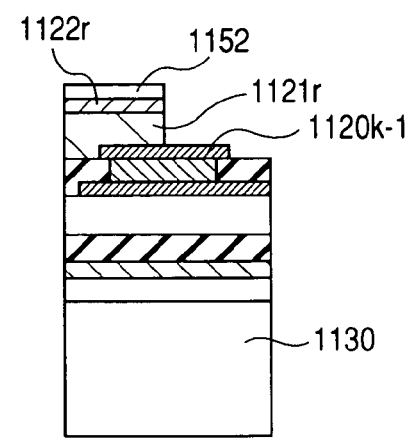
FIG. 53(b) is a diagrammatic sectional view of the photoelectric conversion layer-stacked solid imaging device in the same position as in FIG. 44.

Subsequently, a resist layer 1152 is formed on the surface of the layers as shown in FIG. 53. The resist layer 1152 is then etched to form openings 1153b and 1153g in positions corresponding to the electrically-conductive layers 1116r and 1116g, respectively. Further, the end of the photoelectric conversion layer 1121r and the second electrode layer 1122r on the electrically-conductive layer 1120k-1 are cut as shown in FIG. 53(b).

Thus, in accordance with the basic configuration of the present embodiment, the step of deposition of the photoelectric conversion layer 1121r is continuously followed by the deposition of the second electrode layer 1122r. The second electrode layer 1122r and the photoelectric conversion layer 1121r are together etched to form the openings 1153g and 1153b. Accordingly, the interface of the photoelectric conversion layer 1121r with the second electrode layer 1122r cannot be roughened. Further, the number of etching for forming an opening in which a longitudinal wiring is formed can be reduced. Moreover, since the electrically-conductive layers 1116g and 1116b have been provided at the bottom of the openings, etching can be stopped at the electrically-conductive layers 1116g and 1116b with a high precision.

Figure 54A:
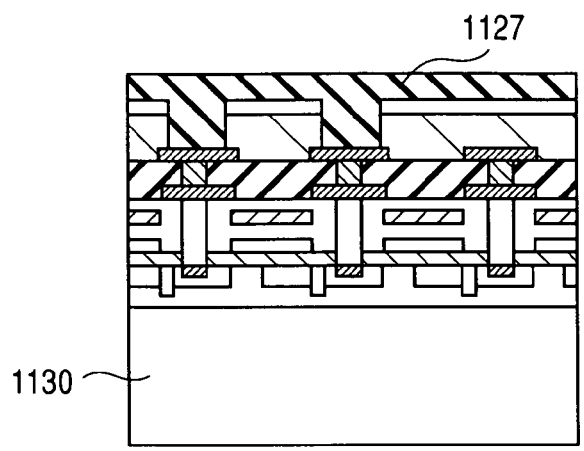
FIG. 54(a) is a diagrammatic sectional view of the photoelectric conversion layer-stacked solid imaging device in the same position as in FIG. 42
Figure 54B:
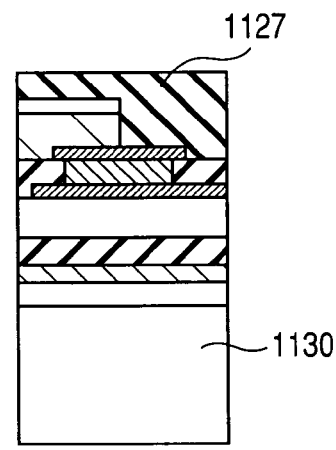
FIG. 54(b) is a diagrammatic sectional view of the photoelectric conversion layer-stacked solid imaging device in the same position as in FIG. 44.
Figure 55A:
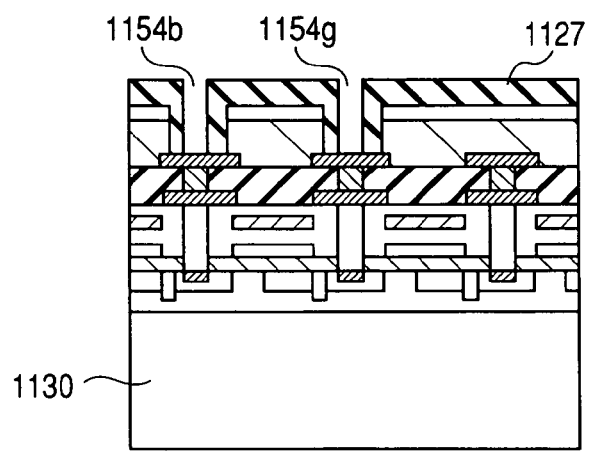
FIG. 55(a) is a diagrammatic sectional view of the photoelectric conversion layer-stacked solid imaging device in the same position as in FIG. 42
Figure 55B:
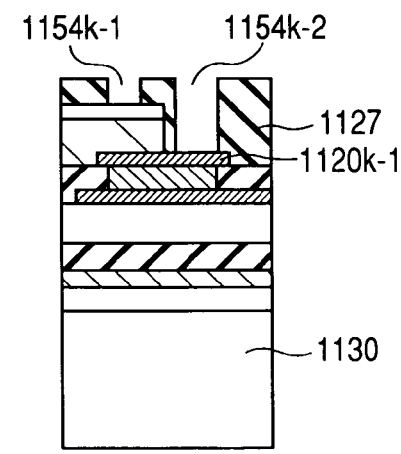
FIG. 55(b) is a diagrammatic sectional view of the photoelectric conversion layer-stacked solid imaging device in the same position as in FIG. 44.

After the formation of the openings 1153b and 1153g, an insulating layer 127 is deposited on the surface portion to fill the openings 1153b and 1153g as shown in FIG. 54. At the same time, an insulating layer 1127 is deposited on the cut portion shown in FIG. 54(b). Subsequently, as shown in FIG. 55, the insulating layer 1127 is etched to form openings 1154g and 1154b having a smaller diameter than that of the openings 1153b and 1153g. At the same time, an opening 1154k-1 which extends to the second electrode layer 1122r and an opening 1154-2 which extends to the electrically-conductive layer 1120k-1 are formed at the end portion (FIG. 55(b)).

Subsequently, as shown in FIG. 55(b), a barrier metal is allowed to selectively grow on the second electrode layer 1122r and the electrically-conductive layer 1120k-1 which are exposed in the openings 1154k-1 and 1154k-2.

Figure 56A:
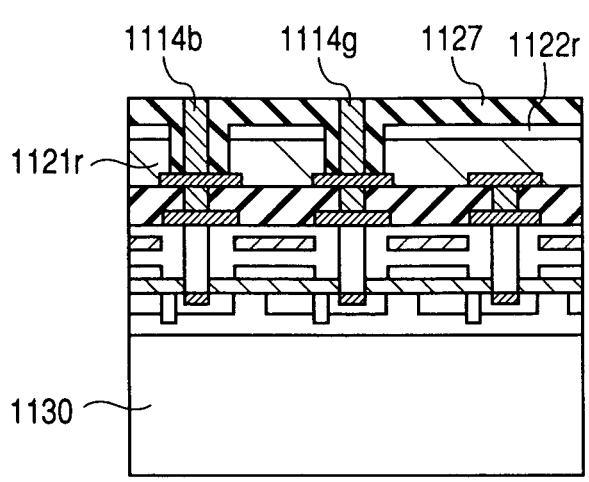
FIG. 56(a) is a diagrammatic sectional view of the photoelectric conversion layer-stacked solid imaging device in the same position as in FIG. 42
Figure 56B:
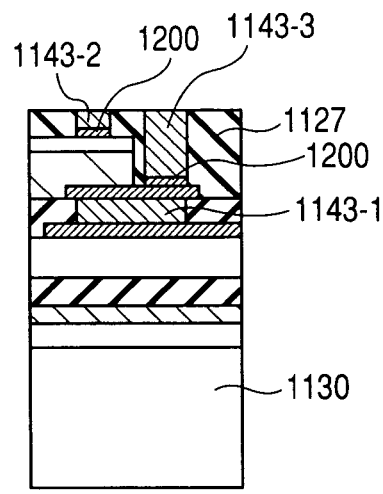
FIG. 56(b) is a diagrammatic sectional view of the photoelectric conversion layer-stacked solid imaging device in the same position as in FIG. 44.

Subsequently, the openings 1154g, 1154b, 1154k-1 and 1154k-2 are each filled with a transparent electrically-conductive material to form longitudinal wirings 1114g, 1114b, 1143-2 and 1143-3 as shown in FIG. 56. After the filling of the openings with a transparent electrically-conductive material, the surface of the layer is then smoothened. This is carried out by etching or CMP (chemical mechanical polishing).

Thus, in accordance with the basic configuration of the present embodiment, the longitudinal wirings 1114g and 1114b extending through the three layers, i.e., insulating layer 1127, second electrode layer 1122r and photoelectric conversion layer 1121r are produced at the same step, making it possible to reduce the number of steps of producing longitudinal wirings.

Figure 57A:
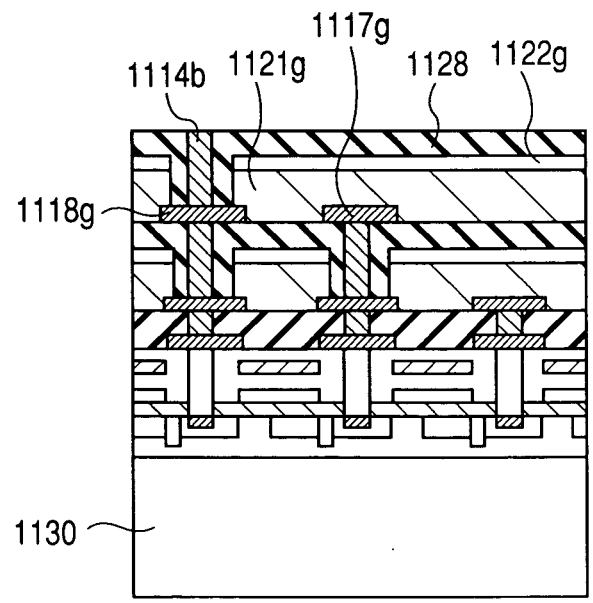
FIG. 57(a) is a diagrammatic sectional view of the photoelectric conversion layer-stacked solid imaging device in the same position as in FIG. 42
Figure 57B:
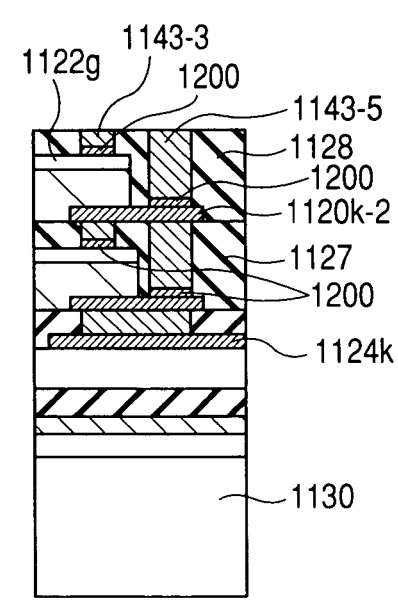
FIG. 57(b) is a diagrammatic sectional view of the photoelectric conversion layer-stacked solid imaging device in the same position as in FIG. 44.

Further, as shown in FIG. 57 the same procedure as in FIGS. 49 to 56 is repeated to form the longitudinal wiring 1114b extending through the photoelectric conversion layer 1121g for detecting green color and the second electrode layer 1122g and the longitudinal wirings 1143-3 and 1143-5 at the end portion.

Figure 58A:
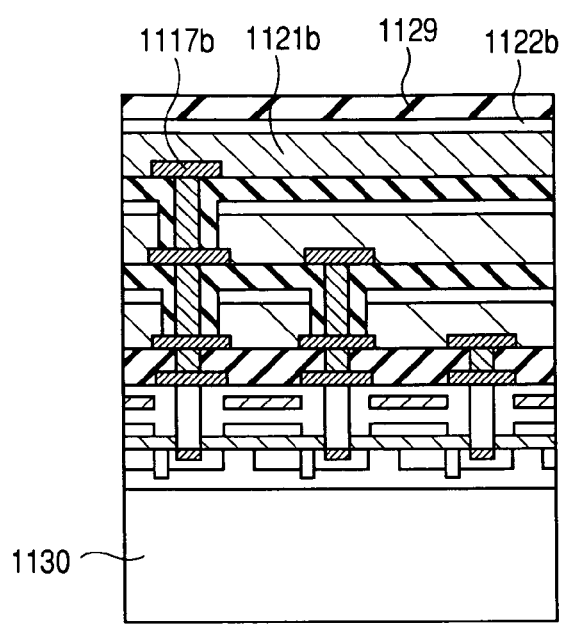
FIG. 58(a) is a diagrammatic sectional view of the photoelectric conversion layer-stacked solid imaging device in the same position as in FIG. 42
Figure 58B:
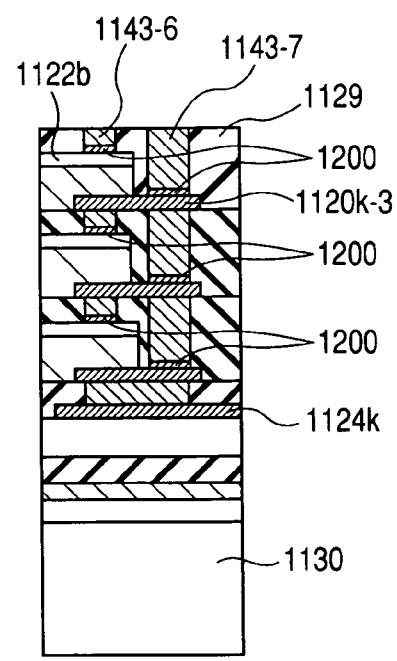
FIG. 58(b) is a diagrammatic sectional view of the photoelectric conversion layer-stacked solid imaging device in the same position as in FIG. 44.
Figure 59A:
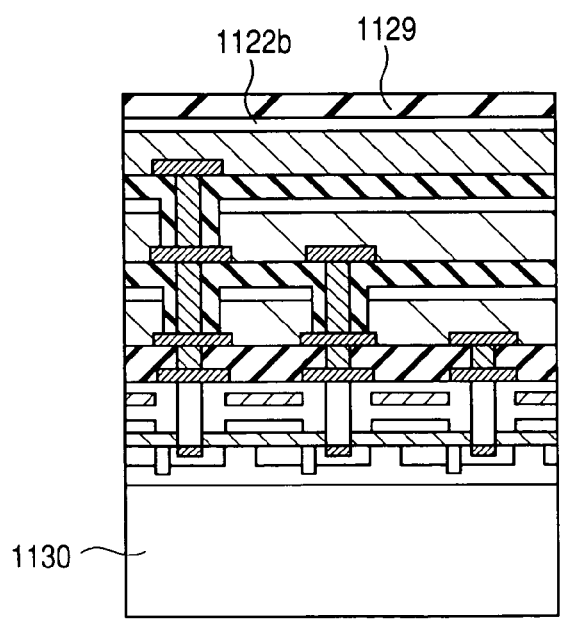
FIG. 59(a) is a diagrammatic sectional view of the photoelectric conversion layer-stacked solid imaging device in the same position as in FIG. 42
Figure 59B:
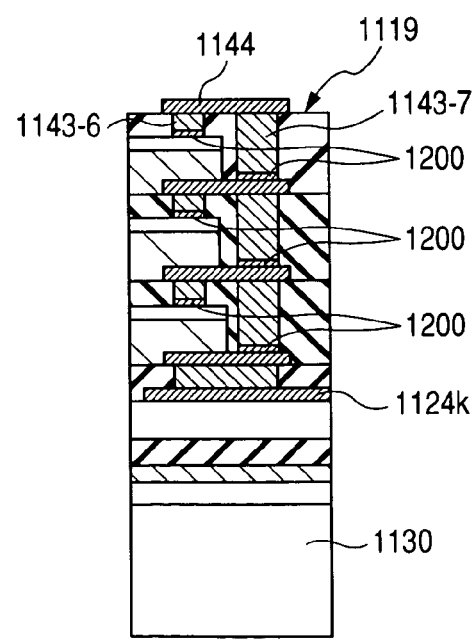
FIG. 59(b) is a diagrammatic sectional view of the photoelectric conversion layer-stacked solid imaging device in the same position as in FIG. 44.

Further, as shown in FIG. 58, a first electrode layer 1120b (see FIG. 43) and a pad 1117b are formed. On these layers are then formed a photoelectric conversion layer 1121b for detecting blue color, a second electrode layer 1122b and a transparent protective layer 1129. The transparent protective layer 1129 is etched in a predetermined position to form openings which are filled with an electrically-conductive material to form longitudinal wirings 1143-6 and 1143-7. Finally, as shown in FIG. 59, an electrically-conductive layer 1144 for connecting the longitudinal wiring 1143-6 and the longitudinal wiring 1143-7 to each other is formed.

As mentioned above, in accordance with the basic configuration of the present embodiment, the step of deposition of the photoelectric conversion layer is continuously followed by the deposition of the second electrode layer. The second electrode layer and the photoelectric conversion layer are together etched to form the openings. Accordingly, the interface of the photoelectric conversion layer with the second electrode layer cannot be roughened. Further, the number of etching for forming an opening in which a longitudinal wiring is formed can be reduced. In this manner, the photoelectric conversion properties can be enhanced and the production cost can be reduced.

The basic example of the three-layer structure has been described. However, the aforementioned basic configuration involves a step of forming a resist pattern on the photoelectric conversion layer with an electrically-conductive layer, causing the deterioration of photoelectric conversion layers. Examples of configuration according to the invention that can solve these problems will be described hereinafter.

The configuration and production method of a photoelectric conversion layer-stacked solid imaging device comprising a first insulating layer formed on a second electrode layer covering the side wall of a functional layer, a contact hole formed in the first electrode layer extending to the second electrode layer in which a wiring for connecting the second electrode layer is formed and a second insulating layer provided interposed between the second electrode layer and the first insulating layer, which is one of the characteristics of the invention, will be described hereinafter.

FIGS. 60 to 66 each are a diagram illustrating the change from the production steps shown in FIGS. 38 to 55 and a diagrammatic sectional view taken in the same position as in FIG. 42. FIGS. 60 to 66 each illustrate only the site positioned under the opening 1154b shown in FIG. 55(a).

Figure 60:
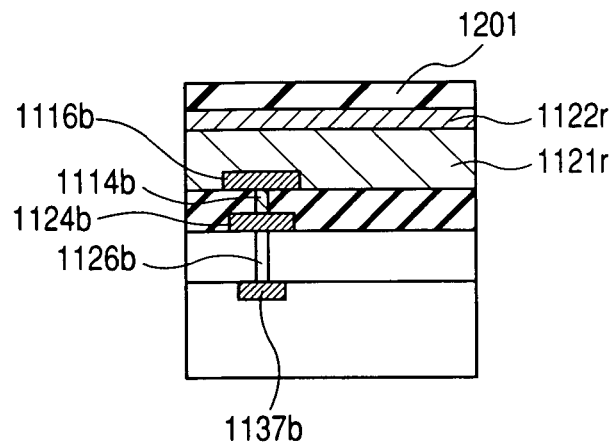
FIG. 60 is a diagram illustrating a modification of the production process comprising the procedures of from FIG. 38 to FIG. 55 which is a diagrammatic sectional view of the photoelectric conversion layer-stacked solid imaging device in the same position as in FIG. 42.
Figure 61:
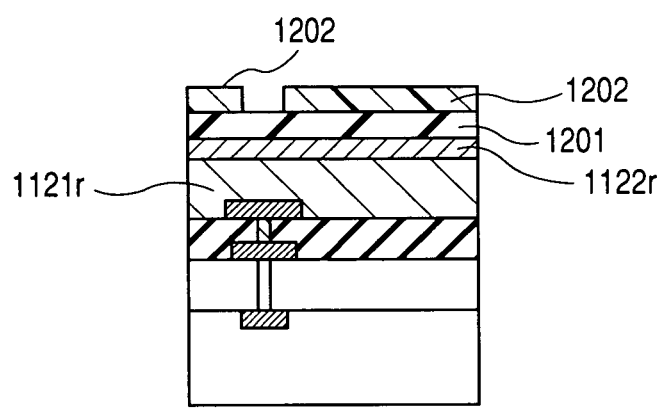
FIG. 61 is a diagram illustrating another modification of the production process comprising the procedures of from FIG. 38 to FIG. 55 which is a diagrammatic sectional view of the photoelectric conversion layer-stacked solid imaging device in the same position as in FIG. 42.
Figure 62:
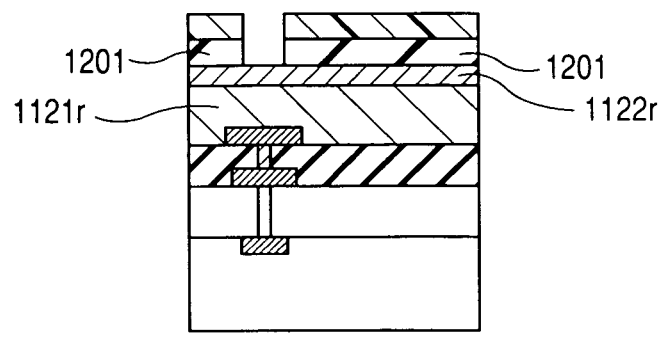
FIG. 62 is a diagram illustrating other modification of the production process comprising the procedures of from FIG. 38 to FIG. 55 which is a diagrammatic sectional view of the photoelectric conversion layer-stacked solid imaging device in the same position as in FIG. 42.
Figure 63:
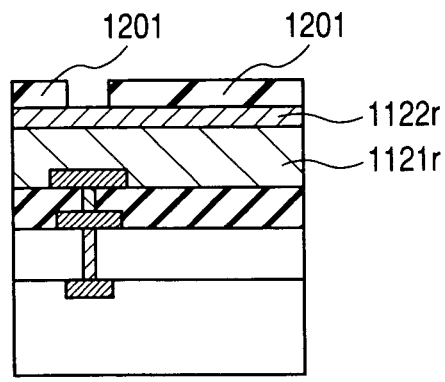
FIG. 63 is a diagram illustrating a further modification of the production process comprising the procedures of from FIG. 38 to FIG. 55 which is a diagrammatic sectional view of the photoelectric conversion layer-stacked solid imaging device in the same position as in FIG. 42.
Figure 64:
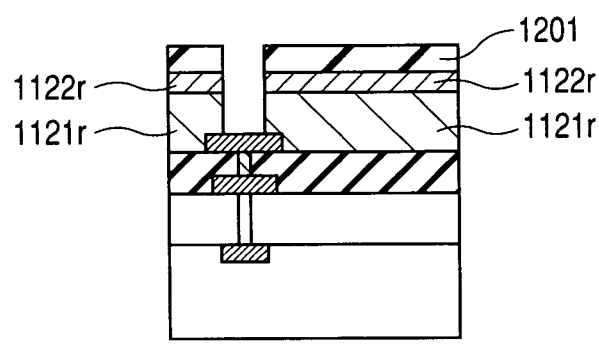
FIG. 64 is a diagram illustrating a further modification of the production process comprising the procedures of from FIG. 38 to FIG. 55 which is a diagrammatic sectional view of the photoelectric conversion layer-stacked solid imaging device in the same position as in FIG. 42.
Figure 65:
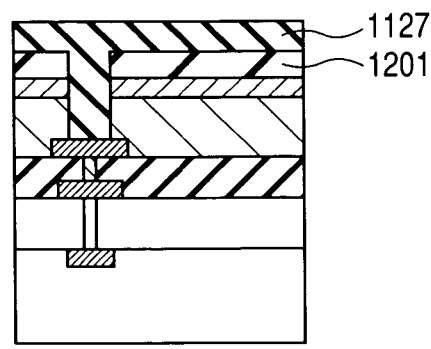
FIG. 65 is a diagram illustrating a further modification of the production process comprising the procedures of from FIG. 38 to FIG. 55 which is a diagrammatic sectional view of the photoelectric conversion layer-stacked solid imaging device in the same position as in FIG. 42.
Figure 66:
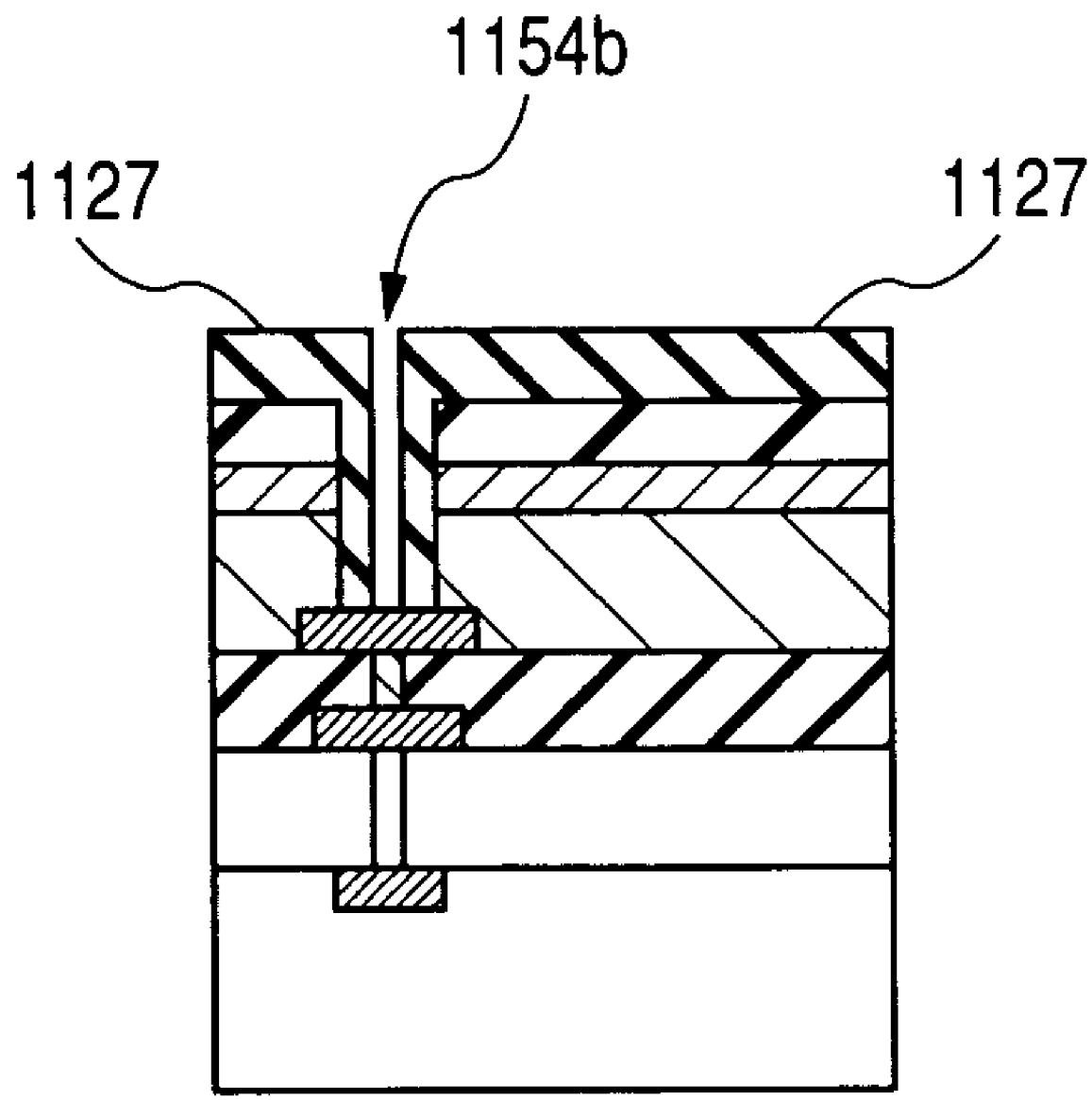
FIG. 66 is a diagram illustrating a further modification of the production process comprising the procedures of from FIG. 38 to FIG. 55 which is a diagrammatic sectional view of the photoelectric conversion layer-stacked solid imaging device in the same position as in FIG. 42.

In accordance with the photoelectric conversion layer-stacked solid imaging device according to the invention, the formation of a second electrode layer 1122r is followed by the formation of an insulating layer (second electrode layer) 1201 as shown in FIG. 60. Subsequently, as shown in FIG. 61, a resist pattern 1202 is formed on the insulating layer 1201. Only the insulating layer 1201 is etched as shown in FIG. 62 using the resist pattern 1202. Subsequently, as shown in FIG. 63, the resist pattern 1202 is removed. When the second electrode layer 1122r has protecting properties, the resist pattern can be removed with a release agent by a wet process. Of course, when the resist treatment is effected in such a manner that the photoelectric conversion layer cannot be damaged, the second electrode layer 1122r and the photoelectric conversion layer 1121r can be etched under the conditions of FIG. 62. Subsequently, the second electrode layer 1122r and the photoelectric conversion layer 1121r are etched with the insulating layer 1201 as a mask as shown in FIG. 64. Subsequently, as shown in FIG. 65, an insulating layer (first insulating layer) 1127 is formed and smoothened. Thereafter, a via hole 1154b is formed as shown in FIG. 66.

In the case where the photoelectric conversion layer can be easily damaged, it is made difficult to certainly protect the photoelectric conversion layer during the formation of resist in FIG. 53 because only a second electrode layer is provided as an underlying layer. Since the formation of resist involves spreading of solvent, treatment with alkaline developer, rinsing, etc., the device is quickly deteriorated if it can be easily damaged by these treatments. This phenomenon is remarkable particularly when the photoelectric conversion layer contains an organic material. However, as can be seen in FIG. 61, the entire surface of the photoelectric conversion layer can be protected by the insulating layer during resist formation, making it possible to prevent the deterioration of the photoelectric conversion layer and hence making it assured that the deterioration of the device properties can be prevented.

In addition, important characteristics of the present embodiment will be described hereinafter. As shown in FIG. 62, a resist is formed on an insulating layer. In the process for producing layers up to the second insulating layer in FIG. 65, a continuous vacuum process may be effected using a dry etching process and a vacuum layer-making technique. Even when the device comprising an organic material sensitive to oxygen or water is exposed to the atmosphere in FIG. 66 and after, the organic material cannot be deteriorated because it is protected by the second insulating layer. In other words, the two-insulating layer structure is a specific structure that is deeply considered to prevent the deterioration of the organic material in the process for the formation of functional layer.

Fourth Embodiment

A fourth embodiment of the functional device according to the invention will be described hereinafter.

While the charge storage portions formed on the silicon substrate of the photoelectric conversion layer-stacked solid imaging device described in the third embodiment are aligned in the form of square lattice, the invention is not limited thereto. Various alignments may be made. For example, a so-called honeycomb alignment may be made. In some detail, among a row of charge storage portions composed of vertically aligned charge storage portions, odd-numbered rows and even-numbered rows are deviated from each other by substantially half the vertical alignment pitch. For the details of honeycomb alignment, reference can be made to JP-A-10-136391.

Figure 67:
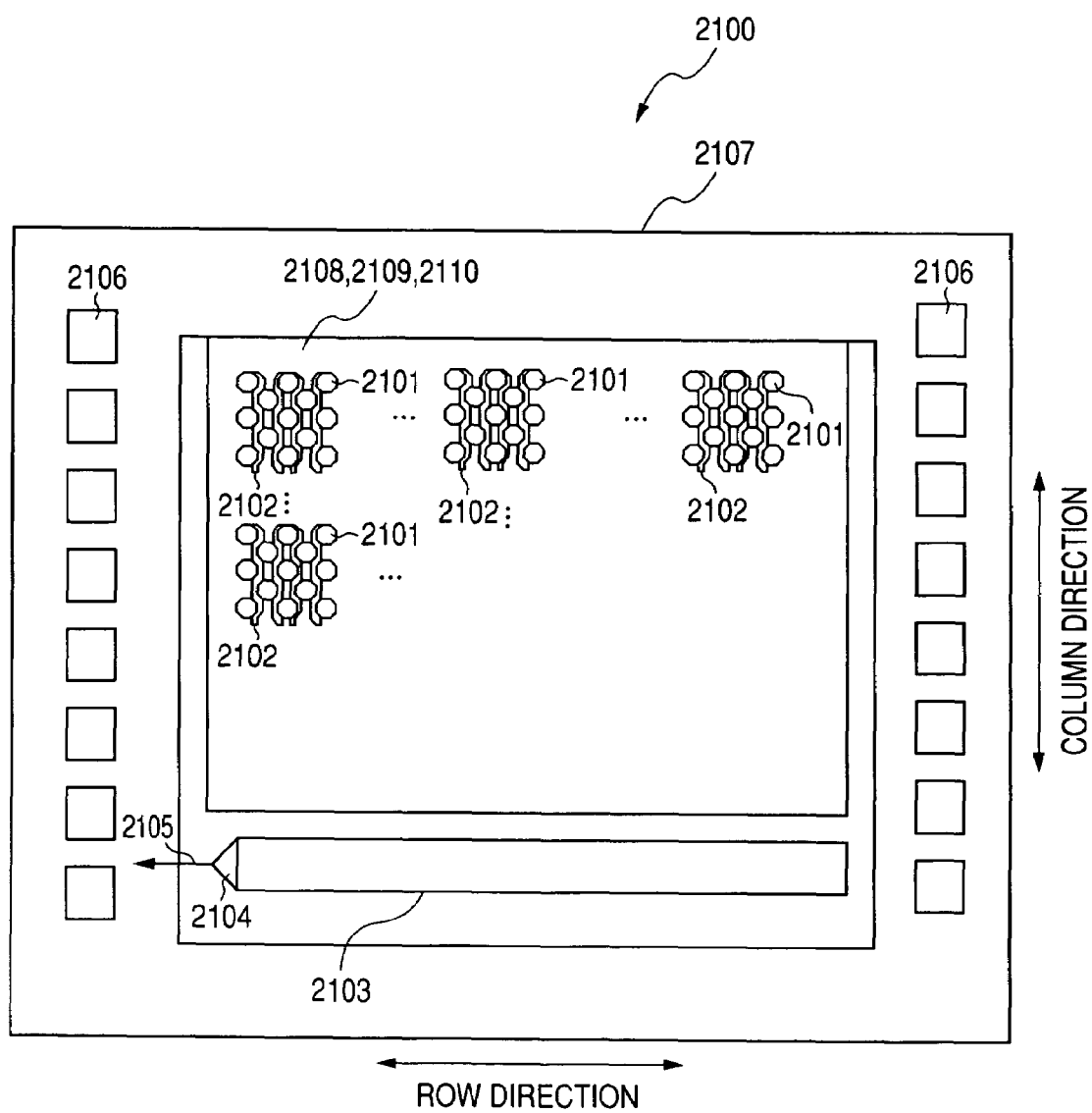
FIG. 67 is a diagrammatic plan view of a photoelectric conversion layer-stacked solid imaging device for illustrating a fourth embodiment of the invention.

FIG. 67 is a diagrammatic plan view of a photoelectric conversion layer-stacked solid imaging device for illustrating the fourth embodiment of the invention.

A photoelectric conversion layer-stacked solid imaging device 2100 comprises a number of charge storage portions 2101 aligned on the surface of a silicon substrate 2107 in a honeycomb form as disclosed in JP-A-10-136391. On the surface of the silicon substrate 2107 are formed vertical transfer channels (row CCD register) 2102 corresponding to the row alignment of charge storage portions 2101. At the lower side of the silicon substrate 2107 is formed a horizontal transfer channel (line CCD register) 2103. At the outlet of the horizontal transfer channel 2103 is formed an amplifier 2104 by which a signal charge is amplified and then outputted as an output signal 2105. At the both ends of the silicon substrate 2107 are bonding PAD's 2106 for supplying electric power. The bonding PAD's 2106 are connected to a first electrode layer 2109 which is divided every pixel and a second electrode layer 2110 which is not divided every pixel, which electrode layers having three photoelectric conversion layers 2108 deposited on the silicon substrate 2107 interposed therebetween, via a wiring.

Figure 68:
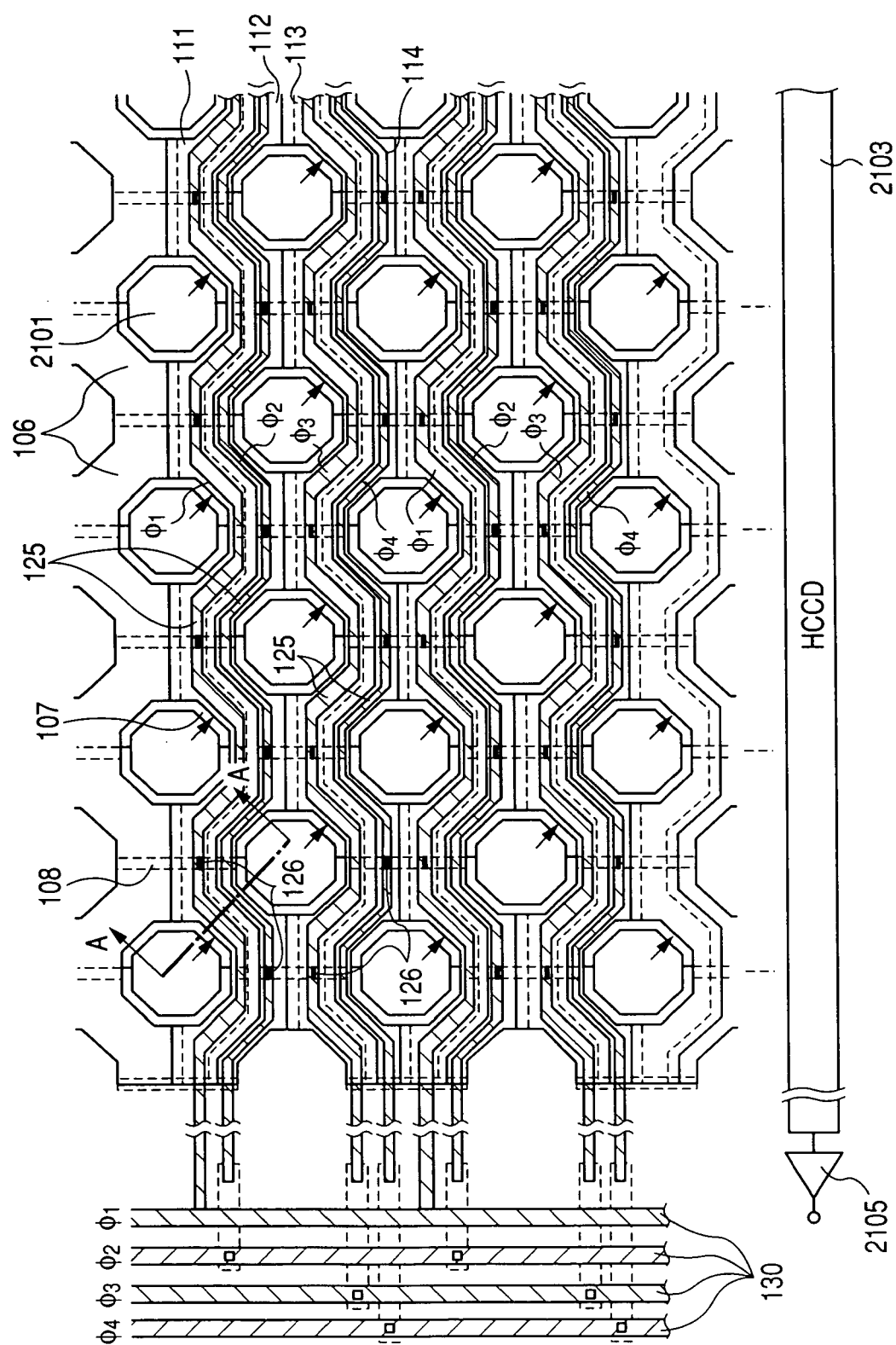
FIG. 68 is a partial enlarged view of the solid imaging device shown in FIG. 67.

FIG. 68 is an enlarged view of a part of the solid imaging device shown in FIG. 67. As previously mentioned, the solid imaging device shown in FIG. 68 comprises charge storage portions 2101 and vertical transfer channels 2102 composed of neighboring vertical transfer channels 106 and transfer electrodes 111 to 114 aligned in a two-dimensional plane. Transfer electrodes 111 to 114 for supplying four-phase transfer pulses φ1 to φ4 are provided for one charge storage portion 2101. The transfer electrodes 111 to 114 extend in the line direction and are formed zigzag to bypass the charge storage portion 2101.

The signal charge which has been generated in the photoelectric conversion layer and stored in the charge storage portion 2101 is read by a reading gate 107 provided at the lower right as viewed in the drawing, and then passed to the vertical transfer channel 106. In FIG. 68, the vertical transfer channels 106 adjacent to the charge storage portions 2101 are vertically connected to each other extending while meandering in the row direction through the gap between the charge storage portions 2101 aligned in honeycomb form to form vertical transfer channels 2101 with the transfer electrodes 111 to 114. The end of the various vertical transfer channels 2102 are connected to light-shielded horizontal transfer channel 2103. To the terminal of the horizontal transfer channel 2103 is connected an amplifier 2104 having a floating diffusion amplifier (FDA), etc. from which a signal corresponding to the signal charge is outputted.

Figure 69A:
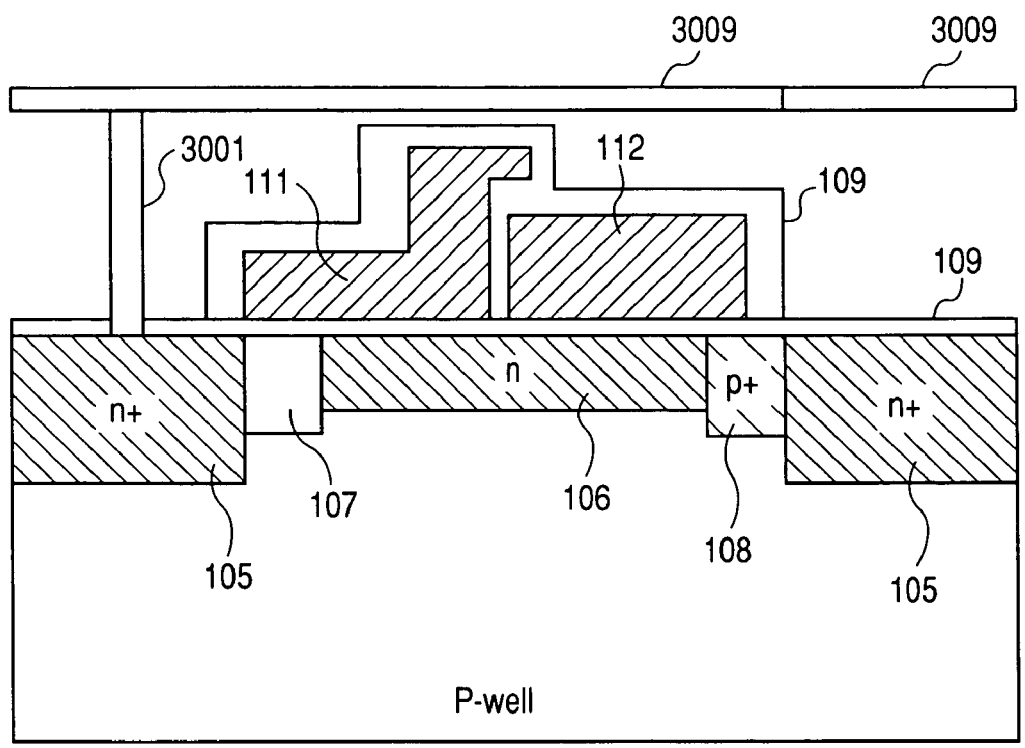
FIG. 69A is a sectional view taken on line A-A of FIG. 68.
Figure 69B:
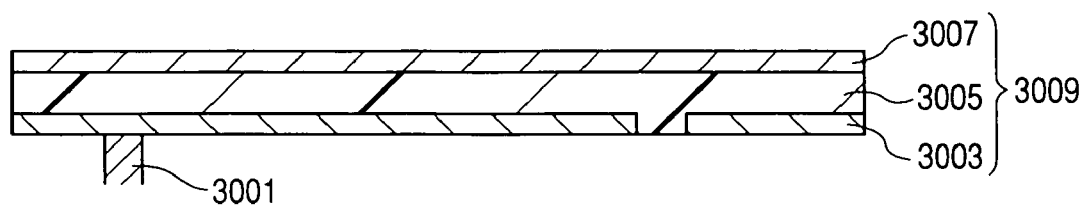
FIG. 69B is an enlarged sectional view of the photoelectric conversion portion.

FIG. 69 depicts a sectional view (a) taken on line A-A of FIG. 68 and an enlarged sectional view (b) of the photoelectric conversion portion of FIG. 68.

The charge storage portion 2101 comprises an n$^+$ region 105 which is an N-type high concentration impurity layer as shown in FIG. 69. On the n$^+$ region 105 is provided a plug 3001 on which a photoelectric conversion portion 3009 having a first electrode layer 3003, a photoelectric conversion layer 3005, a second electrode layer 3007, etc. deposited on each other is provided. On the vertical transfer channel 106 is formed transfer electrodes 111, 112, 113 and 114 (see FIG. 68) that form a two-layer polysilicon electrode. The two-layer polysilicon electrode is prepared by forming the transfer electrodes 111, 113, and then forming the transfer electrodes 112, 114 in such an arrangement that they are imposed on each other at the end thereof with the insulating layer 109 interposed therebetween. Through these transfer electrodes 111, 112, 113 and 114, four-phase transfer pulses φ1, φ2, φ3 and φ4 can be applied to drive the vertical transfer channel 2102, making it possible to read all the pixels.

At one side of the periphery of the N-type high concentration impurity layer 105 is provided a reading gate 107 for reading the charge stored by photoelectric conversion to the vertical transfer channel 106. At the other side of the periphery of the N-type high concentration impurity layer 105 is provided an element separation region (channel stop) 108 made of P-type high concentration impurity for blocking the flow of charge to vertically adjacent pixel row vertical transfer channels.

In accordance with the solid imaging device having such an arrangement, all the pixels can be read out even if the transfer electrode for driving row CCD register has a two-layer polysilicon structure, making it possible to simplify the production process. Further, four electrodes can be disposed per one charge storage portion. In this case, when four-phase transfer pulses are used for driving, the amount of charge that can be treated can be raised about 1.5 times that of three-phase driving. In accordance with the honeycomb CCD configuration, the area of the charge storage portion can be relatively raised from that of the related art square lattice CCD. Further, the horizontal and vertical resolution can be raised. Accordingly, even if further fine division is made (higher density, more pixels), a high sensitivity solid imaging device can be obtained.

In accordance with the present embodiment, in order to lower the electric resistance of the polysilicon electrode used as transfer electrodes 111 to 114, a so-called metal-backed structure comprising an electrode material having a lower specific resistivity than polysilicon, e.g., Al (aluminum) or W (tungsten) deposited as a metal wiring 125 on a polysilicon electrode with an insulating layer interposed therebetween is formed. The metal wiring 125 is electrically connected to the respective transfer electrodes 111 to 114 via the contact hole 126. Unlike the related art square lattice alignment, the honeycomb alignment according to the present embodiment can comprise the metal wiring 125 provided corresponding to the transfer electrodes 111 to 114 in all the phases (layers) along the longitudinal direction of the two-layer polysilicon electrode, i.e., while extending zigzag in the crosswise direction (horizontal direction) as viewed on FIG. 68.

The metal wiring 125 extends in the crosswise direction as viewed on FIG. 68 and is electrically connected at the terminal thereof to a wiring pattern 130 for transmitting driving transfer pulses φ1 to φ4 supplied from the exterior of the device. In the example shown in FIG. 55, the metal wiring 125 and the wiring pattern 130 are formed by aluminum. At the section of crossing of the metal wiring 125 with the wiring pattern 130 of other phase, the wiring pattern 130 is formed on the polysilicon electrode with an insulating layer interposed therebetween to make wiring such that the metal wiring 125 and wiring pattern 130 and the polysilicon electrode are electrically connected to each other in the contact hole.

Examples of the electrode material employable herein include Al, W, Cu (copper), Ti (titanium), Co (cobalt), Ni (nickel), Pd (palladium), Pt (platinum), and nitride (e.g., WSi (tungsten silicon), silicide (e.g., TiSi (titanium silicon)), alloy, compound and composite thereof. Aluminum can be easily worked and handled and has a low electrical resistance and thus is often used as backing metal wiring. Unlike aluminum, tungsten forms no alloy with polysilicon and thus causes no potential shift (partial change of potential) due to alloying, allowing efficient charge transfer in the vertical transfer channels. Further, tungsten is used in the light-shielding layer for solid imaging device and thus may be used in combination with the light-shielding layer portion.

While the various embodiments have been described with reference to the case where the pixel alignment is made such that one piece of the functional layer is one pixel and the first electrode layer is divided every pixel, the invention is not limited to this configuration. The second electrode layer may be divided every pixel. Alternatively, both the two electrode layers may be divided every pixel. In the invention in particular, the effect can be exerted drastically when the second electrode layer is divided every pixel.

What is claimed is:

1. A functional device comprising on a substrate a first electrode layer, a second electrode layer opposed to the first electrode layer, a functional layer disposed between the first electrode layer and the second electrode layer and a wiring for applying a potential to the first electrode layer or the second electrode layer, wherein the functional device further comprises a first insulating layer formed on the second electrode layer in such an arrangement that the side wall of the functional layer is covered, and a contact hole formed in the first insulating layer and extending to the second electrode layer in which the wiring for connecting the second electrode layer is provided.

2. The functional device according to claim 1, wherein a second insulating layer is provided to he interposed between the second electrode layer and the first insulating layer.

3. The functional device according to claim 2, wherein the contact hole is formed extending through the first insulating layer and the second insulating layer.

4. The functional device according to claim 1, wherein a plurality of stages of layer structure comprising the first electrode layer, the functional layer and the second electrode layer are provided on the substrate.

5. The functional device according to claim 1, wherein the water permeability of the insulating layer covering the functional layer is $10g/m^2 \cdot day$ or less.

6. The functional device according to claim 1, wherein the functional layer contains an organic material.

7. The functional device according to claim 6, wherein the functional layer contains at least a hole-transporting organic material and an electron-transporting organic material and comprises the first electrode, the hole-transporting organic material, the electron-transporting organic material and the second electrode deposited in this order from the substrate side.

8. The functional device according to claim 1, wherein the length of the smallest side of the wiring extending from the contact hole is 1 mm or less.

9. The functional device according to claim 1, wherein the second electrode contains at least one material selected from ITO, IZO, $SnO_2$, ATO, ZnO, $TiO_2$ and FTO.

10. The functional device according to claim 1, wherein the wiring contains at least one material selected from Al, Pt, W, Au, Ag, Ta, Cu, Cr, Mo, Ti, Ni, Pd and Zn.

11. The functional device according to claim 1, which is a photoelectric conversion layer-stacked solid imaging device.

12. The functional device according to claim 1, which is an organic luminescent device.

13. The functional device according to claim 11, wherein there is provided an alignment of pixels each of which is one piece of the functional layer and the contact hole from which the wiring extends is formed in each of the pixels.

14. The functional device according to claim 11, wherein the contact hole is present in each of the pixels and has a size of 5 μm or less.

15. The functional device according to claim 1, wherein a length of a smallest side of the wiring extending from the contact hole is 1 mm or less thereby preventing deterioration of the functional device.

16. A method for producing a functional device comprising on a substrate a first electrode layer, a second electrode layer opposed to the first electrode layer, a functional layer disposed between the first electrode layer and the second electrode layer and a wiring for applying a potential to the first electrode layer or the second electrode layer, wherein a step of patterning the second electrode layer comprises a step of forming a resist pattern by photolithography with the second electrode layer covered by the first insulating layer and a step of patterning the first insulating layer with the resist pattern as a mask and then patterning the second electrode layer with the first insulating layer as a mask.

17. The method for preparing a functional device according to claim 16, comprising a step of forming a second insulating layer with the surface of the second electrode layer and the side wall of the functional layer covered after the second electrode layer patterning step, a step of forming a resist pattern by photolithography, a step of forming a contact hole extending through the second insulating layer and the first insulating layer with the resist pattern as a mask and a step of forming the wiring in contact with the second electrode layer exposed in the contact hole.

18. The method for preparing a functional device according to claim 16, wherein the electrode layer patterning step comprises a step of dry etching the electrode layer with the substrate kept at 150° C. or less.

19. The method for preparing a functional device according to claim 18, wherein the second electrode layer has a transmission of 60% or more at a wavelength of from 400 nm to 700 nm.

20. The method for preparing a functional device according to claim 18, wherein the dry etching step is preceded by a step of treatment using a reducing plasma.

21. The method for preparing a functional device according to claim 20, wherein the dry etching step comprises a step of treatment using argon plasma.

* * * * *